(12) United States Patent
Hersam et al.

(10) Patent No.: US 12,183,811 B2
(45) Date of Patent: Dec. 31, 2024

(54) DUAL-GATED MEMTRANSISTOR CROSSBAR ARRAY, FABRICATING METHODS AND APPLICATIONS OF SAME

(71) Applicant: NORTHWESTERN UNIVERSITY, Evanston, IL (US)

(72) Inventors: Mark C. Hersam, Wilmette, IL (US); Vinod K. Sangwan, Evanston, IL (US); Hong-Sub Lee, Seongnam-si (KR)

(73) Assignee: NORTHWESTERN UNIVERSITY, Evanston, IL (US)

( * ) Notice: Subject to any disclaimer, the term of this patent is extended or adjusted under 35 U.S.C. 154(b) by 170 days.

(21) Appl. No.: 17/036,428

(22) Filed: Sep. 29, 2020

(65) Prior Publication Data

US 2021/0098611 A1  Apr. 1, 2021

Related U.S. Application Data

(60) Provisional application No. 62/908,841, filed on Oct. 1, 2019.

(51) Int. Cl.
*H01L 29/68* (2006.01)
*G06N 3/04* (2023.01)
(Continued)

(52) U.S. Cl.
CPC ............ *H01L 29/685* (2013.01); *G06N 3/04* (2013.01); *G06N 3/08* (2013.01); *H01L 27/1225* (2013.01);
(Continued)

(58) Field of Classification Search
CPC . H01L 29/685; H01L 29/24; H01L 29/66969; H01L 29/7394; H01L 29/0665;
(Continued)

(56) References Cited

U.S. PATENT DOCUMENTS 9,608,101 B2 * 3/2017 Kis ..................... H01L 29/6684
10,396,126 B1 * 8/2019 Kim .................... H01L 45/1683
(Continued)

FOREIGN PATENT DOCUMENTS

WO WO-2018076268 A1 * 5/2018 ............ H01L 29/78
WO WO-2018231153 A1 * 12/2018 ......... C23C 14/0623

OTHER PUBLICATIONS

Qin, Structure for field effect transistor and preparation method thereof, 2018, machine translation of WO2018076268, pp. 1-6. (Year: 2018).*
(Continued)

*Primary Examiner* — Natalia A Gondarenko
(74) *Attorney, Agent, or Firm* — Locke Lord LLP; Tim Tingkang Xia, Esq.

(57) ABSTRACT

A memtransistor includes a top gate electrode and a bottom gate electrode; a polycrystalline monolayer film formed of an atomically thin material disposed between the top gate electrode and the bottom gate electrode; and source and drain electrodes spatial-apart formed on the polycrystalline monolayer film to define a channel in the polycrystalline monolayer film between the source and drain electrodes. The top gate electrode and the bottom gate electrode are capacitively coupled with the channel.

37 Claims, 28 Drawing Sheets
(25 of 28 Drawing Sheet(s) Filed in Color)

(51) Int. Cl.
| | |
|---|---|
| *G06N 3/08* | (2023.01) |
| *G11C 13/00* | (2006.01) |
| *H01L 27/12* | (2006.01) |
| *H01L 29/06* | (2006.01) |
| *H01L 29/10* | (2006.01) |
| *H01L 29/24* | (2006.01) |
| *H01L 29/49* | (2006.01) |
| *H01L 29/66* | (2006.01) |
| *H01L 29/739* | (2006.01) |
| *H10B 99/00* | (2023.01) |

(52) U.S. Cl.
CPC ............ *H01L 27/127* (2013.01); *H01L 29/24* (2013.01); *H01L 29/66969* (2013.01); *H01L 29/7394* (2013.01); *H10B 99/22* (2023.02); *G11C 13/004* (2013.01); *G11C 13/0069* (2013.01); *H01L 29/0665* (2013.01); *H01L 29/1033* (2013.01); *H01L 29/4908* (2013.01)

(58) Field of Classification Search
CPC ........... H01L 29/1033; H01L 29/42324; H01L 29/42356; H01L 29/1606; H01L 29/66825; H01L 29/66484; H01L 29/4908; H01L 29/04; H01L 29/7831; H01L 29/7839; H01L 29/78681; H01L 29/78696; H01L 29/778; H01L 29/788; H01L 27/1225; H01L 27/127; H01L 27/1052; H01L 27/2436; H01L 27/2463; G06N 3/04; G06N 3/08; G06N 3/049; G06N 3/0635; B82Y 10/00; G11C 13/0002; G11C 13/003; G11C 13/0033; G11C 13/0007; G11C 13/004; G11C 13/0069; G11C 2213/53; G11C 2213/82; G11C 11/54; H10B 99/00; H10B 63/30
USPC .......................................... 257/66, 9, 29, 24
See application file for complete search history.

(56) References Cited

U.S. PATENT DOCUMENTS

| | | | | |
|---|---|---|---|---|
| 2010/0214012 | A1* | 8/2010 | Raza ...................... | H01L 29/775 977/734 |
| 2011/0101309 | A1* | 5/2011 | Lin ...................... | H01L 29/1606 257/29 |
| 2012/0161098 | A1* | 6/2012 | Hiura ...................... | H01L 29/165 977/734 |
| 2016/0141427 | A1* | 5/2016 | Chen .................. | H01L 29/78681 257/349 |
| 2016/0155839 | A1* | 6/2016 | Strachan ............... | H01L 29/778 257/29 |
| 2019/0131129 | A1* | 5/2019 | Stinaff ................ | H01L 21/0272 |
| 2019/0213234 | A1* | 7/2019 | Bayat .................. | G11C 16/0466 |
| 2019/0305046 | A1* | 10/2019 | Jha .......................... | G11C 11/54 |

OTHER PUBLICATIONS

K. M. Kim, B. J. Choi, Y. C. Shin, S. Choi, C. S. Hwang Appl. Phys. Lett. 2007, 91, 012907.
S. Ghatak, A. Ghosh Appl. Phys. Lett. 2013, 103, 122103.
J. Y. Shang, M. J. Moody, J. Chen, S. Krylyuk, A. V. Davydov, T. J. Marks, L. J. Lauhon ACS Applied Electronic Materials 2020, 2, 1273-1279.
A. Alharbi, D. Shahrjerdi IEEE Transactions on Electron Devices 2018, 65, 4084-4092.
G. He, H. Ramamoorthy, C. P. Kwan, Y. H. Lee, J. Nathawat, R. Somphonsane, M. Matsunaga, A. Higuchi, T. Yamanaka, N. Aoki, Y. Gong, X. Zhang, R. Vajtai, P. M. Ajayan, J. P. Bird Nano Lett. 2016, 16, 6445-6451.
L. Sun, Y. Zhang, G. Hwang, J. Jiang, D. Kim, Y. A. Eshete, R. Zhao, H. Yang Nano Lett. 2018, 18, 3229-3234.
M. Chistiakova, N. Bannon, J.-Y. Chen, M. Bazhenov, M. Volgushev Front. Comp. Neuro. 2015, 9, 89.
G. H. Kim, J. H. Lee, Y. Ahn, W. Jeon, S. J. Song, J. Y. Seok, J. H. Yoon, K. J. Yoon, T. J. Park, C. S. Hwang Adv. Funct. Mater. 2013, 23, 1440-1449.
M.-J. Lee, D. Lee, S.-H. Cho, J.-H. Hur, S.-M. Lee, D. H. Seo, D.-S. Kim, M.-S. Yang, S. Lee, E. Hwang, M. R. Uddin, H. Kim, U. I. Chung, Y. Park, I.-K. Yoo Nat. Commun. 2013, 4, 2629.
H.-S. Lee, H.-H. Park, M. J. Rozenberg Nanoscale 2015, 7, 6444-6450.
C. J. Amsinck, N. H. D. Spigna, D. P. Nackashi, P. D. Franzon Nanotechnology 2005, 16, 2251-2260.
C. Xu, D. Niu, N. Muralimanohar, R. Balasubramonian, T. Zhang, S. Yu, Y. Xie IEEE Inter. Symp. High Perform. Comp. Arch. (HPC2015, 476-488.
J. Mustafa, R. Waser IEEE Trans. Nanotech. 2006, 5, 687-691.
M. Zangeneh, A. Joshi IEEE Vlsi Systems 2014, 22, 1815-1828.
F. Miao, W. Yi, I. Goldfarb, J. J. Yang, M.-X. Zhang, M. D. Pickett, J. P. Strachan, G. Medeiros-Ribeiro, R. S. Williams ACS Nano 2012, 6, 2312-2318.
K. K. H. Smithe, S. V. Suryavanshi, M. Muñoz Rojo, A. D. Tedjarati, E. Pop ACS Nano 2017, 11, 8456-8463.
R. Yang, H. Li, K. K. H. Smithe, T. R. Kim, K. Okabe, E. Pop, J. A. Fan, H. P. Wong IEEE Inter. Elect. Dev. Meet. (IEDM) 2017, 19.5.1-19.5.4.
S. B. Desai, S. R. Madhvapathy, A. B. Sachid, J. P. Llinas, Q. Wang, G. H. Ahn, G. Pitner, M. J. Kim, J. Bokor, C. Hu, H.-S. P. Wong, A. Javey Science 2016, 354, 99-102.
M. E. Beck, A. Shylendra, V. K. Sangwan, S. Guo, W. A. Gaviria Rojas, H. Yoo, H. Bergeron, K. Su, A. R. Trivedi, M. C. Hersam Nat. Commun. 2020, 11, 1565.
I. Kataeva, F. Merrikh-Bayat, E. Zamanidoost, D. Strukov 2015 International Joint Conference on Neural Networks (IJCNN) 2015, 1-8.
S.-G. Yi, M. U. Park, S. H. Kim, C. J. Lee, J. Kwon, G.-H. Lee, K.-H. Yoo ACS Appl. Mater. Inter. 2018, 10, 31480-31487.
S. Choi, S. H. Tan, Z. Li, Y. Kim, C. Choi, P.-Y. Chen, H. Yeon, S. Yu, J. Kim Nat. Mater. 2018, 17, 335-340.
I. Boybat, M. Le Gallo, S. R. Nandakumar, T. Moraitis, T. Parnell, T. Tuma, B. Rajendran, Y. Leblebici, A. Sebastian, E. Eleftheriou Nat. Commun. 2018, 9, 2514.
Y. Lecun, L. Bottou, Y. Bengio, P. Haffner Proc. IEEE 1998, 86, 2278-2324.
P. Yao, H. Wu, B. Gao, S. B. Eryilmaz, X. Huang, W. Zhang, Q. Zhang, N. Deng, L. Shi, H. S. P. Wong, H. Qian Nat. Commun. 2017, 8, 15199.
M. Prezioso, F. Merrikh-Bayat, B. D. Hoskins, G. C. Adam, K. K. Likharev, D. B. Strukov Nature 2015, 521, 61-64.
A. J. Arnold, A. Razavieh, J. R. Nasr, D. S. Schulman, C. M. Eichfeld, S. Das ACS Nano 2017, 11, 3110-3118.
H. Tian, Q. Guo, Y. Xie, H. Zhao, C. Li, J. J. Cha, F. Xia, H. Wang Adv. Mater. 2016, 28, 4991-4997.
X. Xie, J. Kang, Y. Gong, P. M. Ajayan, K. Banerjee IEEE IEDM 2017, 5.3.1-5.3.4.
J. Jadwiszczak, D. Keane, P. Maguire, C. P. Cullen, Y. Zhou, H.-D. Song, C. Downing, D. S. Fox, N. McEvoy, R. Zhu, J. Xu, G. S. Duesberg, Z.-M. Liao, J. J. Boland, H. Zhang arXiv:1811.09545 2018.
Y. Yang, H. Du, Q. Xue, X. Wei, Z. Yang, C. Xu, D. Lin, W. Jie, J. Hao Nano Energy 2019, 57, 566-573.
Bao, J. Zhu, Z. Yu, R. Jia, Q. Cai, Z. Wang, L. Xu, Y. Wu, Y. Yang, Y. Cai, R. Huang ACS Appl. Mater. Inter. 2019, 11, 41482-41489.
S. B. Furber, F. Galluppi, S. Temple, L. A. Plana Proc. IEEE 2014, 102, 652-665.
P. A. Merolla, J. V. Arthur, R. Alvarez-Icaza, A. S. Cassidy, J. Sawada, F. Akopyan, B. L. Jackson, N. Imam, C. Guo, Y. Nakamura, B. Brezzo, I. Vo, S. K. Esser, R. Appuswamy, B. Taba, A. Amir, M. D. Flickner, W. P. Risk, R. Manohar, D. S. Modha Science 2014, 345, 668-673.
M. D. Ventra, F. L. Traversa J. Appl. Phys. 2018, 123, 180901.

(56) References Cited

OTHER PUBLICATIONS

C. D. Schuman, T. E. Potok, R. M. Patton, J. D. Birdwell, M. E. Dean, S. R. Garrett, J. S. Plank arXiv:1705.06963 2018.
O. Krestinskaya, A. James, C. O. Leon arXiv:1807.00962v2 2019.
M. A. Zidan, J. P. Strachan, W. D. Lu Nat. Elect. 2018, 1, 22-29.
G. W. Burr, R. M. Shelby, A. Sebastian, S. Kim, S. Kim, S. Sidler, K. Virwani, M. Ishii, P. Narayanan, A. Fumarola, L. L. Sanches, I. Boybat, M. Le Gallo, K. Moon, J. Woo, H. Hwang, Y. Leblebici Adv. Phys. X 2017, 2, 89-124.
E. J. Fuller, S. T. Keene, A. Melianas, Z. Wang, S. Agarwal, Y. Li, Y. Tuchman, C. D. James, M. J. Marinella, J. J. Yang, A. Salleo, A. A. Talin Science 2019, 364, 570-574.
Z. Wang, S. Joshi, S. Savel'ev, W. Song, R. Midya, Y. Li, M. Rao, P. Yan, S. Asapu, Y. Zhuo, H. Jiang, P. Lin, C. Li, J. H. Yoon, N. K. Upadhyay, J. Zhang, M. Hu, J. P. Strachan, M. Barnell, Q. Wu, H. Wu, R. S. Williams, Q. Xia, J. J. Yang Nat. Elect. 2018, 1, 137-145.
Z. Wang, M. Rao, J.-W. Han, J. Zhang, P. Lin, Y. Li, C. Li, W. Song, S. Asapu, R. Midya, Y. Zhuo, H. Jiang, J. H. Yoon, N. K. Upadhyay, S. Joshi, M. Hu, J. P. Strachan, M. Barnell, Q. Wu, H. Wu, Q. Qiu, R. S. Williams, Q. Xia, J. J. Yang Nat. Commun. 2018, 9, 3208.
S. Yu, P. Y. Chen IEEE Sol. Stat. Circuit Mag. 2016, 8, 43-56.
M.-J. Lee, C. B. Lee, D. Lee, S. R. Lee, M. Chang, J. H. Hur, Y.-B. Kim, C.-J. Kim, D. H. Seo, S. Seo Nat. Mater. 2011, 10, 625-630.
E. Linn, R. Rosezin, C. Kugeler, R. Waser Nat. Mater. 2010, 9, 403-406.
Y. van de Burgt, E. Lubberman, E. J. Fuller, S. T. Keene, G. C. Faria, S. Agarwal, M. J. Marinella, A. Alec Talin, A. Salleo Nat. Mater. 2017, 16, 414-418.
E. J. Fuller, F. E. Gabaly, F. Leonard, S. Agarwal, S. J. Plimpton, R. B. Jacobs-Gedrim, C. D. James, M. J. Marinella, A. A. Talin Adv. Mater. 2017, 29, 1604310.
C. Diorio, P. Hasler, A. Minch, C. A. Mead IEEE Trans. Electron. Dev. 1996, 43, 1972-1980.
V. K. Sangwan, D. Jariwala, I. S. Kim, K.-S. Chen, T. J. Marks, L. J. Lauhon, M. C. Hersam Nat. Nanotechnol. 2015, 10, 403-406.
V. K. Sangwan, H.-S. Lee, H. Bergeron, I. Balla, M. E. Beck, K.-S. Chen, M. C. Hersam Nature 2018, 554, 500-504.
B. Mouttet IEEE Inter. Conf. Electron., Circuits & Systems 2010, 930-933.
W. Huh, S. Jang, J. Y. Lee, D. Lee, D. Lee, J. M. Lee, H.-G. Park, J. C. Kim, H. Y. Jeong, G. Wang, C.-H. Lee Adv. Mater. 2018, 30, 1801447.
V. K. Sangwan, H.-S. Lee, M. C. Hersam IEEE Inter. Elect. Dev. Meet. (IEDM) 2017, 5.1.1-5.1.4.
L. Wang, W. Liao, S. L. Wong, Z. G. Yu, S. Li, Y.-F. Lim, X. Feng, W. C. Tan, X. Huang, L. Chen, L. Liu, J. Chen, X. Gong, C. Zhu, X. Liu, Y.-W. Zhang, D. Chi, K.-W. Ang Adv. Funct. Mater. 2019, 29, 1901106.
D. Li, B. Wu, X. Zhu, J. Wang, B. Ryu, W. D. Lu, W. Lu, X. Liang ACS Nano 2018, 12, 9240-9252.
H. Tian, X. Cao, Y. Xie, X. Yan, A. Kostelec, D. DiMarzio, C. Chang, L.-D. Zhao, W. Wu, J. Tice, J. J. Cha, J. Guo, H. Wang ACS Nano 2017, 11, 7156-7163.
Y. Shi, X. Liang, B. Yuan, V. Chen, H. Li, F. Hui, Z. Yu, F. Yuan, E. Pop, H. S. P. Wong, M. Lanza Nat. Elect. 2018, 1, 458-465.
V. K. Sangwan, M. C. Hersam Nat. Nanotechnol. 2020, DOI: 10.1038/s41565-020-0647-z.

V. K. Sangwan, M. C. Hersam Annu. Rev. Phys. Chem. 2018, 69, 299-325.
V. K. Sangwan, M. E. Beck, A. Henning, J. Luo, H. Bergeron, J. Kang, I. Balla, H. Inbar, L. J. Lauhon, M. C. Hersam Nano Lett. 2018, 18, 1421-1427.
T. Gokmen, M. Onen, W. Haensch Front. Neuroscience 2017, 11, DOI: 10.3389/fnins.2017.00538.
R. B. Jacobs-Gedrim, S. Agarwal, K. E. Knisely, J. E. Stevens, M. S. v. Heukelom, D. R. Hughart, J. Niroula, C. D. James, M. J. Marinella IEEE Inter. Conf. Reboot. Comp. (ICR 2017, 1-10.
S. Yu, P. Chen, Y. Cao, L. Xia, Y. Wang, H. Wu IEEE Inter. Elect. Dev. Meet. (IEDM) 2015, 17.3.1-17.3.4.
C. Chang, P. Chen, T. Chou, I. Wang, B. Hudec, C. Chang, C. Tsai, T. Chang, T. Hou IEEE J. Emerging and Selected Topics in Circuits and Systems 2018, 8, 116-124.
J. Woo, K. Moon, J. Song, S. Lee, M. Kwak, J. Park, H. Hwang IEEE Elec. Dev. Lett. 2016, 37, 994-997.
C. Sung, S. Lim, H. Kim, T. Kim, K. Moon, J. Song, J.-J. Kim, H. Hwang Nanotechnology 2018, 29, 115203.
S. T. Keene, A. Melianas, E. J. Fuller, Y. van de Burgt, A. A. Talin, A. Salieo J. Phys. D: Appl. Phys. 2018, 51, 224002.
G. G. Turrigiano, S. B. Nelson Nat. Rev. Neuro. 2004, 5, 97-107.
W. Schultz J. Neurophysio. 1998, 80, 1-27.
M. F. Bear, B. W. Connors, M. A. Paradiso. Neuroscience: Exploring the Brain. (Wolters Kluwer, 2015).
J. Jadwiszczak, D. Keane, P. Maguire, C. P. Cullen, Y. Zhou, H. Song, C. Downing, D. Fox, N. McEvoy, R. Zhu, J. Xu, G. S. Duesberg, Z.-M. Liao, J. J. Boland, H. Zhang ACS Nano 2019, 13, 14262-14273.
R. Xu, H. Jang, M.-H. Lee, D. Amanov, Y. Cho, H. Kim, S. Park, H.-j. Shin, D. Ham Nano Lett. 2019, 19, 2411-2417.
R. Ge, X. Wu, M. Kim, J. Shi, S. Sonde, L. Tao, Y. Zhang, J. C. Lee, D. Akinwande Nano Lett. 2018, 18, 434-441.
M. Wang, S. Cai, C. Pan, C. Wang, X. Lian, Y. Zhuo, K. Xu, T. Cao, X. Pan, B. Wang, S.-J. Liang, J. J. Yang, P. Wang, F. Miao Nat. Elect. 2018, 1, 130-136.
J. E. Thompson, B. T. Blue, D. Smalley, F. Torres-Davila, L. Tetard, J. T. Robinson, M. Ishigami MRS Advances 2019, 4, 2609-2617.
C.-P. Lu, G. Li, J. Mao, L.-M. Wang, E. Y. Andrei Nano Lett. 2014, 14, 4628-4633.
A. A. Murthy, T. K. Stanev, R. dos Reis, S. Hao, C. Wolverton, N. P. Stern, V. P. Dravid ACS Nano 2020, 14, 1569-1576.
M.-S. Abdelouahab, R. Lozi, L. Chua Inter. J. of Bifur. and Chaos 2014, 24, 1430023.
A. A. Bessonov, M. N. Kirikova, D. I. Petukhov, M. Allen, T. Ryhanen, M. J. A. Bailey Nat. Mater. 2015, 14, 199-204.
Z. Wei, Y. Kanzawa, K. Arita, Y. Katoh, K. Kawai, S. Muraoka, S. Mitani, S. Fujii, K. Katayama, M. Iijima, T. Mikawa, T. Ninomiya, R. Miyanaga, Y. Kawashima, K. Tsuji, A. Himeno, T. Okada, R. Azuma, K. Shimakawa, H. Sugaya, T. Takagi, R. Yasuhara, K. Horiba, H. Kumigashira, M. Oshima IEEE Inter. Elec. Dev. Meet. (IEDM) 2008, 1-4.
A. Leonhardt, D. Chiappe, V. V. Afanas'ev, S. El Kazzi, I. Shlyakhov, T. Conard, A. Franquet, C. Huyghebaert, S. de Gendt ACS Appl. Mater. Inter. 2019, 11, 42697-42707.
D. S. Shang, Q. Wang, L. D. Chen, R. Dong, X. M. Li, W. Q. Zhang Phys. Rev. B 2006, 73, 245427.

* cited by examiner

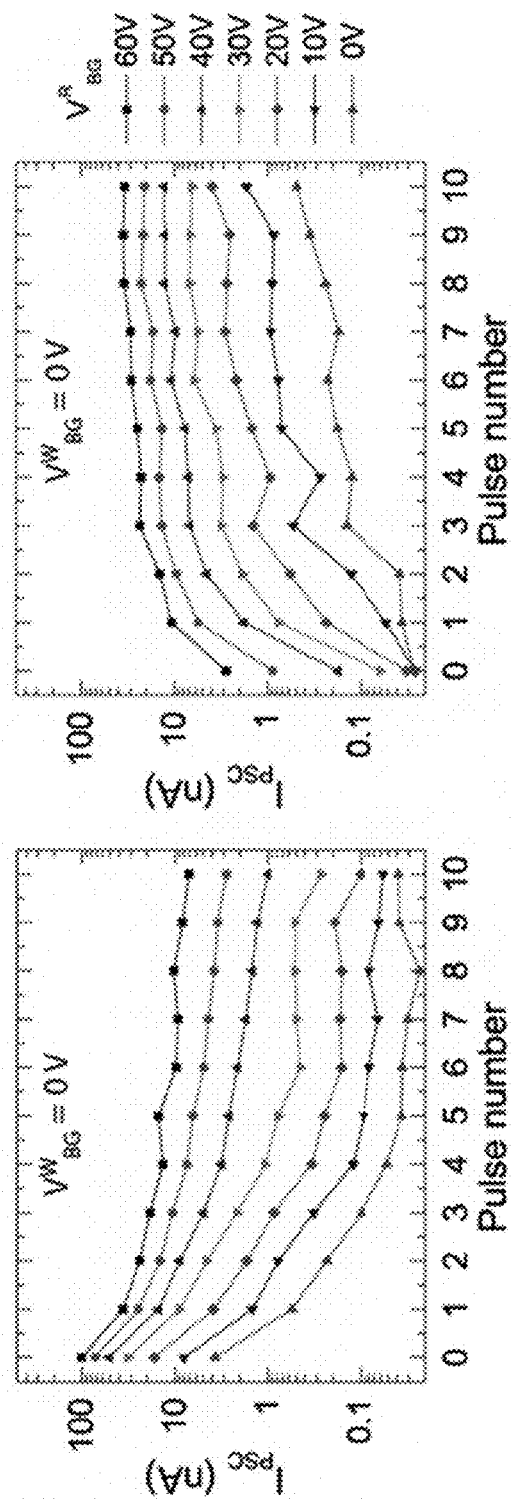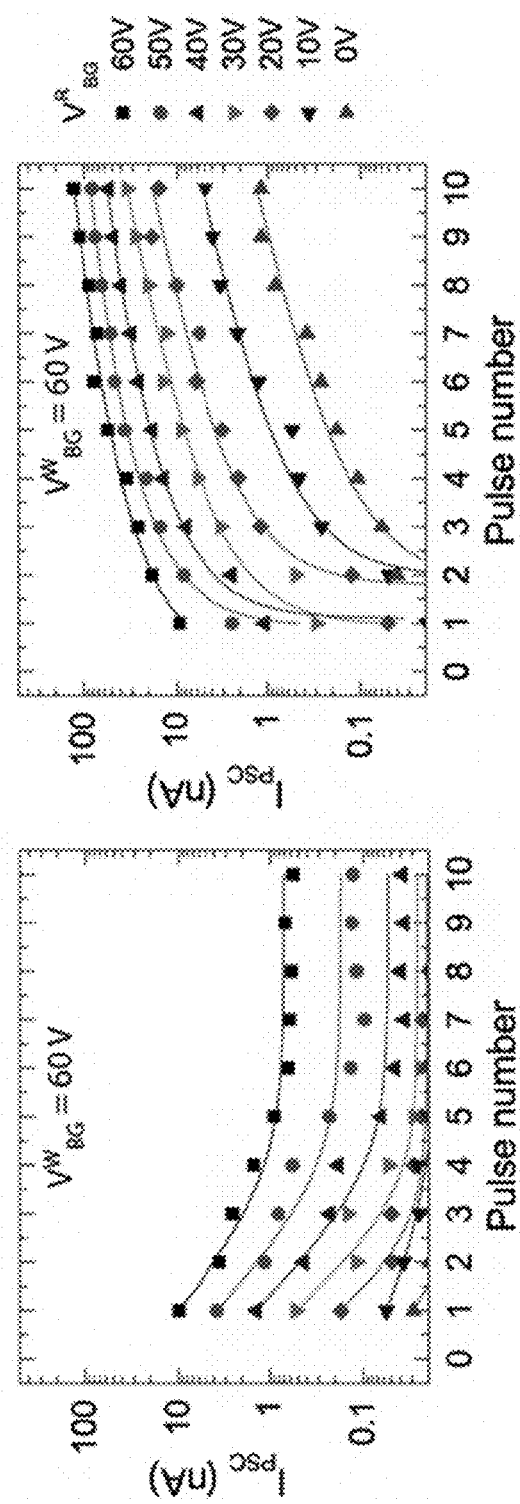
FIG. 17A
FIG. 17B
FIG. 17C
FIG. 17D

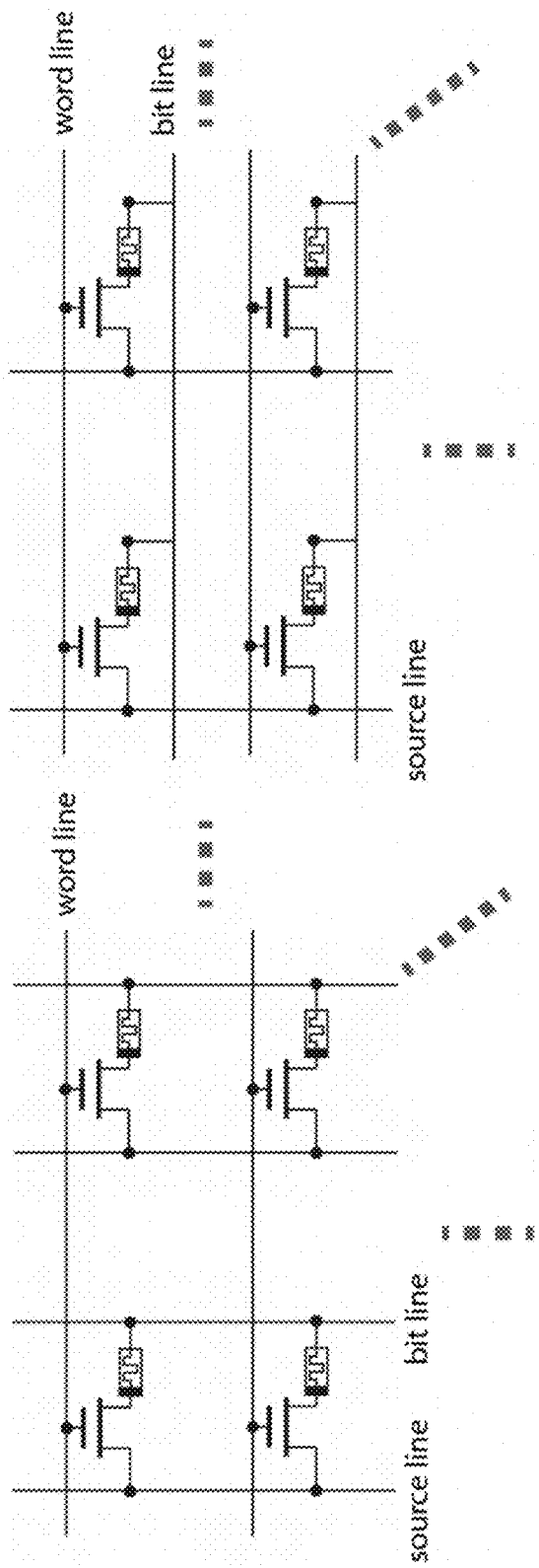

DUAL-GATED MEMTRANSISTOR CROSSBAR ARRAY, FABRICATING METHODS AND APPLICATIONS OF SAME

CROSS-REFERENCE TO RELATED PATENT APPLICATIONS

This application claims priority to and the benefit of U.S. Provisional Application Ser. No. 62/908,841, filed Oct. 1, 2019, which is incorporated herein in its entirety by reference.

STATEMENT AS TO RIGHTS UNDER FEDERALLY-SPONSORED RESEARCH

This invention was made with government support under 70NANB14H012 awarded by the National Institute of Standards and Technology, and DMR-1720139 awarded by the National Science Foundation. The government has certain rights in the invention.

FIELD OF THE INVENTION

The present invention relates generally to semiconductors, and more particularly to a dual-gated memtransistor crossbar array, fabricating methods and applications of the same.

BACKGROUND OF THE INVENTION

The background description provided herein is for the purpose of generally presenting the context of the invention. The subject matter discussed in the background of the invention section should not be assumed to be prior art merely as a result of its mention in the background of the invention section. Similarly, a problem mentioned in the background of the invention section or associated with the subject matter of the background of the invention section should not be assumed to have been previously recognized in the prior art. The subject matter in the background of the invention section merely represents different approaches, which in and of themselves may also be inventions. Work of the presently named inventors, to the extent it is described in the background of the invention section, as well as aspects of the description that may not otherwise qualify as prior art at the time of filing, are neither expressly nor impliedly admitted as prior art against the invention.

The increasing demand for digital data processing and communication is pushing conventional computer architectures to their power consumption limits, resulting in the active development of energy-efficient alternative paradigms such as neuromorphic computing. In turn, novel devices beyond complementary metal-oxide-semiconductor (CMOS) field-effect transistors (FETs) are being pursued for hardware implementation of neuromorphic computing. Among the most promising base elements of artificial neural networks (ANNs) are memristive devices and synaptic transistors. With large resistive switching ratios, these devices are not only useful as non-volatile memory but also as fully neuromorphic systems that can store synaptic weights in ANNs with rapid updating (i.e., learning) and efficient classification (i.e., inference) functionality. While a significant advantage of memristors is their scalability via crossbar arrays, this same architecture also imposes two major challenges. First, the learning rule (i.e., weight update scheme) is set in the material processing step with no further control during computation. Second, reliable access to individual nodes in a crossbar architecture requires a non-linear (i.e., diode) or active (i.e., transistor) component at each node, limiting scaling to the same level as conventional dynamic random access memory (DRAM).

To overcome these challenges, novel memristive systems are being investigated, such as complementary resistive switching and the integration of synaptic transistors with diffusive memristors. However, synaptic transistors do not offer control over learning rate and require an additional element at each node for individual device access in a crossbar architecture since their non-volatile resistance states are written by a gate bias and read by a drain current. Thus, despite being a three-terminal device, the gate terminal in a synaptic transistor is not available for additional tunability over the current-voltage characteristics.

Therefore, a heretofore unaddressed need exists in the art to address the aforementioned deficiencies and inadequacies.

SUMMARY OF THE INVENTION

One of the objectives of this invention is to provide dual-gated $MoS_2$ memtransistors enabling artificial synapses with tunable learning rates where the two gates act as modulatory terminals that mimic biological systems. In crossbar arrays, these dual-gated memtransistors also overcome the sneak current issue that plagues conventional memristors. The non-volatile resistance states and read currents are controlled by distinct metal lines in the crossbar array, providing a highly scalable paradigm for neuromorphic circuits.

In one aspect, the invention relates to a memtransistor, comprising a top gate electrode and a bottom gate electrode; a polycrystalline monolayer film formed of an atomically thin material disposed between the top gate electrode and the bottom gate electrode; and source and drain electrodes spatial-apart formed on the polycrystalline monolayer film to define a channel in the polycrystalline monolayer film therebetween, wherein the top gate electrode and the bottom gate electrode are capacitively coupled with the channel.

In one embodiment, the memtransistor further comprises a top dielectric layer formed between the top gate electrode and the channel, and a bottom dielectric layer formed between the channel and the bottom gate electrode.

In one embodiment, the atomically thin material comprises two-dimensional (2D) semiconductor material.

In one embodiment, the 2D semiconductor material comprises $MoS_2$, $MoSe_2$, $WS_2$, $WSe_2$, InSe, GaTe, black phosphorus (BP), or related two-dimensional materials.

In one embodiment, the top and bottom gate electrodes and the source and drain electrodes comprises a same conductive material or different conductive materials.

In one embodiment, each of the top and bottom gate electrodes and the source and drain electrodes is formed of gold (Au), titanium (Ti), aluminum (Al), nickel (Ni), chromium (Cr), and other conductive materials.

In one embodiment, the bottom gate electrode is formed of doped silicon (Si).

In one embodiment, the top and bottom dielectric layers comprise a same dielectric material or different dielectric materials.

In one embodiment, the top dielectric layer is formed of $Al_2O_3$, $HfO_2$, $ZrO_2$, or ZnO.

In one embodiment, the bottom dielectric layer is formed of $SiO_2$, or dielectrics including alumina, hafnia, or zirconia.

In one embodiment, the memtransistor is characterized with a switching ratio between a high resistance state (HRS)

and a low resistance state (LRS), wherein the switching ratio is tunable with respect to bias of the bottom gate electrode and/or the top gate electrode.

In one embodiment, the memtransistor is configured to have bipolar resistive switching characteristics at different biases applied to the bottom gate electrode with the top gate electrode left floating.

In one embodiment, the memtransistor is configured to have a pinched hysteresis loop in the clockwise direction at forward biases.

In one embodiment, the memtransistor is configured to have drain current at the forward bias being larger than that at reverse bias.

In one embodiment, the memtransistor is configured to have the large memristive loop with minimal bottom gate bias hysteresis.

In one embodiment, the memtransistor is configured such that both long-term potentiation (LTP) and long-term depression (LTD) are operably modulated as a function of the gate bias during writing, while the output current during reading is operably controlled as a function of the gate bias during reading without affecting the intrinsic state of the memtransistor.

In another aspect, the invention relates to a circuitry comprising one or more memtransistors as disclosed above.

In yet another aspect, the invention relates to an electronic device, comprising one or more memtransistors as disclosed above.

In a further aspect, the invention relates to a method for fabricating a memtransistor comprising: growing a polycrystalline monolayer film of an atomically thin material on a substrate; and forming source and drain electrodes on the grown polycrystalline monolayer film, wherein the source and drain electrodes define a channel in the polycrystalline monolayer film therebetween; and forming a top gate electrode over the channel.

In one embodiment, the polycrystalline monolayer film is grown by chemical vapor deposition (CVD) on the substrates.

In one embodiment, the substrate comprises a bottom gate electrode of doped Si coated with thermal oxide serving as the bottom dielectric layer between the bottom gate electrode and the channel.

In one embodiment, the step of forming the source and drain electrodes comprises patterning the source and drain electrodes on the grown polycrystalline monolayer film by electron-beam lithography, followed by etching of the channel via reactive ion etching.

In one embodiment, the method further comprises, prior to forming the top gate electrode over the channel, depositing a top gate dielectric layer atomic layer on the channel and the source and drain electrodes.

In one embodiment, the atomically thin material comprises 2D semiconductor material.

In one embodiment, the 2D semiconductor material comprises $MoS_2$, $MoSe_2$, $WS_2$, $WSe_2$, InSe, GaTe, BP, or related two-dimensional materials.

In another aspect, the invention relates to a crossbar array comprised of M columns and N rows of memtransistors, each of M and N being an integer greater than zero. The crossbar array includes a bottom gate electrode layer; a bottom dielectric layer formed on the bottom gate electrode layer; a polycrystalline monolayer film formed of an atomically thin material formed on the bottom dielectric layer; M+1 source-drain electrodes spatial-apart formed on the polycrystalline monolayer film along a column direction, wherein the polycrystalline monolayer film is patterned according to the M+1 source-drain electrodes to define M columns and N rows of channels therein, such that each two neighboring source-drain electrodes are coupled with N channels of a respective channel column between said two neighboring source-drain electrodes; a top dielectric layer formed on the polycrystalline monolayer film and extended over the M+1 source-drain electrodes; and N top gate electrodes formed on the top dielectric layer, crossing over the M+1 source-drain electrodes along a row direction, such that each top gate electrode is capacitively coupled with M channels of a respective channel row.

In one embodiment, the atomically thin material comprises 2D semiconductor material.

In one embodiment, the 2D semiconductor material comprises $MoS_2$, $MoSe_2$, $WS_2$, $WSe_2$, InSe, GaTe, BP, or related two-dimensional materials.

In one embodiment, the bottom gate electrode layer comprises a globe bottom gate electrode capacitively coupled with the M columns and the N rows of channels.

In one embodiment, the bottom gate electrode layer comprises N bottom gate electrodes crossing over the M+1 source-drain electrodes along the row direction, such that each bottom gate electrode is capacitively coupled with M channels of a respective channel row.

In one embodiment, the top and bottom gate electrodes and the source-drain electrodes comprises a same conductive material or different conductive materials.

In one embodiment, each of the top and bottom gate electrodes and the source-drain electrodes is formed of Au, Ti, Al, Ni, Cr, and other conductive materials.

In one embodiment, the bottom gate electrodes are formed of doped Si.

In one embodiment, the top and bottom dielectric layers comprises a same dielectric material or different dielectric materials.

In one embodiment, the top dielectric layer is formed of $Al_2O_3$, $HfO_2$, $ZrO_2$, or ZnO.

In one embodiment, the bottom dielectric layer is formed of $SiO_2$, or dielectrics including alumina, hafnia, or zirconia.

In one embodiment, each memtransistor is characterized with a switching ratio between an HRS and an LRS, wherein the switching ratio is tunable with respect to bias of the bottom gate electrode and/or the top gate electrode of said memtransistor.

In one embodiment, each memtransistor is configured to have bipolar resistive switching characteristics at different biases applied to the bottom gate electrode with the top gate electrode left floating.

In one embodiment, each memtransistor is configured to have a pinched hysteresis loop in the clockwise direction at forward biases.

In one embodiment, each memtransistor is configured to have drain current at the forward bias being larger than that at reverse bias.

In one embodiment, each memtransistor is configured to have the large memristive loop with minimal bottom gate bias hysteresis.

In one embodiment, each memtransistor is configured such that both LTP and LTD are operably modulated as a function of the gate bias during writing, while the output current during reading is operably controlled as a function of the gate bias during reading without affecting the intrinsic state of said memtransistor.

In one embodiment, the source and drain electrodes ($S_i/D_{i+1}$) are shared by the neighboring memtransistors in columns i and i+1 (except i=1, M).

In one embodiment, the crossbar array is configured such that each memtransistor is writable and readable independently, thereby minimizing sneak current in the crossbar array.

In one embodiment, the crossbar array is configured such that application of a predetermined bottom gate voltage suppresses read currents without changing non-volatile memristive resistance states of the memtransistors in the crossbar array, thereby enabling isolation of the non-volatile memristive resistance states and read currents without additional elements at each node for crossbar operation in the crossbar array.

In one embodiment, each memtransistor has gate tenability.

In one embodiment, a linear and symmetric learning behavior that produces efficient training of an artificial neural network (ANN) is achievable by the gate tunability.

In another aspect, the invention relates to a circuitry comprising one or more crossbar arrays as disclosed above.

In yet another aspect, the invention relates to a circuitry n electronic device, comprising one or more crossbar arrays as disclosed above.

In a further aspect, the invention relates to a method of fabricating a crossbar array comprised of M columns and N rows of memtransistors, each of M and N being an integer greater than zero.

The method includes growing a polycrystalline monolayer film of an atomically thin material on a substrate; patterning M+1 source-drain electrodes on the polycrystalline monolayer film along a column direction; etching the polycrystalline monolayer film according to the M+1 source-drain electrodes to define M columns and N rows of channels therein, such that each two neighboring source-drain electrodes are coupled with N channels of a respective channel column between said two neighboring source-drain electrodes; growing a top dielectric layer formed on the polycrystalline monolayer film and extended over the M+1 source-drain electrodes; and forming N top gate electrodes formed on the top dielectric layer, crossing over the M+1 source-drain electrodes along a row direction, such that each top gate electrode is capacitively coupled with M channels of a respective channel row.

In one embodiment, the growing step is performed with ALD.

In one embodiment, the substrate comprises a bottom gate electrode layer of doped Si coated thermal oxide serving as the bottom dielectric layer between the frown polycrystalline monolayer film and the bottom gate electrode layer.

In one embodiment, the bottom gate electrode layer comprises a globe bottom gate electrode capacitively coupled with the M columns and the N rows of channels.

In one embodiment, the bottom gate electrode layer comprises N bottom gate electrodes crossing over the M+1 source-drain electrodes along the row direction, such that each bottom gate electrode is capacitively coupled with M channels of a respective channel row.

These and other aspects of the present invention will become apparent from the following description of the preferred embodiment taken in conjunction with the following drawings, although variations and modifications therein may be affected without departing from the spirit and scope of the novel concepts of the invention.

BRIEF DESCRIPTION OF THE DRAWINGS

The patent or application file contains at least one drawing executed in color. Copies of this patent or patent application publication with color drawing(s) will be provided by the Patent and Trademark Office upon request and payment of the necessary fee.

The accompanying drawings illustrate one or more embodiments of the invention and together with the written description, serve to explain the principles of the invention. Wherever possible, the same reference numbers are used throughout the drawings to refer to the same or like elements of an embodiment.

FIG. 2A: A plot of 250 full switching cycles at $V_{BG}=0$ V and $V_{TG}=0$ V. FIG. 2B: Corresponding LRS and HRS values for the 250 full switching cycles of part in FIG. 2A. $I_D$ values were extracted at $V_D=-2$ V to avoid non-zero crossing at $V_D=2$ V that resulted in negative $I_D$. FIG. 2C: Retention behavior of the LRS and HRS states for 24 hours where the device was measured at $V_D=2$ V every 10 s (see FIG. 15 for retention time extrapolation). FIG. 2D: Retention behavior of 10 distinct resistance states during the long-term depression (LTD) of a dual-gated memtransistor. The data labeled as '1' and '10' in the legend are the LRS and HRS states, respectively. The current, $I_D$, was measured at $V_D=2$ V. All subsequent current levels (2-10) were measured at the same $V_D$ bias after writing with 1 ms wide pulses of $V_D=20$ V. $V_{TG}=V_{BG}=0$ V during reading and writing operations.

FIG. 4A: Pulsing scheme for long-term depression (LTD) at various $V_{BG}$ values during the writing operation ($V^W_{BG}$). The device was read at $V_D=1$ V and various $V_{BG}$ values during the reading operation ($V^R_{BG}$). FIGS. 4B-4C: $V^R_{BG}$-dependent LTD behavior at $V^W_{BG}=60$ V and $-60$ V, respectively. FIG. 4D: Pulsing scheme for long-term potentiation (LTP) at $V^W_{BG}$ during the writing operation. FIGS. 4E-4F: $V^R_{BG}$-dependent LTP behavior at $V^W_{BG}=60$ V and $-60$ V, respectively. The legend to the right of FIG. 4E corresponds to all plots in this figure. $V_{TG}$ was grounded throughout the LTD and LTP measurements. Exponential fits to the LTD and LTP curves in FIGS. 4B and 4E are provided in FIGS. 17A-17D.

FIG. 5A: Schematic illustration of a dual-gated $MoS_2$ memtransistor crossbar array with global silicon bottom gate (word line 1, WL1) and local top gate electrodes (word line 2, WL2) running perpendicular to the drain and source electrodes (bit line B and source line S). FIG. 5B: Diagram of the dual-gated memtransistor crossbar array. The optional local bottom gate electrodes (WL1) are shown to further reduce parasitic capacitance during reading and writing operations. Mux stands for multiplexer. FIG. 5C: False-colored scanning electron microscopy (SEM) image of a 10×9 crossbar array. The horizontal electrodes (source and drain) are the alternating B line and S line, and the vertical electrodes (top gate) are WL2. The blue color region indicates the $Al_2O_3$ oxide layer as the top gate dielectric. FIG. 5D: Zoomed-in SEM image of the active area indicated by the red rectangle in FIG. 5C. FIG. 5E: Histogram of the switching ratio of 34 $MoS_2$ memtransistors in 1×9 arrays (FIG. 10F) at $V_D=1$ and $V_{BG}=V_{TG}=0$ V.

FIG. 6A: Writing operation of device 1 in the crossbar using $V_D$ pulses (1 ms) of 20 V and $-20$ V for switching to HRS and LRS, respectively. All top gate lines except $TG_1$ ($V_{TG1}=10$ V) are floating during writing. For the disturbance test, $TG_2$ was biased at 10 V and all other TG lines were kept floating. FIG. 6B: False-color SEM image of device 1 and device 2 used in the disturbance test. FIGS. 6C-6D: Resistance changes of HRS and LRS of the selected device 1, with respect to time (reading conditions, $V_D=1$ V, $V_{TG1}=5$ V), respectively, after 1$^{st}$, 2$^{nd}$, 3$^{rd}$, and 4$^{th}$ switching events at device 2 ($V_{TG2}=10$ V).

FIG. 7A: The ANN is trained to perform the classification of MNIST handwritten digits using backpropagation. Each input neuron corresponds to a unique pixel in the image. A pair of dual-gated $MoS_2$ memtransistors was used to represent each synaptic weight (w) between fully connected neurons in the input, hidden, and output layers. FIG. 7B: Circuit block diagram of the hardware implementation of the ANN shown in FIG. 7A using dual-gated memtransistor crossbar synapses. The device resistance is read via source lines. Weight updates are accomplished by pulsing bit lines (drain) and word line 1 (bottom gate). Word line 2 (top gate) is used to minimize the sneak current. MUX=multiplexer; ADC=analog-to-digital converter. Two neighboring memtransistors in the dashed box, with conductance levels $w_p$ and $w_m$, are used to store a synaptic weight, $w=w_p-w_m$. FIG. 7C: The linearity of the LTP and LTD characteristics of a dual-gated memtransistor synapse. The LTP pulsing scheme is $V_D=-15$ V pulses for 1 ms at $V^W_{BG}=-20$ V. The LTD pulsing scheme is $V_D=15$ V pulses for 1 ms at $V^W_{BG}=0$ V. The device conductance (G) is read at $V_D=1$ V and $V^R_{BG}=0$ V. Solid lines represent ideal linear and symmetric synaptic responses. FIG. 7D: The recognition rate of the simulated ANN using experimental data from FIG. 7C achieves an accuracy of 94% in 100 epochs, which is within 3% of the ideal case.

FIG. 8A: Raman spectrum of polycrystalline monolayer $MoS_2$ grown on a $SiO_2/Si$ wafer by CVD, showing the expected gap (~19.5 cm$^{-1}$) between $A_{1g}$ and $E^1_{2g}$ peaks. The sample was excited with a 532 nm laser, and the scattered light was collected by a 100× objective (spot size ~1 μm$^2$, NA=0.9) and analyzed through a 2400 grooves/mm grating. FIG. 8B: Photoluminescence spectrum showing the monolayer $MoS_2$ exciton A peak at 660 nm. FIG. 8C: X-ray photoelectron spectroscopy (XPS) spectrum showing Mo 3d and S 2s peaks from monolayer $MoS_2$. FIG. 8D: XPS spectrum of the S 2p peak doublet.

FIG. 9A: Atomic force microscopy (AFM) topography map showing monolayer $MoS_2$ with regions of a bilayer and few-layer $MoS_2$. FIG. 9B: Lateral force microscopy image also reveals grain boundaries in monolayer $MoS_2$ (highlighted by arrows), in addition to the thickness variation, as seen by the common features in FIGS. 9A-9B.

FIG. 16A: Bottom gate leakage current ($I_{BG}$) versus bottom gate voltage ($V_{BG}$) of a dual-gated $MoS_2$ memtransistor after switching between HRS and LRS. The top gate was left floating during $I_{BG}$ measurements. FIG. 16B: Top gate leakage current ($I_{TG}$) versus top gate voltage ($V_{TG}$) of the same dual-gated $MoS_2$ memtransistor after switching between HRS and LRS. The bottom gate was left floating during $I_{TG}$ measurements.

FIGS. 17A-17D show long-term characterization of a $MoS_2$ memtransistor, according to embodiments of the invention. FIG. 17A: $V^R_{BG}$-dependent long-term depression (LTD) behavior of a $MoS_2$ memtransistor ($V_D$=20 V pulses). The device and measurement pulsing protocol are the same as FIGS. 4A-4F of the main text. The bottom gate was grounded during writing ($V^W_{BG}$=0 V) while the resistance states were read at $V_D$=1 V at different biases ($V^R_{BG}$=60 V−0 V). FIG. 17B: Long-term potentiation ($V_D$=−10 V pulses) of the device at $V^W_{BG}$=0 V. The legend on the right side of FIG. 17B corresponds to both FIGS. 17A-17B. FIG. 17C: LTD behavior (without pulse 0 point) from FIG. 4B of the main text ($V^W_{BG}$=60 V) fitted with a single exponential decay function, $I_{PSC}=I_0+A.\exp[-n/n_1]$, where, $I_0$, A, and $n_1$ are constants and n is the number of pulses. $n_1$ remains between 0.7 and 1.6 for all the fits, while $I_0$ and A vary with $V^R_{BG}$. Including the pulse 0 point requires bi-exponentials for proper fitting. FIG. 17D: LTP behavior (without the pulse 0 point) from FIG. 4E of the main text ($V^W_{BG}$=60 V) fitted with a single exponential growth function, $I_{PSC}=I_0+A.\exp[n/n_2]$. $n_2$ is roughly 10 larger than $n_1$ for a given $V^R_{BG}$ possibly due to different pulse amplitudes. The LTD and LTP trends in FIGS. 17C-17D including the pulse 0 points require bi-exponential functions to properly fit.

FIGS. 19A-19D show architecture of a crossbar array. FIG. 19A: Architecture of a conventional one-transistor-one-memristor (1T1M) crossbar array where each 1T1M element has a dedicated source, bit, and word line. FIG. 19B: Architecture of a pseudo-1T1M crossbar array where bit lines are rotated by 90 degrees. FIG. 19C: Alternative architecture of a conventional 1T1M crossbar array where only the bit lines are shared by neighboring 1T1M elements. FIG. 19D: Architecture of a dual-gated memtransistor crossbar array where both the source and the bit lines are shared by the neighboring memtransistors, according to embodiments of the invention. Architecture shown in FIG. 19D is similar to that in FIG. 19A except the additional gate (word line 2) is fabricated in a separate layer and integrated by vias without compromising the areal density of memtransistors. Although the source and bit lines are in the same layer, they can be fanned out orthogonally to represent columns and rows of the crossbar arrays while word lines from dual-gates are used to minimize sneak current and achieve tunable (linear) conductance responses (see FIG. 7C).

DETAILED DESCRIPTION OF THE INVENTION

Figure 1A:
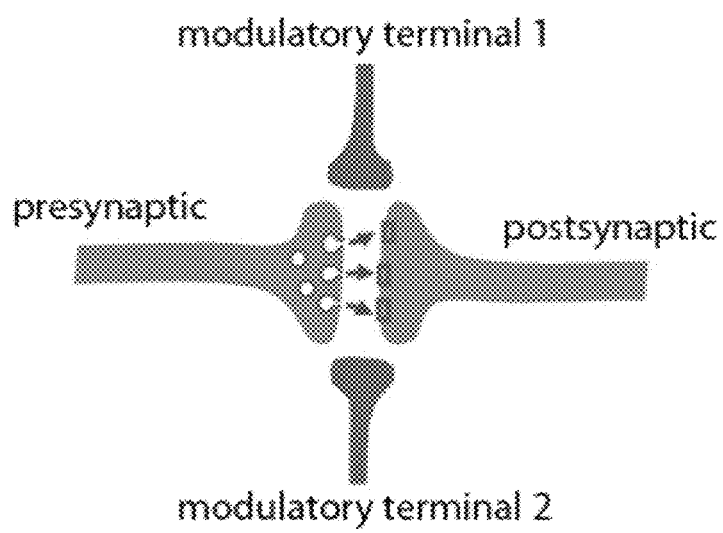
FIG. 1A shows a schematic of synaptic connections between neurons with two modulatory terminals for controlled release of neurotransmitters.

The invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this specification will be thorough and complete, and will fully convey the scope of the invention to those skilled in the art. Like reference numerals refer to like elements throughout.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

It will be understood that, as used in the description herein and throughout the claims that follow, the meaning of "a", "an", and "the" includes plural reference unless the context clearly dictates otherwise. Also, it will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the figures. For example, if the device in one of the figures. is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures. is turned over, elements described as "below" or "beneath" other elements would then be oriented "above" the other elements. The exemplary terms "below" or "beneath" can, therefore, encompass both an orientation of above and below.

It will be further understood that the terms "comprises" and/or "comprising," or "includes" and/or "including" or "has" and/or "having", or "carry" and/or "carrying," or "contain" and/or "containing," or "involve" and/or "involving, and the like are to be open-ended, i.e., to mean including but not limited to. When used in this specification, they specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification, and will not be interpreted in an idealized or overly formal sense unless expressly so defined herein.

As used in this specification, "around", "about", "approximately" or "substantially" shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated.

As used in this specification, the phrase "at least one of A, B, and C" should be construed to mean a logical (A or B or, using a non-exclusive logical OR. As used herein, the term "and/or" includes any and all combinations of one or more of the associated listed items.

The description below is merely illustrative in nature and is in no way intended to limit the invention, its application, or uses. The broad teachings of the invention can be implemented in a variety of forms. Therefore, while this invention includes particular examples, the true scope of the invention should not be so limited since other modifications will become apparent upon a study of the drawings, the specification, and the following claims. For purposes of clarity, the same reference numbers will be used in the drawings to identify similar elements. It should be understood that one or more steps within a method may be executed in different order (or concurrently) without altering the principles of the invention.

An emerging candidate for neuromorphic hardware is the three-terminal memtransistor, where resistance states are controlled by resistive switching near the contacts via drain voltage pulses (i.e., non-volatile operation) while the channel conductivity can be further modulated by a gate bias during reading (i.e., volatile operation). This device is enabled by the weak electrostatic screening in two-dimensional (2D) materials and van der Waals heterojunctions, which is a property that has been recently explored for tunable and biomimetic neuromorphic responses. In particular, monolayer $MoS_2$ has been specifically identified as a promising semiconductor by the International Technology Roadmap for Semiconductors (ITRS) due to a variety of attributes including favorable device metrics, stability, and scaling potential.

Initial implementations of monolayer $MoS_2$ memtransistors showed a variety of unique functionalities including multi-terminal heterosynaptic responses that are enabled by its planar architecture. However, integration of these memtransistors into scalable crossbar array architectures has not been achieved. In addition, previous implementations of memtransistors have only utilized single gate electrodes and thus have not taken full advantage of the opportunities for dual gating that have been exploited in other devices based on 2D semiconductors. Furthermore, current approaches to achieve linear and symmetric weight update rules that allow higher accuracy in neural networks have relied on modifications to materials composition or complex voltage pulsing schemes, both of which limit overall performance and speed.

Recognizing these unfulfilled opportunities, this invention in certain aspects discloses the fabrication, characterization, and integration of dual-gated monolayer $MoS_2$ memtransistors into crossbar arrays. These dual-gated memtransistors provide facile control over a range of neuromorphic responses including multiple intermediate resistance states and gate-tunable long-term potentiation and depression synaptic behavior. This gate tunability enables improved linearity and symmetry of the synaptic response, which achieves efficient classification of hand-written digits using an ANN. In addition, dual gating allows for the addressability of individual nodes in crossbar arrays without the sneak current and crosstalk issues that plague traditional memristor crossbar architectures. Since the two gate lines reside in separate processing layers, they do not compromise the scaling limits of 2D semiconductors.

Among other things, certain embodiments of the invention demonstrate that four-terminal dual-gated memtransistors enable unique neuromorphic functionality and crossbar array integration advantages compared to two-terminal memristors and three-terminal single-gated memtransistors.

Figure 1B:
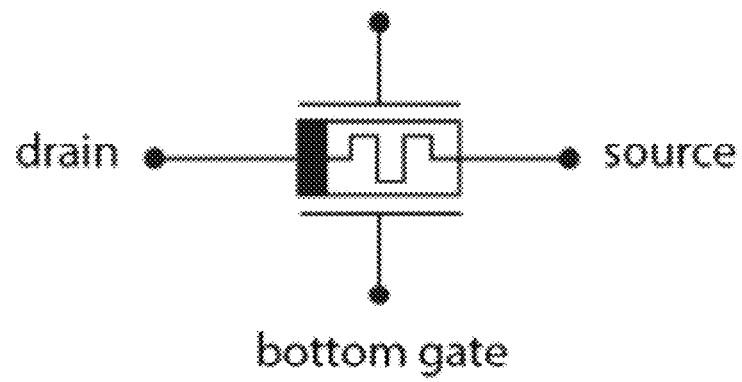
FIG. 1B shows an electrical symbol of a dual-gated memtransistor where the two gates act as modulatory terminals, according to embodiments of the invention.
Figure 1C:
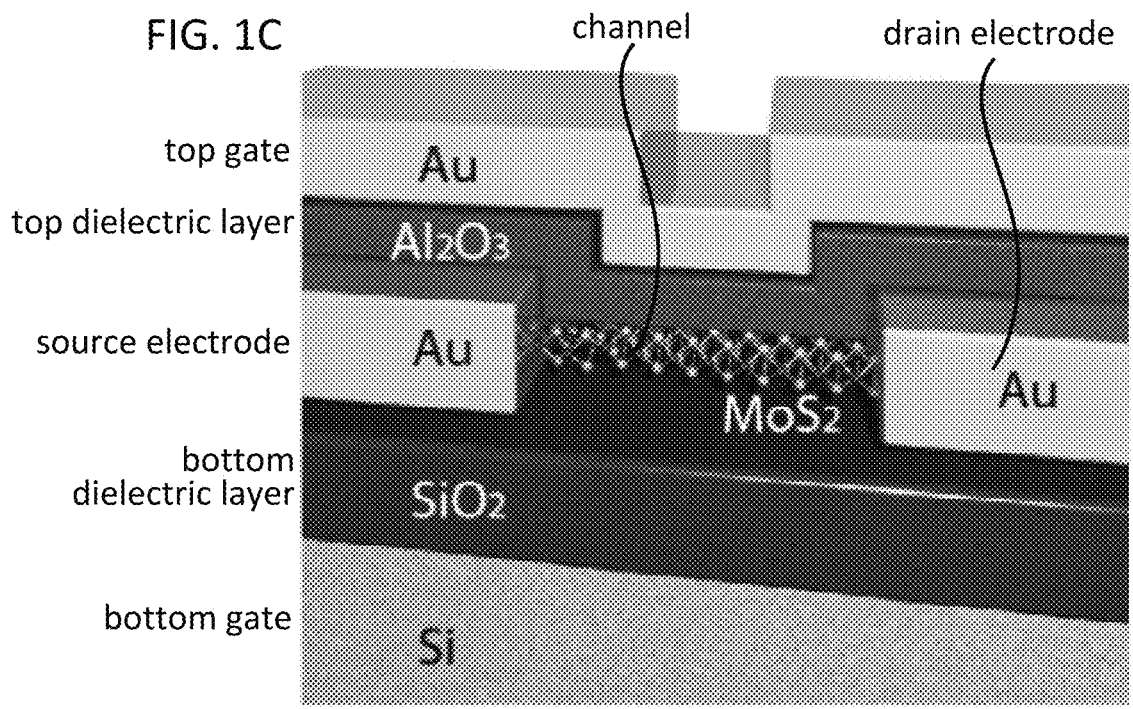
FIG. 1C shows a schematic of a dual-gated $MoS_2$ memtransistor structure, according to embodiments of the invention. The Si substrate acts as a global bottom gate and patterned Au acts as a local top gate.

Referring to FIGS. 1B-1C, a memtransistor is shown according to one embodiment of the invention. In the exemplary embodiment, the memtransistor comprises a top gate electrode and a bottom gate electrode; a polycrystalline monolayer film formed of an atomically thin material (e.g., $MoS_2$) disposed between the top gate electrode and the bottom gate electrode; source and drain electrodes spatial-apart formed on the polycrystalline monolayer film to define a channel in the polycrystalline monolayer film between the source and drain electrodes; a top dielectric layer formed between the top gate electrode and the channel; and a bottom dielectric layer formed between the channel and the bottom gate electrode. The top gate electrode and the bottom gate electrode are capacitively coupled with the channel.

The atomically thin material comprises 2D semiconductor material. In some embodiments, the 2D semiconductor material comprises $MoS_2$, $MoSe_2$, $WS_2$, $WSe_2$, InSe, GaTe, black phosphorus (BP), or related two-dimensional materials.

In some embodiments, the top and bottom gate electrodes and the source and drain electrodes comprises a same conductive material or different conductive materials.

In some embodiments, each of the top and bottom gate electrodes and the source and drain electrodes is formed of Au, Ti, Al, Ni, Cr, and other conductive materials.

In some embodiments, the bottom gate electrode is formed of doped silicon (Si).

In some embodiments, the top and bottom dielectric layers comprise a same dielectric material or different dielectric materials.

In some embodiments, the top dielectric layer is formed of $Al_2O_3$, $HfO_2$, $ZrO_2$, or ZnO.

In some embodiments, the bottom dielectric layer is formed of $SiO_2$, or dielectrics including alumina, hafnia, or zirconia.

The memtransistor is a dual gated memtransistor that can be characterized with a switching ratio between a low resistance state (LRS) and a high resistance state (HRS), wherein the switching ratio is a ratio of current ($I_{LRS}$) of the dual gated memtransistor at the LRS to that ($I_{HRS}$) of the dual gated memtransistor at the HRS. In some embodiments, the switching ratio is tunable with respect to a bias of the bottom gate electrode and/or the top gate electrode. In some embodiments, the dual gated memtransistor is configured such that the switching ratio increases with increasing a voltage of the bottom gate electrode.

In some embodiments, the memtransistor is configured to have bipolar resistive switching characteristics at different biases applied to the bottom gate electrode with the top gate electrode left floating.

In some embodiments, the memtransistor is configured to have a pinched hysteresis loop in the clockwise direction at forward biases.

In some embodiments, the memtransistor is configured to have drain current at the forward bias being larger than that at reverse bias.

In some embodiments, the memtransistor is configured to have the large memristive loop with minimal bottom gate bias hysteresis.

In some embodiments, the memtransistor is configured such that both long-term potentiation (LTP) and long-term depression (LTD) are operably modulated as a function of the gate bias during writing, while the output current during reading is operably controlled as a function of the gate bias during reading without affecting the intrinsic state of the memtransistor.

The invention in certain aspects also relates to a circuitry and/or an electronic device comprising one or more memtransistors as disclosed above.

In one aspect, the invention further relates to a method for fabricating a memtransistor. The method includes growing a polycrystalline monolayer film of an atomically thin material on a substrate. In some embodiments, the polycrystalline monolayer film is grown by chemical vapor deposition (CVD) on the substrates. The atomically thin material comprises two-dimensional (2D) semiconductor material. In some embodiments, the 2D semiconductor material comprises $MoS_2$, $MoSe_2$, $WS_2$, $WSe_2$, InSe, GaTe, black phosphorus (BP), or related two-dimensional materials.

The method also includes forming source and drain electrodes on the grown polycrystalline monolayer film, wherein the source and drain electrodes define a channel in the polycrystalline monolayer film therebetween; and forming a top gate electrode over the channel.

In some embodiments, the step of forming the source and drain electrodes comprises patterning the source and drain electrodes on the grown polycrystalline monolayer film by electron-beam lithography, followed by etching of the channel via reactive ion etching.

In some embodiments, the method further comprises, prior to forming the top gate electrode over the channel, depositing a top gate dielectric layer atomic layer on the channel and the source and drain electrodes.

In some embodiments, the substrate comprises a bottom gate electrode of doped Si coated thermal oxide serving as the bottom dielectric layer between the bottom gate electrode and the channel.

The rapidly increasing demand for digital data communication and storage has inspired the development of edge computing where digital and analog data are locally processed before sending to the central processing unit. One of the most promising paradigms for these local hardware accelerators is a crossbar array of memristors that can perform high-level classification and regression. Currently available crossbar arrays based on two-terminal memristors suffer from a fixed weight update rule and sneak current crosstalk that limits the ultimate scalability of artificial neural networks. In contrast, multi-terminal memtransistors based on two-dimensional materials have shown tunable learning rate. However, memtransistors need to be integrated into crossbar arrays for practical circuit implementation.

Certain aspects of the invention disclose dual-gated memtransistor crossbar arrays that address this critical need. In some embodiments, the first gate electrode allows tunable learning rate that improves the stability of artificial neural networks. Meanwhile, the second gate electrode enables a variable read current without perturbing the non-volatile state, resulting in minimal "sneak current" that avoids crosstalk between different nodes in crossbar arrays. The dual-gated memtransistor thus achieves functionality that has previously required the fabrication of a memristor and a transistor at each node, thus providing a simplified circuit design with higher integration potential. Consequently, this invention can find broad utility in hardware accelerators, feature detectors, classifiers, and neuromorphic computing.

Referring to FIGS. 5A-5D, the dual-gated memtransistor crossbar arrays are shown according to certain embodiments of the invention. In the exemplary embodiments, the dual-gated memtransistor crossbar array includes M columns and N rows of memtransistors, each of M and N being an integer greater than zero. The crossbar array includes a bottom gate electrode layer; a bottom dielectric layer formed on the bottom gate electrode layer; a polycrystalline monolayer film formed of an atomically thin material formed on the bottom dielectric layer; M+1 source-drain electrodes spatial-apart formed on the polycrystalline monolayer film along a column direction, wherein the polycrystalline monolayer film is patterned according to the M+1 source-drain electrodes to define M columns and N rows of channels therein, such that each two neighboring source-drain electrodes are coupled with N channels of a respective channel column between said two neighboring source-drain electrodes; a top dielectric layer formed on the polycrystalline monolayer film and extended over the M+1 source-drain electrodes; and N top gate electrodes formed on the top dielectric layer, crossing over the M+1 source-drain electrodes along a row direction, such that each top gate electrode is capacitively coupled with M channels of a respective channel row.

The atomically thin material comprises 2D semiconductor material. In some embodiments, the 2D semiconductor material comprises $MoS_2$, $MoSe_2$, $WS_2$, $WSe_2$, InSe, GaTe, BP, or related two-dimensional materials.

In some embodiments, the bottom gate electrode layer comprises a globe bottom gate electrode capacitively coupled with the M columns and the N rows of channels.

In some embodiments, the bottom gate electrode layer comprises N bottom gate electrodes crossing over the M+1 source-drain electrodes along the row direction, such that each bottom gate electrode is capacitively coupled with M channels of a respective channel row.

In some embodiments, the top and bottom gate electrodes and the source-drain electrodes comprises a same conductive material or different conductive materials. In some embodiments, each of the top and bottom gate electrodes and the source-drain electrodes is formed of Au, Ti, Al, Ni, Cr, and other conductive materials.

In some embodiments, the bottom gate electrodes are formed of doped silicon (Si).

In some embodiments, the top and bottom dielectric layers comprises a same dielectric material or different dielectric materials. In some embodiments, the top dielectric layer is formed of $Al_2O_3$, $HfO_2$, $ZrO_2$, or ZnO. In some embodiments, the bottom dielectric layer is formed of $SiO_2$, or dielectrics including alumina, hafnia, or zirconia.

In some embodiments, each memtransistor is characterized with a switching ratio between an HRS and an LRS, wherein the switching ratio is tunable with respect to bias of the bottom gate electrode and/or the top gate electrode of said memtransistor.

In some embodiments, each memtransistor is configured to have bipolar resistive switching characteristics at different biases applied to the bottom gate electrode with the top gate electrode left floating.

In some embodiments, each memtransistor is configured to have a pinched hysteresis loop in the clockwise direction at forward biases.

In some embodiments, each memtransistor is configured to have drain current at the forward bias being larger than that at reverse bias.

In some embodiments, each memtransistor is configured to have the large memristive loop with minimal bottom gate bias hysteresis.

In some embodiments, each memtransistor is configured such that both LTP and LTD are operably modulated as a function of the gate bias during writing, while the output current during reading is operably controlled as a function of the gate bias during reading without affecting the intrinsic state of said memtransistor.

In some embodiments, the source and drain electrodes ($S_i/D_{i+1}$) are shared by the neighboring memtransistors in columns i and i+1 (except i=1, M).

In some embodiments, the crossbar array is configured such that each memtransistor is writable and readable independently, thereby minimizing sneak current in the crossbar array.

In some embodiments, the crossbar array is configured such that application of a predetermined bottom gate voltage suppresses read currents without changing non-volatile memristive resistance states of the memtransistors in the crossbar array, thereby enabling isolation of the non-volatile memristive resistance states and read currents without additional elements at each node for crossbar operation in the crossbar array.

In some embodiments, each memtransistor has gate tenability.

In some embodiments, a linear and symmetric learning behavior that produces efficient training of an artificial neural network (ANN) is achievable by the gate tunability.

In certain aspects, the invention also relates to a circuitry, and/or an electronic device comprising one or more crossbar arrays as disclosed above.

In one aspect, the invention further relates to a method of fabricating a crossbar array comprised of M columns and N rows of memtransistors, each of M and N being an integer greater than zero.

Figure 10:
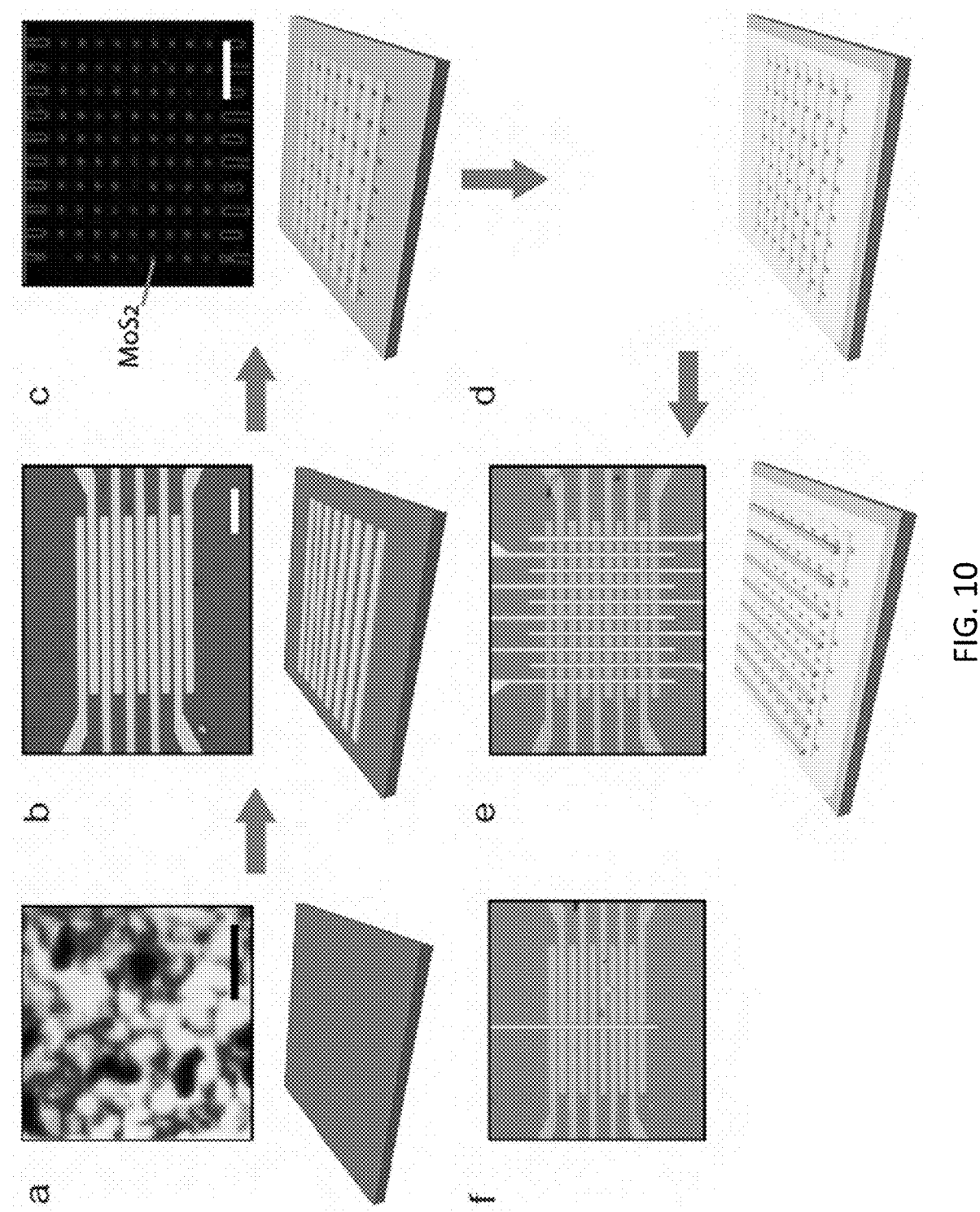
FIG. 10 shows the steps of fabrication of a monolayer $MoS_2$ memtransistor crossbar array, according to embodiments of the invention. Step a: Map of photoluminescence intensity at 670 nm of CVD-grown monolayer $MoS_2$, revealing grain sizes on the order of a few microns (scale bar 5 μm). A schematic of the CVD-grown film is shown below. Step b: Memtransistor crossbar fabrication begins with the fabrication of source-drain electrodes on monolayer $MoS_2$. The optical micrograph (top) corresponds to the schematic (bottom) (scale bar=10 μm). Step c: The $MoS_2$ memtransistor channels are defined by RIE using the source and drain electrodes as a position reference. A map of photoluminescence intensity reveals a (10×9) array of $MoS_2$ channels (scale bar=10 μm). Step c: The $MoS_2$ is coated with 30 nm $Al_2O_3$ grown by ALD. Step e: An array of top gate electrodes is patterned with respect to the etched $MoS_2$ to obtain the crossbar devices. Step f: A single top gate is patterned for a (1×9) array to study individual devices.

Referring to FIG. 10, the method of fabrication of a monolayer $MoS_2$ memtransistor crossbar array is shown according to one embodiment of the invention. The method includes growing a polycrystalline monolayer film of an atomically thin material on a substrate (step a); patterning M+1 source-drain electrodes on the polycrystalline monolayer film along a column direction (step b); etching the polycrystalline monolayer film according to the M+1 source-drain electrodes to define M columns and N rows of channels therein (step, such that each two neighboring source-drain electrodes are coupled with N channels of a respective channel column between said two neighboring source-drain electrodes; growing a top dielectric layer formed on the polycrystalline monolayer film and extended over the M+1 source-drain electrodes (step d); and forming N top gate electrodes formed on the top dielectric layer, crossing over the M+1 source-drain electrodes along a row direction (step e), such that each top gate electrode is capacitively coupled with M channels of a respective channel row. An array of top gate electrodes is patterned with respect to the etched $MoS_2$ to obtain the crossbar devices. FIG. 10 also shows a single top gate is patterned for a (1×9) array to study individual devices (panel f).

In some embodiments, the growing step is performed with ALD.

In some embodiments, the substrate comprises a bottom gate electrode layer of doped Si coated thermal oxide serving as the bottom dielectric layer between the frown polycrystalline monolayer film and the bottom gate electrode layer.

In some embodiments, the bottom gate electrode layer comprises a globe bottom gate electrode capacitively coupled with the M columns and the N rows of channels.

In some embodiments, the bottom gate electrode layer comprises N bottom gate electrodes crossing over the M+1 source-drain electrodes along the row direction, such that each bottom gate electrode is capacitively coupled with M channels of a respective channel row.

To further illustrate the principles of the invention and their practical application, certain exemplary embodiments of the invention are described below with reference to the accompanying drawings.

Dual-Gated $MoS_2$ Memtransistor Characteristics

As shown in FIGS. 1A and 1B, the two gates in dual-gated memtransistors can be conceptualized as modulatory terminals in biological neurons, which provide non-Hebbian learning functionality such as heterosynaptic plasticity and homeostatic plasticity. These complex learning protocols are desired in ANNs to mitigate the overshooting of individual synaptic weights and to achieve greater network stability during the training stage. Towards this end, dual-gated $MoS_2$ memtransistors were fabricated on polycrystalline monolayer $MoS_2$ grown by chemical vapor deposition (CVD). The devices use a global bottom gate and local top gate as shown in FIG. 1C. Specifically, polycrystalline monolayer $MoS_2$ was grown by CVD on doped Si substrates coated with 300 nm thick thermal oxide serving as the bottom gate dielectric. The quality of the monolayer $MoS_2$ was confirmed by atomic force microscopy, Raman microscopy, photoluminescence spectroscopy, and X-ray photoelectron spectroscopy (FIGS. 8A-8D and 9A-9B). Source and drain electrodes were then patterned on the continuous $MoS_2$ film by electron-beam lithography, followed by etching of the MoS$_2$ into memtransistor channels via reactive ion etching. Atomic layer deposition (ALD) of Al$_2$O$_3$ was used to deposit a top gate dielectric of ≈30 nm in thickness, followed by patterning of local top gate contacts (see FIG. 10).

Figure 1D:
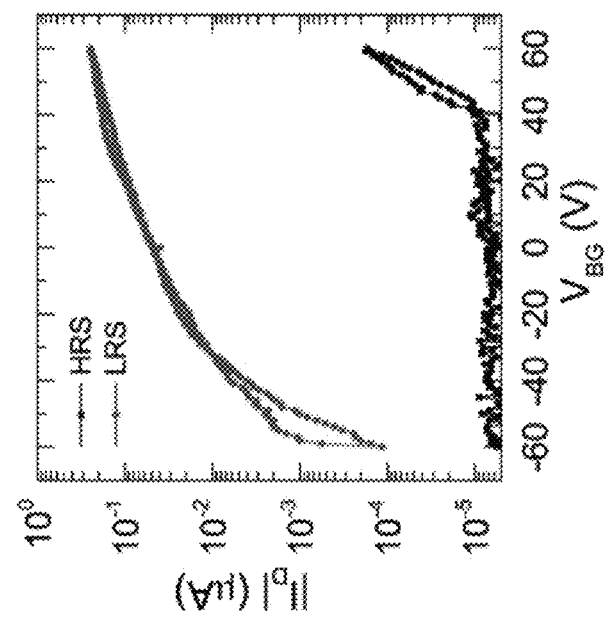
FIG. 1D shows gate-tunable memristive switching ($V_D=\pm30$ V) at various bottom gate biases ($V_{BG}$) from −60 V to 60 V with the top gate floating (channel length=0.9 µm, channel width=0.7 µm), according to embodiments of the invention. The arrow and number indicate the sweep sequence (clockwise switching).
Figure 1E:
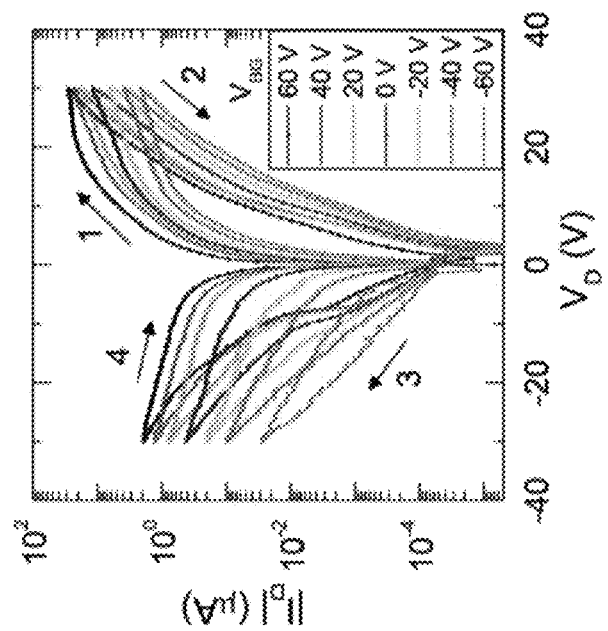
FIG. 1E shows transfer curve ($V_D=1$ V) as a function of $V_{BG}$ for the low resistance state (LRS) and high resistance state (HRS) of the memtransistor, according to embodiments of the invention.
Figure 11:
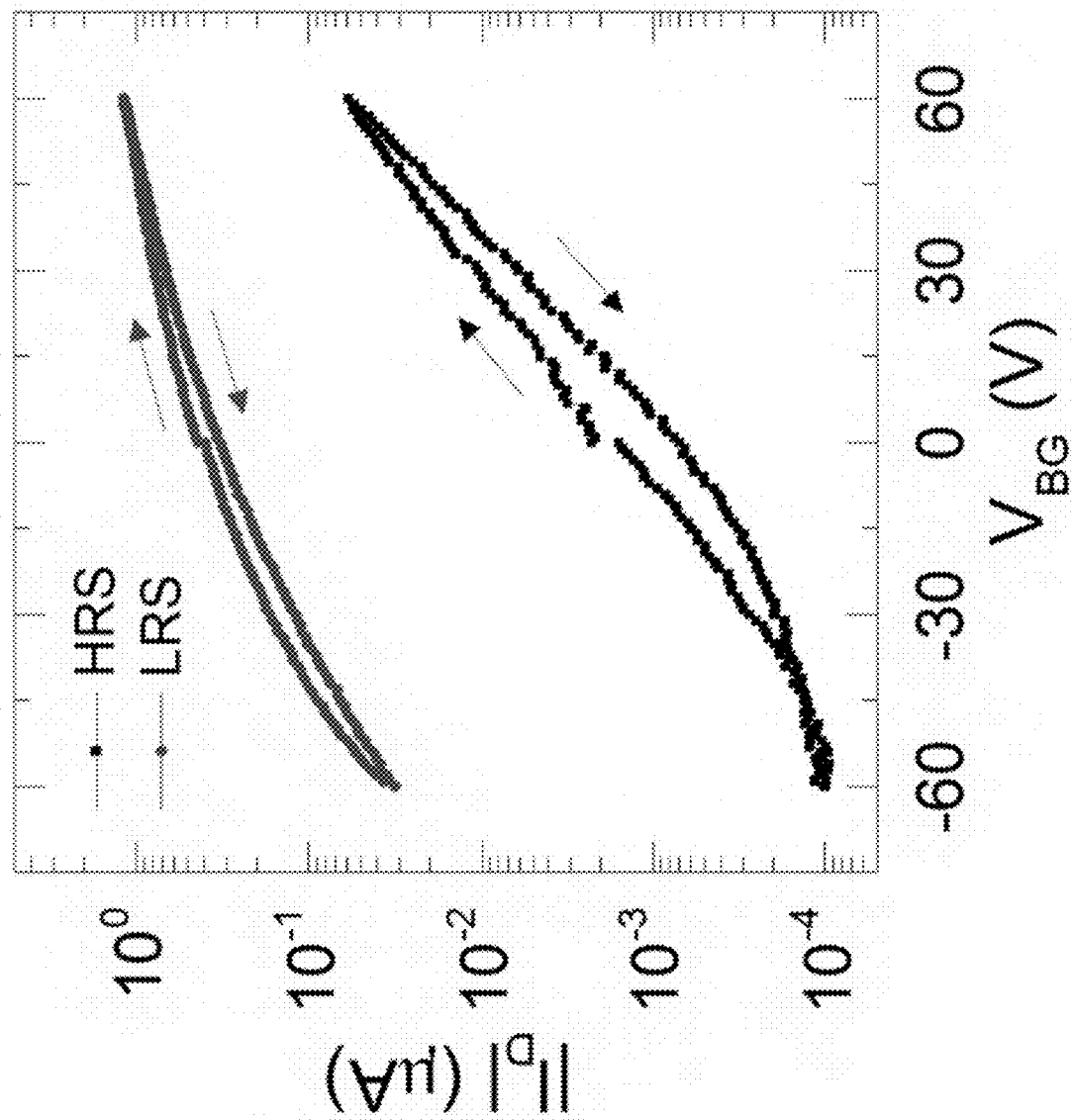
FIG. 11 shows a transfer curve ($V_D=5$ V) as a function of $V_{BG}$ for the low resistance state (LRS) and high resistance state (HRS) of the memtransistor from FIG. 1E.

FIG. 1D shows the bipolar resistive switching characteristics of the dual-gated MoS$_2$ memtransistor at different bottom gate biases ($V_{BG}$) with a floating top gate. The device channel dimensions of all individual and crossbar devices are identical (channel length, L=0.9 µm, channel width, W=0.7 µm). The device is initially in a low resistance state (LRS) and switches to a high resistance state (HRS) at forward bias (drain voltage $V_D$>0). This RESET process occurs during both sweeps 1 and 2 shown in FIG. 1D. In contrast, the device undergoes a SET process at reverse bias ($V_D$<0). It should be noted that SET and RESET do not require an electroforming process. As a result, dual-gated memtransistors show a pinched hysteresis loop in the clockwise direction at forward bias, in contrast to the counterclockwise loops for single-gated MoS$_2$ memtransistors (bottom gate or top gate). As shown in FIGS. 1D-1E and 11, the large memristive loop with minimal bottom gate bias hysteresis also distinguishes a memtransistor from a synaptic transistor. Both the direction of switching and the rectification polarity suggest that the dominant resistive switching is occurring at the forward-biased Schottky diode (for $V_D$>0 V) near the drain contact as opposed to the reverse-biased Schottky diode near the source contact that was observed in single-gated memtransistors. The opposite switching direction between single-gated and dual-gated memtransistors likely originates from resistive switching occurring at opposite electrodes (source versus drain). A more detailed discussion on the switching mechanism is provided later.

Figure 1F:
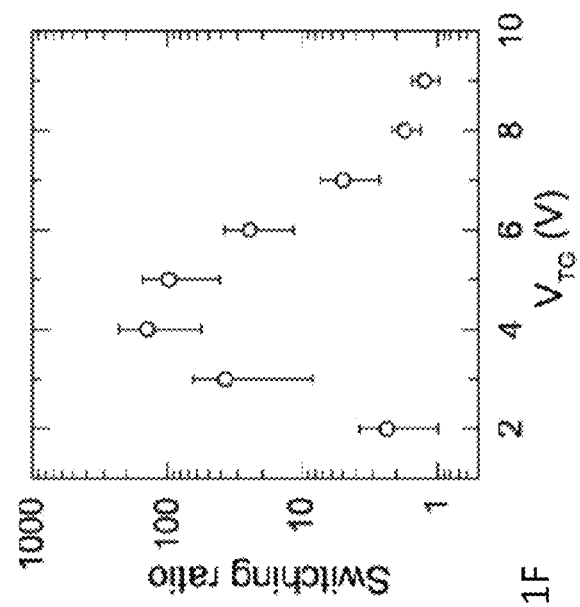
FIG. 1F shows tunability of the switching ratio ($V_D=1$ V) with respect to the top gate bias $V_{TG}$ ($V_{BG}=-60$ V), according to embodiments of the invention.
Figure 12:
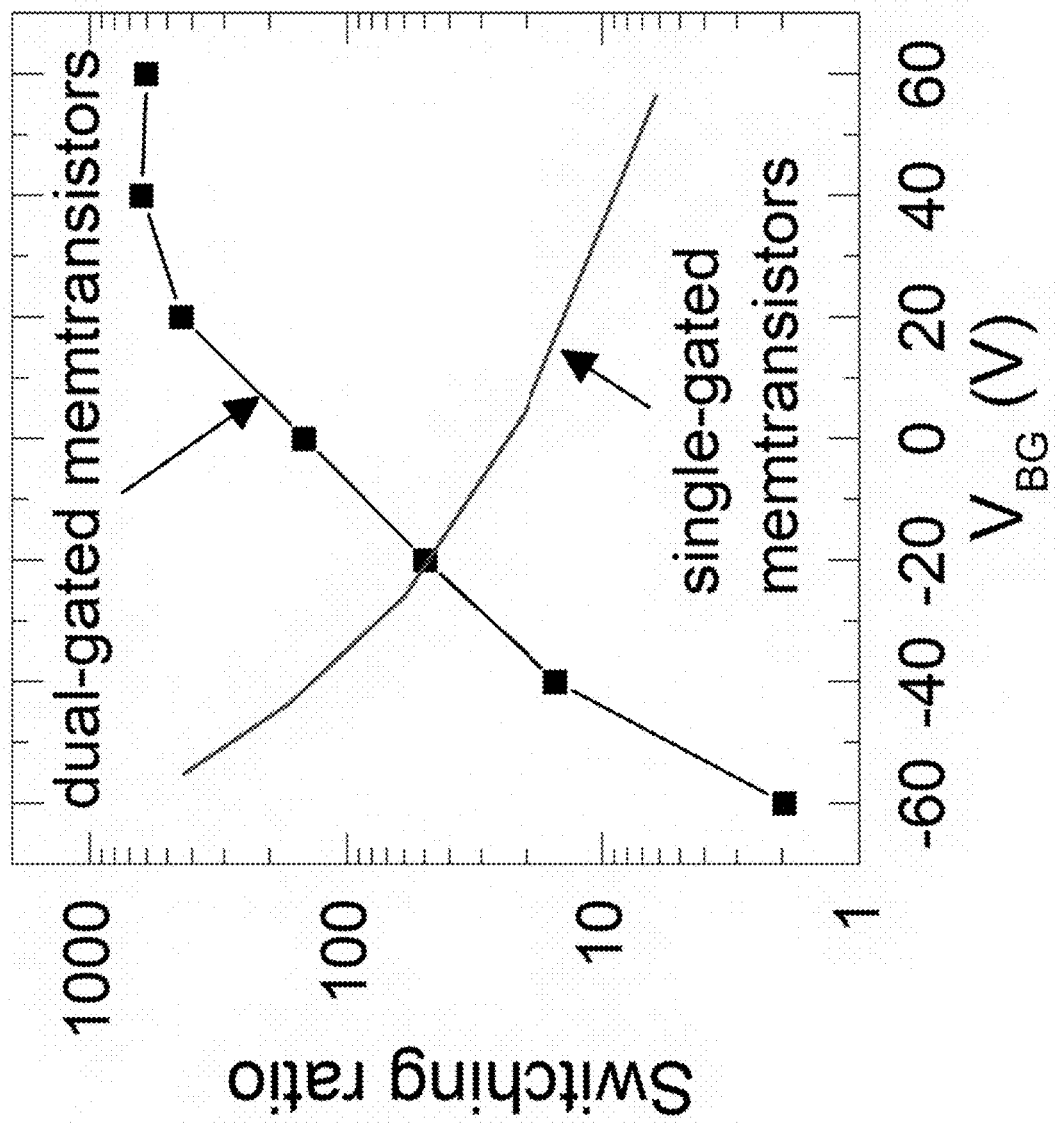
FIG. 12 shows monotonic tunability of the switching ratio ($V_D=-2$ V) with respect to the bottom gate bias $V_{BG}$ with a floating top gate (the data extracted from FIG. 1D). The red line shows a qualitative trend of switching ratio versus $V_{BG}$ from previously reported single-gated memtransistors. The contrasting trend is explained by the different switching mechanisms in the two kinds of devices, as discussed in the disclosure.

The low-bias transconductance and threshold voltage ($V_{TH}$) undergo substantial changes between HRS and LRS. In LRS, the dual-gated memtransistor does not turn off even at $V_{BG}$=−60 V ($V_{TH}$=20 V), while no measurable current was observed in HRS up to $V_{BG}$=40 V. The RESET and SET operations were also achieved with lower operating voltages ($V_D$=±30 V) than previously reported single-gated memtransistors ($V_D$=±50 V), as would be expected for the smaller L (<1 µm) and thinner top gate dielectrics compared to previous single-gated memtransistors (L=5–15 µm). The top gate voltage ($V_{TG}$) further controls the resistive switching ratio in a non-monotonic fashion (FIG. 1F). On the other hand, the resistive switching ratio increases with $V_{BG}$ which is the opposite of gate-tunability in previous single-gated memtransistors (FIG. 12). This counter-intuitive behavior is explained by a different switching mechanism, as discussed later. The hysteresis is maximum at $V_{TG}$=4 V and decreases for $V_{TG}$<4 V due to the overall smaller drain current in the sub-threshold regime. The hysteresis decreases for $V_{TG}$>4 V because an overall decreased Schottky barrier height in the accumulation regime also results in smaller modulation of the barrier height during memristive switching.

Scaling to smaller L (and lower $V_D$) in these memtransistors is enabled by the smaller average grain size (≈1 µm$^2$) optimized via CVD growth (see Supporting Information). However, operating voltage is not expected to scale linearly with L due to the dominance of thermionic emission and space-charge effects near the Schottky contacts. Further scaling could be achieved by growing even smaller grains or employing post-growth lattice defects, e.g., MoS$_2$ memtransistor on individual flakes (without grain boundaries) was reported by creating defects via focused He ion beam. Point defects are also known to play a critical role in vertical memristors based on monolayer, bilayer and few-layer MoS$_2$. However, the role of lattice point defects in memristive I-V characteristics of lateral devices is not well understood thus, motivating atomically resolved in-situ characterizations such as scanning tunneling microscopy and scanning transmission electron microscopy.

Figure 2A:
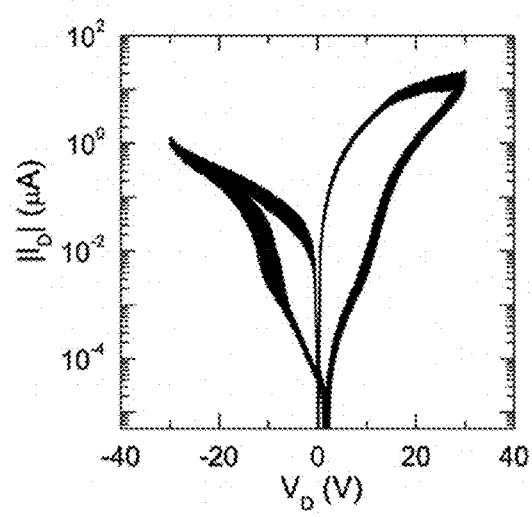
FIGS. 2A-2D show endurance and retention characteristics of dual-gated $MoS_2$ memtransistors, according to embodiments of the invention.
Figure 2B:
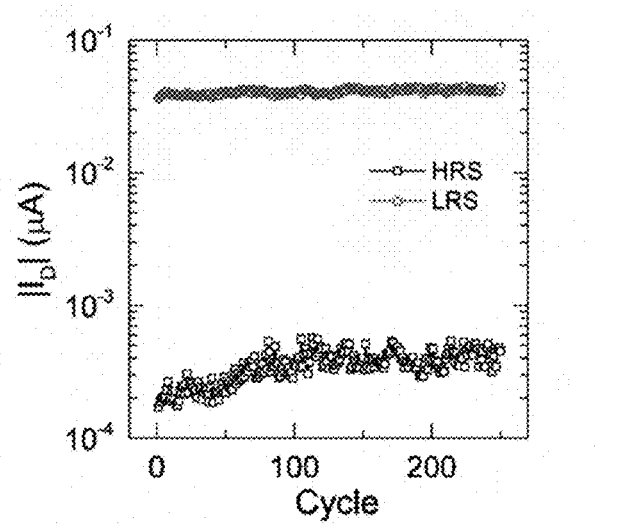
Figure 2C:
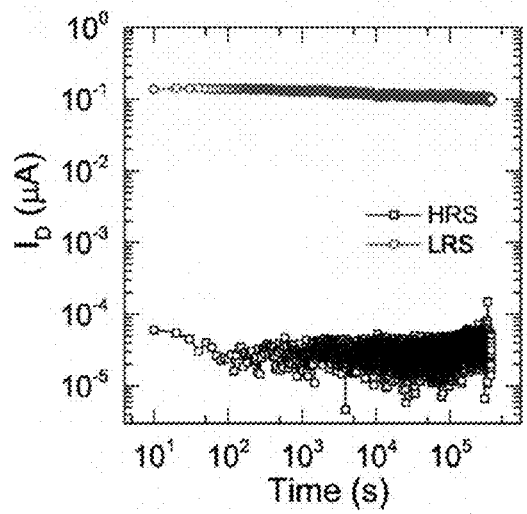
Figure 2D:
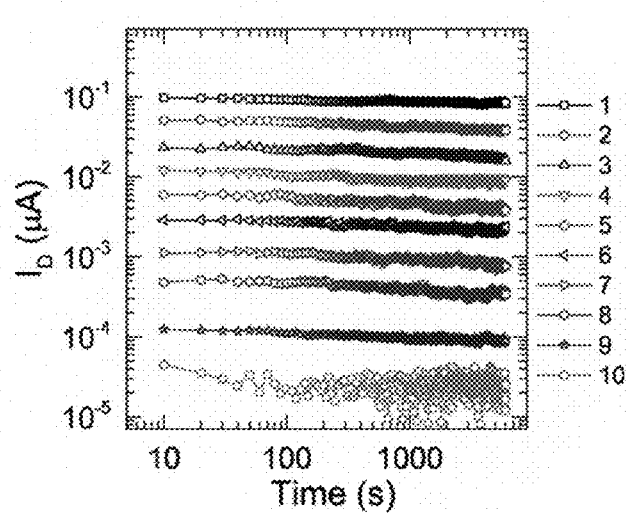
Figure 13:
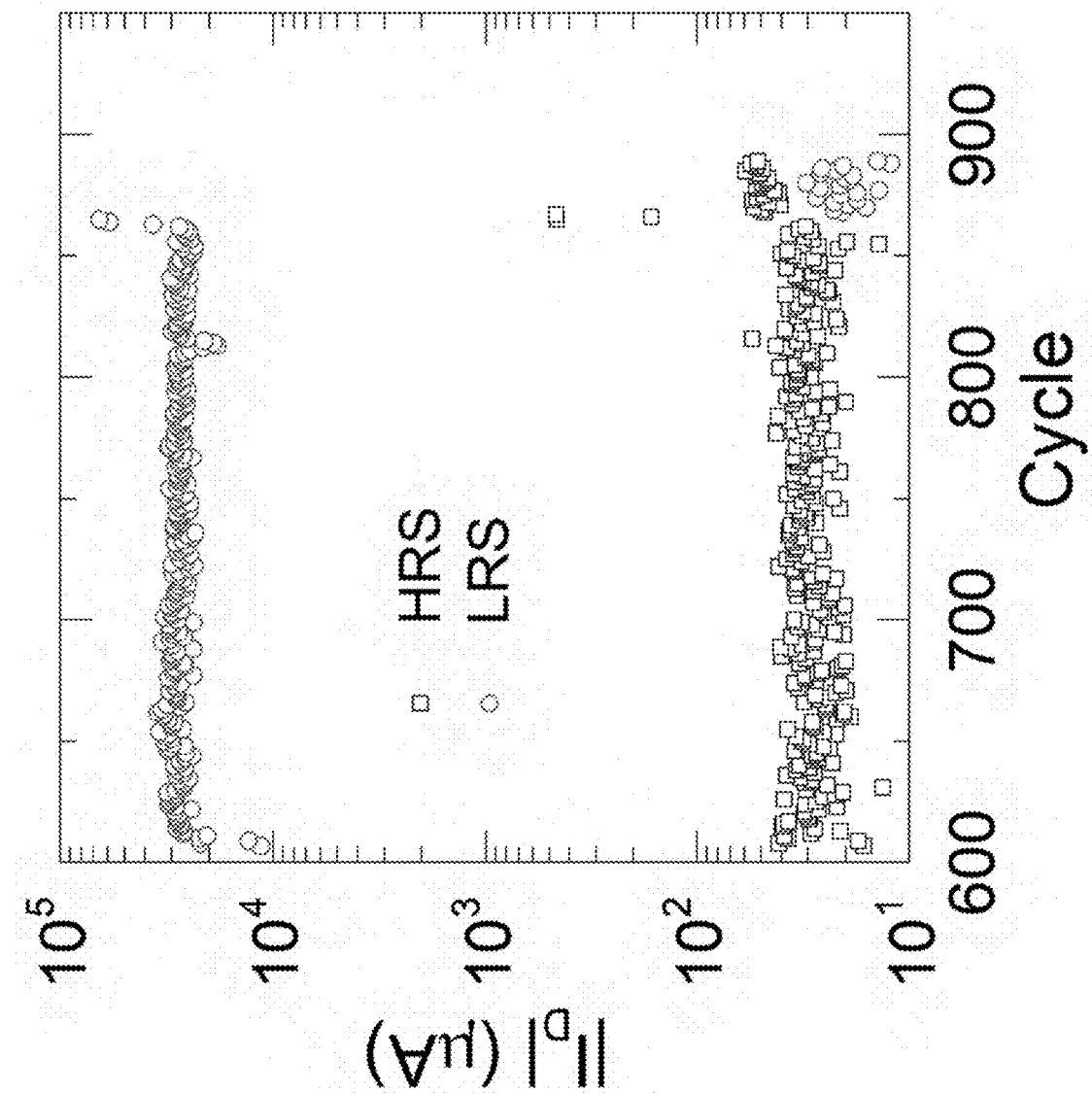
FIG. 13 shows endurance property of a memtransistor that was measured until breakdown at cycle number 868 (only cycles above 605 are shown). $I_D$ was extracted at $V_D=1$ V from full $I_D$-$V_D$ characteristics.
Figure 14:
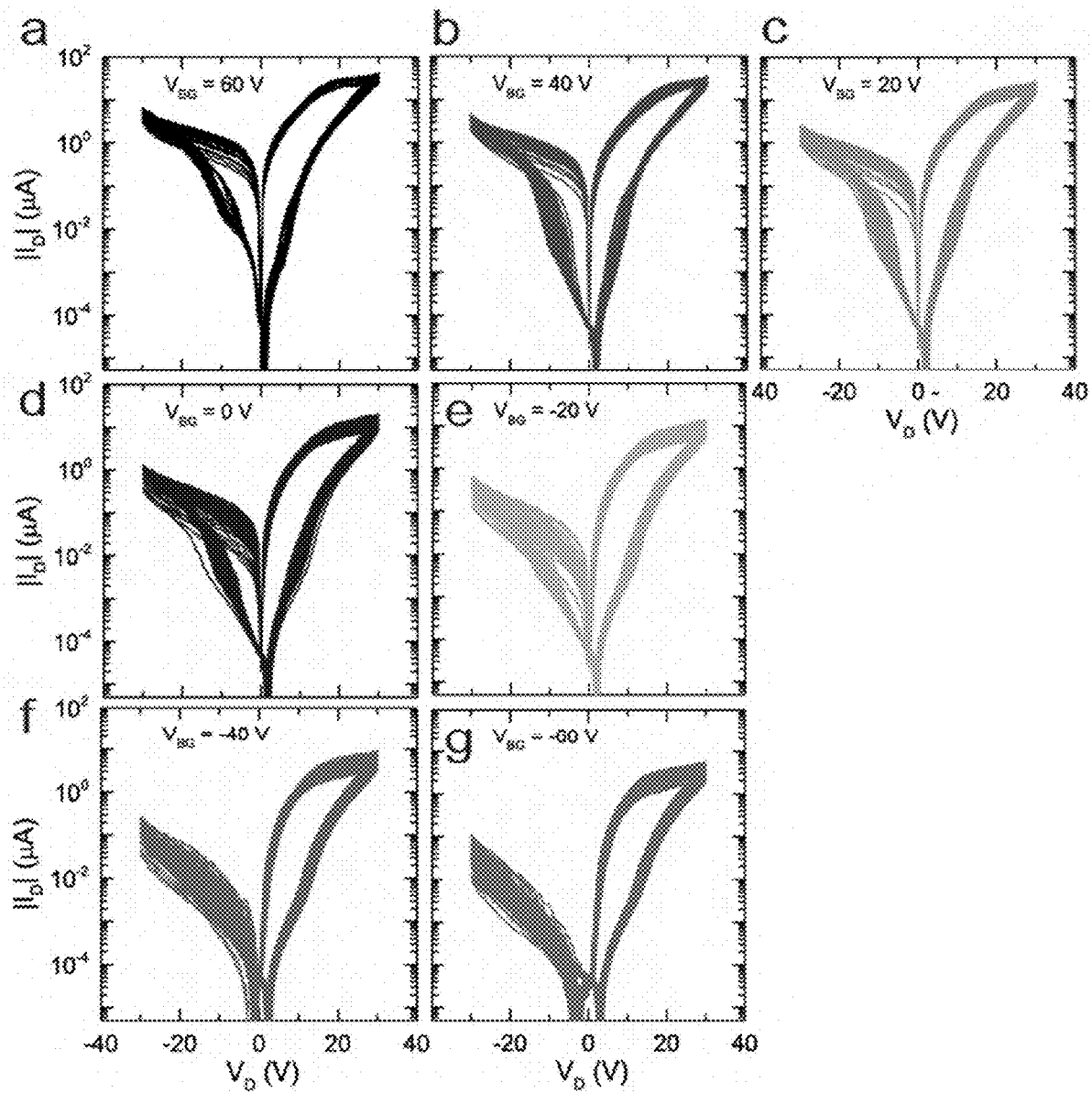
FIG. 14 shows endurance test of a dual-gated memtransistor at different values of $V_{BG}$: (panel a) 60 V; (panel b) 40 V; (panel c) 20 V; (panel d) 0 V; (panel e) $-20$ V; (panel f) $-40$ V; (panel g) $-60$ V. Each plot includes 62 sweep cycles, resulting in a total of 434 cycles. The same device was further used for the 250 cycle endurance test in FIG. 2A and the voltage pulse test in FIG. 7B.
Figure 15:
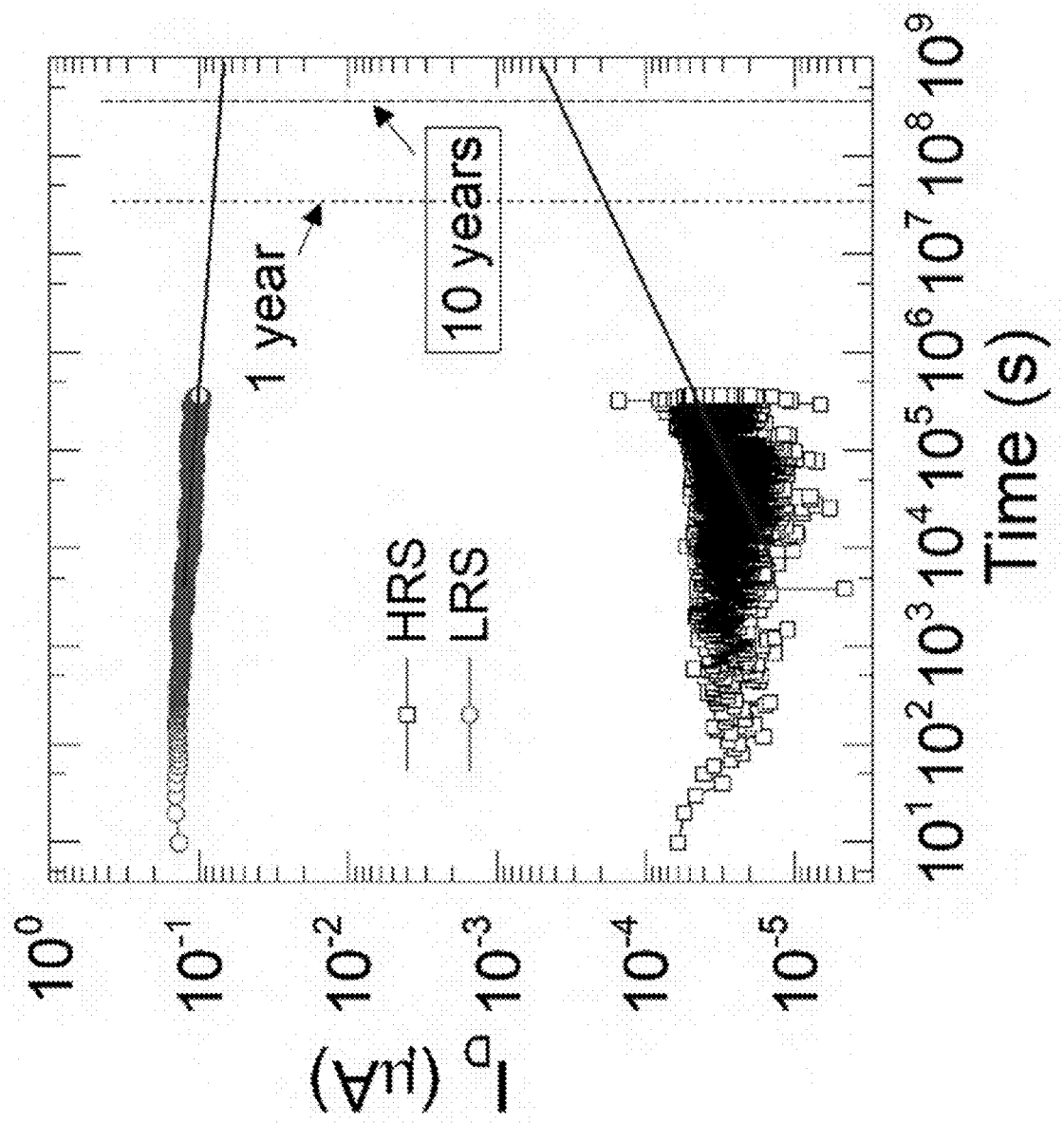
FIG. 15 shows a log-log plot of HRS and LRS current levels from FIG. 2B. The retention trend is extrapolated to show the non-volatility of the states. HRS current shows some variation in initial 100s seconds possibly because of the electroforming-free process and the fact that current (≈50 pA) is close to the instrumentation noise floor (10 pA).

The dual-gated MoS$_2$ memtransistors show excellent cycle-to-cycle endurance, as shown by the tight distribution of switching characteristics for 250 bias sweeps (FIG. 2A) and stable resistance values in HRS and LRS (FIG. 2B). I-V characteristics do not pass through $V_D$=$I_D$=0 in FIGS. 1D and 2A, and such non-zero-crossing can be explained by the presence of small mem-capacitive effect that shows pinched hysteresis loop in the charge-voltage plot, not in current-voltage plot. A small mem-capacitive effect is not surprising near metal contacts and it has also been shown previously in solution-processed MoS$_2$ memristors and single-gated memtransistors. Dual-gated memtransistors show the endurance of 100s of cycles, and FIG. 13 shows an example of a memtransistor that underwent a breakdown event at the 868$^{th}$ cycle. The limited endurance of current devices likely owes to the large biases (±30 V) approaching the breakdown voltages of the 30-nm-thick Al$_2$O$_3$ top-gate dielectric to achieve a high switching ratio (>10$^3$). Further improvement in endurance could be achieved by limiting the bias range while maintaining the switching ratio within the range that is acceptable for a desired neuromorphic application. Characterization of 54 memtransistors showed qualitatively similar behavior with low variability in switching ratio among the tested devices shown in FIGS. 5A-5D. The endurance of the same memtransistor at different $V_{BG}$ values ranging from 60 V to −60 V further shows minimal deviation for the intermediate resistance states that are accessible through bottom gate bias modulation (FIG. 14). Both the HRS and LRS states show long retention with extrapolated switching ratios over 10$^2$ on the timescale of years (FIGS. 2C and 15). Intermediate resistance states between HRS and LRS can also be achieved through voltage pulsing with similarly stable retention behavior (FIG. 2D). Note, a more accurate estimation of the intrinsic timescale of memory states could be made by temperature-dependent retention measurement extended over a few months, as done in a more mature technology of metal-oxide memristors. It should be noted that the utility of intermediate states in networks of memtransistors also relies on low device-to-device variability. However, dual-gated MoS$_2$ memtransistors have the advantage of fine-tuning the resistance states via gate bias pulses to offset variability in the long-term memory.

Figures 3A, 3B:
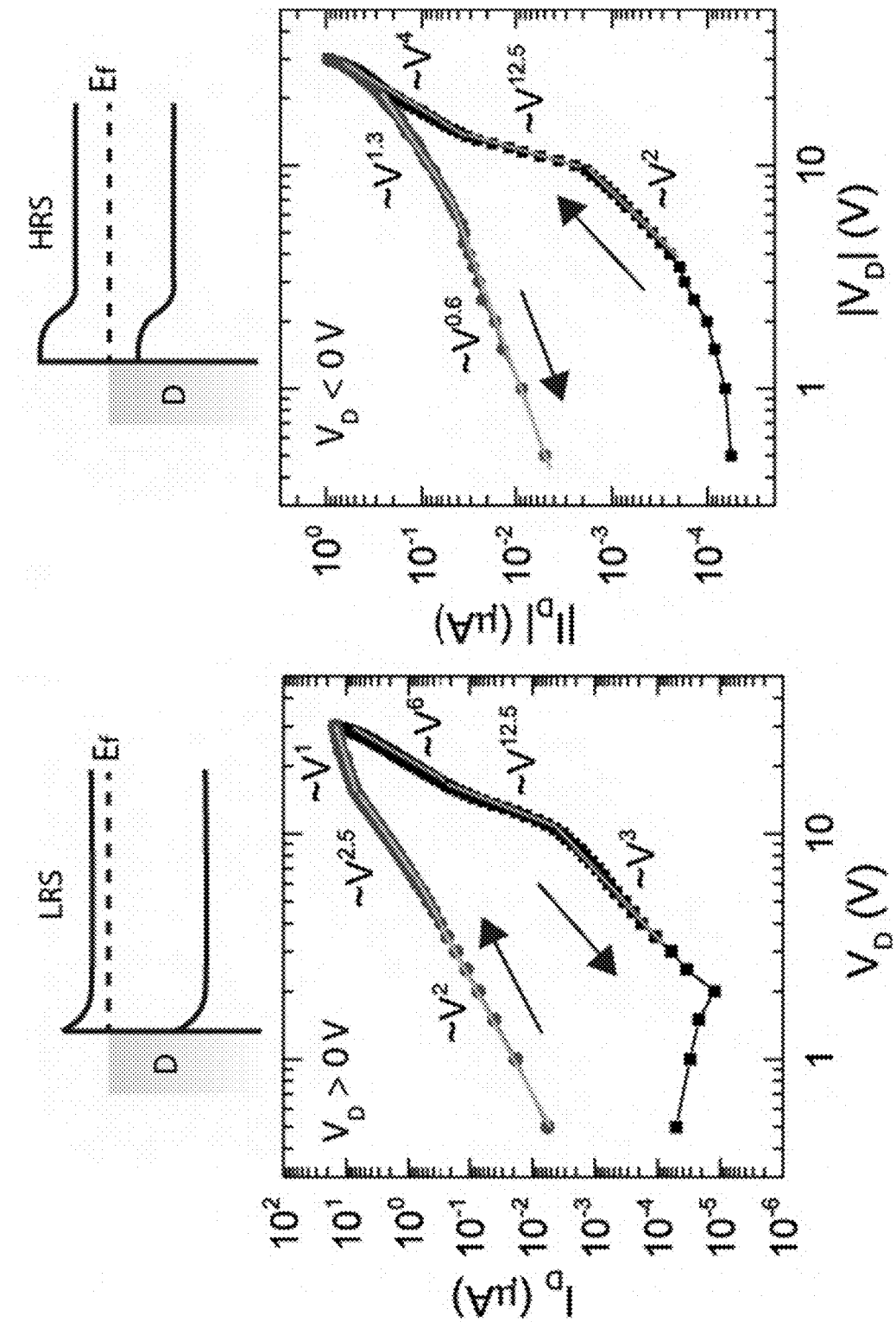
FIG. 3A shows (top panel) schematic diagram showing a Schottky contact and $MoS_2$ band-bending near the drain electrode in LRS, where $E_f$ is the Fermi energy level, and (bottom panel) log-log plot of $I_D$-$V_D$ characteristics of a dual-gated $MoS_2$ memtransistor in forward bias ($V_D>0$) showing different transport regimes during resistive switching between LRS and HRS ($V_{BG}=0$ V and $V_{TG}=0$ V). The power-law behavior ($I\sim V^m$) is shown at different segments of the curves.
FIG. 3B shows (top panel) schematic diagram showing the increased space-charge region near the drain electrode in HRS, and (bottom panel) log-log plot of absolute values of $I_D$ and $V_D$ of the same device in reverse bias ($V_D<0$) showing different transport regimes during resistive switching between HRS and LRS.
Figures 16A, 16B:
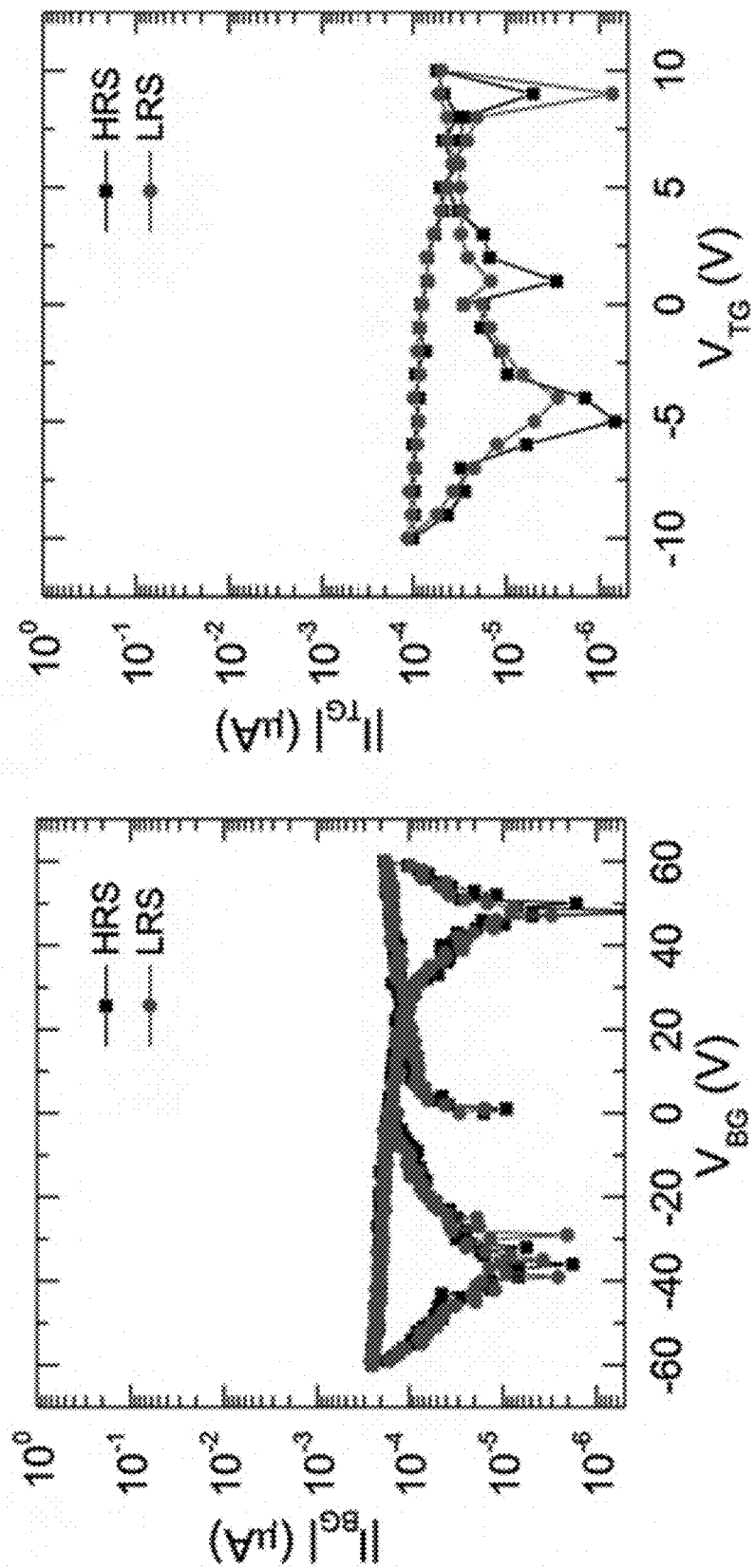
FIGS. 16A-16B show the gate leakage current versus the gate voltage of a dual-gated $MoS_2$ memtransistor, according to embodiments of the invention.

The potential switching mechanisms are discussed as follows. As previously mentioned, the clockwise switching direction and its inverted rectification polarity are consistent with dominant resistive switching at the drain electrode. Since the devices do not show gate leakage current (<0.2 nA) for HRS or LRS while sweeping either $V_{BG}$ or $V_{TG}$ after high-bias memtransistor measurements (FIGS. 16A-16B), dielectric breakdown and direct tunneling between the channel and gate electrodes can be ruled out during switching. However, a drain bias of 30 V could easily produce a sufficiently high electric field to inject electrons into the mid-gap states of the Al$_2$O$_3$ top dielectric that just above MoS$_2$ conduction band edge. To further elucidate the switching mechanism, it is noted that the dual-gated devices show distinct charge transport regimes (FIGS. 3A-3B) in contrast to the gradual changes in $I_D$ observed during switching of single-gated MoS$_2$ memtransistors. The distinct segments of the I-V curves exhibit well-defined power-law behavior (i.e., I∝V$^m$) with clear transition points (i.e., kinks) reminiscent of complex oxide memristors. Here, the absence of low-bias ohmic behavior (where m≈1) is explained by the non-zerocrossing behavior. An exponent m=2 can be explained by both space-charge-limited current (SCL without any traps or with a single shallow trap state, whereas an exponent m>2 corresponds to an exponential density of trap states as observed in $MoS_2$ transistors. Thus, the $I \propto V^2$ behavior transitions to a trap-filled limit (TFL) of $I \propto V^{12.5}$ at a high bias ($V_D \approx 10$ V at HRS during both SET and RESET processes), where the field is large enough to access deeper traps within $MoS_2$ or $Al_2O_3$ (FIGS. 3A-3B). Once most of the traps are filled, the transport resembles the trap-free case of Child's law such that the I-V characteristic reverts to a smaller value of m=4–6 at higher biases ($V_D$>15 V). This high bias asymmetry ($I \propto V^4$ in forward versus $I \propto V^6$ in reverse bias) suggests different kinetics of trap filling and emptying that is ultimately responsible for the memristive loop.

Clockwise switching results from resistive switching occurring at forward-biased Schottky contacts in dual-gated memtransistor. Growth of high-κ metal-oxide dielectrics is known to increase electron doping of $MoS_2$ (and other TMDCs) resulting in doping-induced lowering of the Schottky barrier height. Thus, devices start in an LRS and gradually switch to HRS through reversible changes near the drain contact for $V_D$>0 V and source contact for $V_D$<0 V. Indeed, SCLC and TFL currents during resistive switching in symmetric $Pt/TiO_2/Pt$ memristors are correlated with filamentary switching near the anode electrode (i.e., the drain electrode in memtransistor). The polarity of rectification (overall higher currents for $V_D$>0 V compared to $V_D$<0 V) contrasts that of a conventional Schottky transistor and single-gated memtransistor, suggesting current bottlenecks occurring at forward-biased contacts. Other two pieces of evidence of the dominance of opposite electrodes are (1) non-zero-crossing in $I_D$-$V_D$ characteristics occurs at $V_D$>0 V in dual-gated memtransistors as opposed to $V_D$<0 V in single-gated memtransistors (FIGS. 1D and 2A); (2) memristive switching ratio increases (decreases) with $V_{BG}$ in dual-gated (single-gated) memtransistors (FIG. 12).

Physically, the reversible changes near drain could include defect migration within $MoS_2$ or charge trapping in $MoS_2$ or $Al_2O_3$ as they all could contribute to the TFL transport regimes (We do not attempt to distinguish between the two potential mechanisms in this work). Indeed, ALD-grown amorphous $Al_xO_y$ has been shown to have mid-gap states slightly above the $MoS_2$ conduction band and is accessible for trapping at relatively low biases. Thermally assisted charge trapping in oxide has also been shown to induce non-volatile memory effects. On the other hand, recent computational work on $MoS_2$ memtransistors also predicts that the diffusion barrier of sulfur vacancies in $MoS_2$ can be as low as 0.68 eV, resulting in a significant hopping rate (>$10^2$ $s^{-1}$) that increases rapidly with increasing temperature. Local Auger electron spectroscopy of $MoS_2$ memristors demonstrated decreased sulfur content near contacts during switching. The net outcome is a significant space-charge region near the drain contact that induces band-bending in $MoS_2$ at zero drain bias, ultimately resulting in non-volatile memristive switching, as shown in FIGS. 3A-3B.

Gate-Tunable Plasticity

Figure 4A:
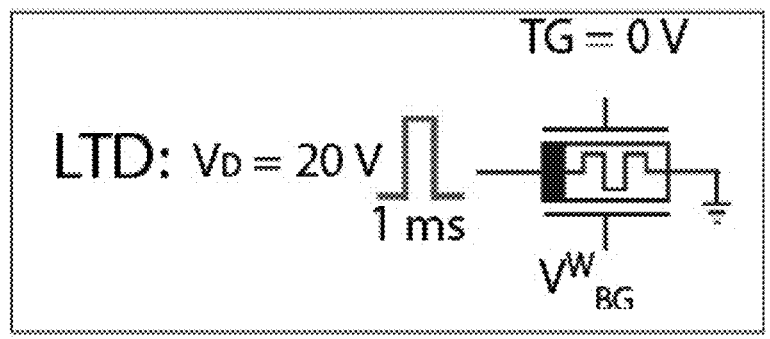
FIGS. 4A-4F show tunable long-term potentiation and depression of $MoS_2$ dual-gated memtransistors, according to embodiments of the invention.
Figure 4B:
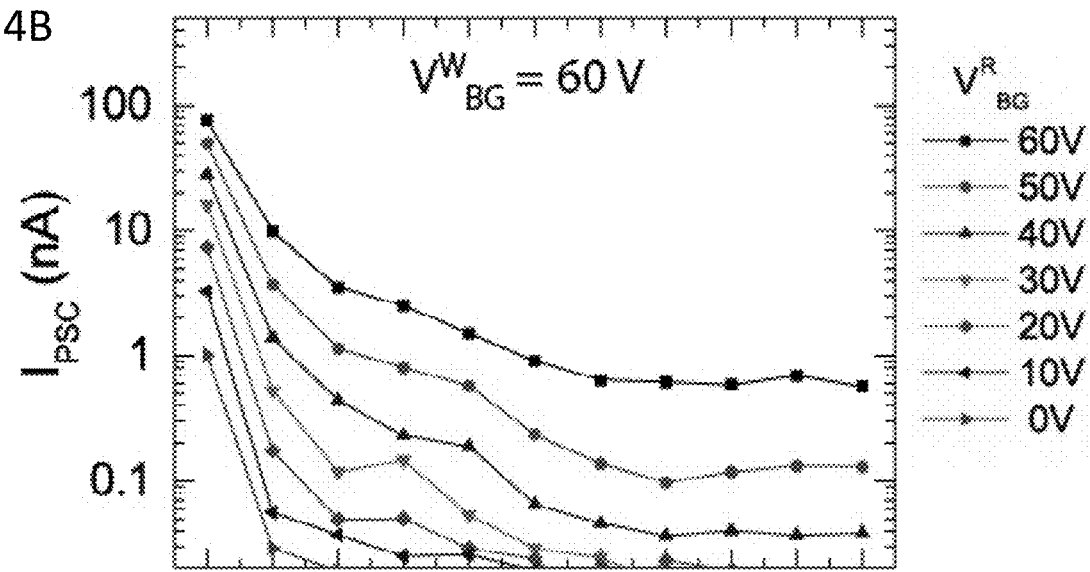
Figure 4C:
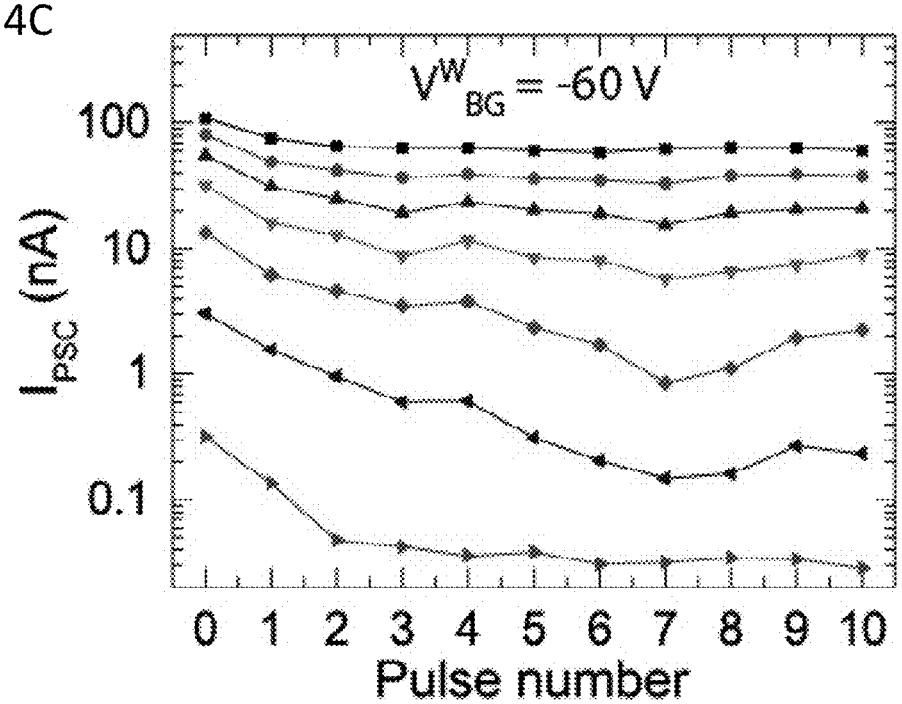

In biological systems, the synaptic connections between neurons are strengthened through repeated firing, and similar concepts are used to train spiking neural networks. However, it is also understood that modulatory terminals in biological systems further control the synaptic connections. Similarly, the two gate terminals in dual-gated memtransistors provide electrostatic control over synaptic learning behavior. As shown in FIGS. 4A-4F, tunable learning is achieved in long-term potentiation (LTP) and long-term depression (LTD) for dual-gated memtransistors, where $V_D$ pulses of 1 ms period are applied and the post-synaptic current ($I_{PSC}$=$I_D$) is measured between pulses. For simplicity, the top gate is grounded in all measurements, while the bottom gate voltage is controlled during the reading and writing operations (In principle, these roles of the bottom and top gates can be reversed). As expected from the direction of switching (FIG. 1D), positive $V_D$ pulses induce LTD and negative $V_D$ pulses induce LTP. For LTD, the memtransistor is subjected to $V_D$ pulses (20 V) at different $V_{BG}$ writing voltages $V^W_{BG}$, and the changed resistance states are probed at a low bias ($V_D$=1 V) at different $V_{BG}$ reading voltages $V^R_{BG}$ (FIG. 4A). FIGS. 4B-4C show two writing operations at $V^W_{BG}$=60 V and −60 V, respectively, where each state was further read at a different $V^R_{BG}$ ranging from 60 V to 0 V. For $V^W_{BG}$=$V^R_{BG}$=60 V, $I_{PSC}$ is reduced by ≈100-fold in just 10 pulses (FIG. 4B). In contrast, for $V^W_{BG}$=−60 V and $V^R_{BG}$=60 V, $I_{PSC}$ decreases only by a factor of two for the same number of pulses. It is noted that a slower learning rate for negative $V^W_{BG}$ shown in FIG. 4C is opposite to what one would expect from the previous single-gated memtransistors that shows a larger switching ratio at negative $V_{BG}$ values. Dual-gated memtransistor shows the opposite trend—a smaller switching ratio at negative $V_{BG}$ values (FIGS. 1D and 12), and overall ON and OFF currents are lower for negative $V_{BG}$ values. A smaller current and limited resistive switching during negative $V^W_{BG}$ pulses are expected to induce a smaller degree of defect rearrangement near the drain contact, resulting in slower learning behavior. Thus, initial current values are comparable in FIG. 4C-4D due to the same $V^R_{BG}$ values, but they evolve differently with pulses due to different $V^W_{BG}$ values.

Figure 4D:
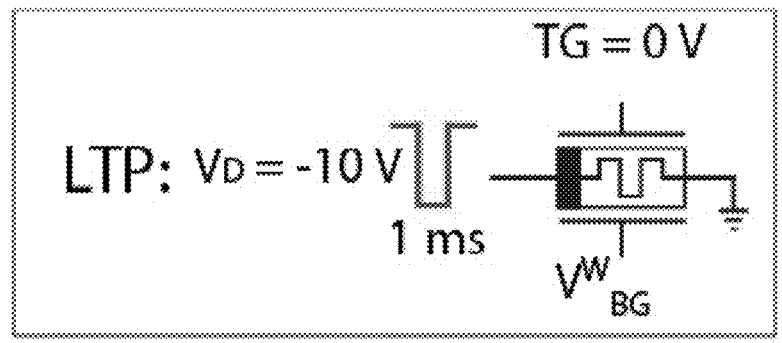
Figure 4E:
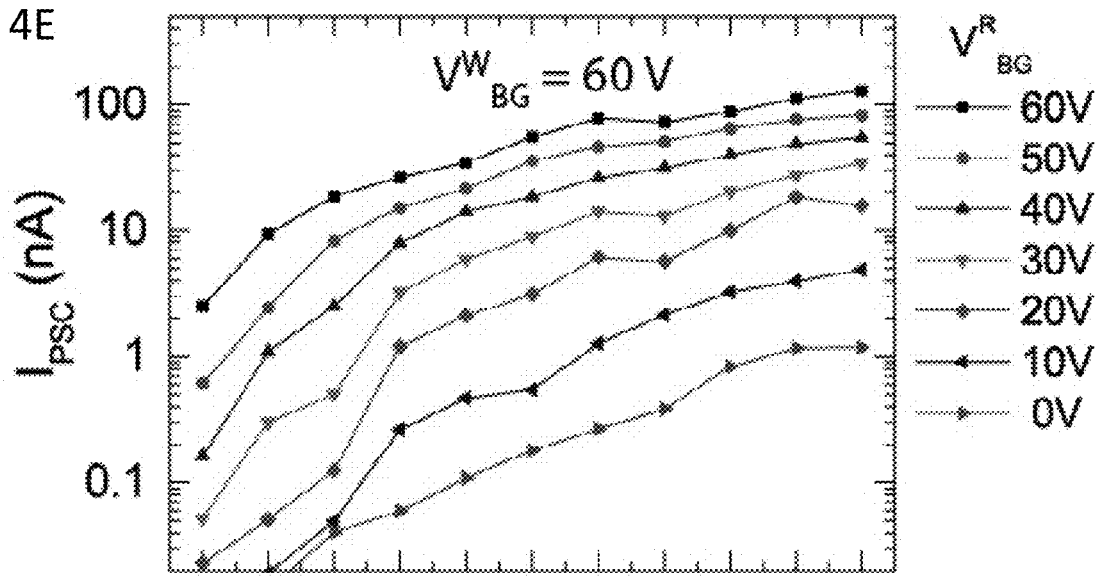
Figure 4F:
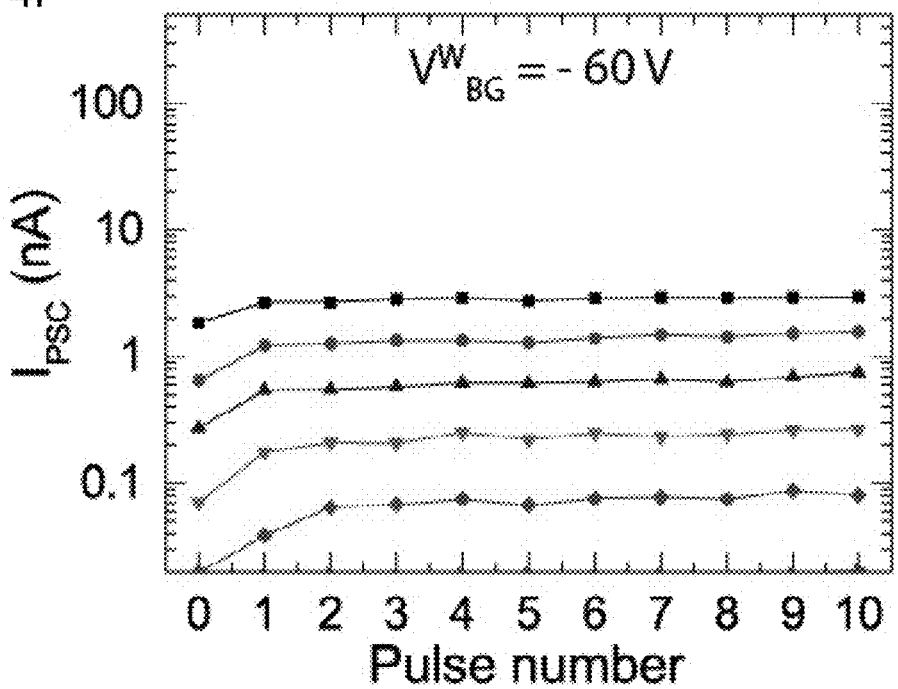

Similar tunable learning is achieved in LTP using 10 pulses of $V_D$=−10 V (FIG. 4D). The devices show a ≈100-fold increase in $I_{PSC}$ for $V^W_{BG}$=$V^R_{BG}$=60 V, and only a two-fold increase for $V^W_{BG}$=−60 V and $V^R_{BG}$=60 V. Thus, LTP effectively regains the original synaptic strength before LTD operation for a comparable number of pulses. The learning rate changes monotonically with decreasing $V^W_{BG}$ as shown by the intermediate cases with $V^W_{BG}$=0 V (FIGS. 17A-17B). Reading at different $V^R_{BG}$ changes the absolute $I_{PSC}$ values, but the overall learning rates are not affected significantly as shown by the exponential fits in FIGS. 17C-17D, where the characteristic decay and growth rates remain approximately constant. A smaller magnitude $V_D$ pulse is needed for writing in LTP (−10 V) than LTD (20 V) due to the asymmetric $I_D$-$V_D$ characteristics of memtransistors, as shown in FIG. 1D.

It is emphasized that reading the resistance state at different $V^R_{BG}$ values does not change the intrinsic non-volatile resistance of the device, as expected from the lack of hysteresis in the $I_D$-$V_{BG}$ characteristics (FIG. 1D). This decoupling of reading and writing operations is one of the key advantages of dual-gated memtransistors since the non-volatile memristive states remain unperturbed by $V^R_{BG}$ during the reading operations. However, the total device current can still be modulated by the gate biases during reading by modulating the resistance of the transistor response of the memtransistor. The energy consumption for learning steps shown in FIGS. 4A-4F is in the range of 2 pJ to 2 nJ per operation for $V^W_{BG}$=−60 to 60 V. In conventional crossbar arrays, the energy consumption scales with crossbar array size due to sneak current issues. In contrast, dual-gated memtransistor crossbar arrays are expected to minimize this excess energy consumption by minimizing sneak currents, providing another key advantage over conventional architectures. A multi-level memory effect is also demonstrated by the retention behavior of 10 distinct intermediate resistance states during an LTD operation (FIG. 2D), which show qualitatively similar retention behavior as the LRS and FIRS states in FIG. 2C. All learning demonstrations were performed with 1 ms pulses since the speed of the memtransistors is expected to be limited by the parasitic capacitance from the global bottom gate and large metal pads used for probing (RC time constant>10 μs). Here, global bottom gates are readily obtained from direct growth of $MoS_2$ on oxidized Si wafers, but the bottom gates could also be pre-patterned by exploiting transfer methods for $MoS_2$, thus providing a pathway to higher operating speeds.

Minimizing Sneak Currents

Compared to the lateral geometry of memtransistors, an apparent advantage of conventional vertical memristors is their small footprint in crossbar arrays. However, accessing individual nodes in memristor-based crossbars is a challenging task due to sneak currents, and thus the small footprint is typically compromised by at least one additional circuit element at each node. The integration of a Schottky diode or a threshold switch directly with a memristor (i.e., the one-selector-one-memristor 1S1M approach) can achieve sufficiently high non-linearity at low biases for effective addressing in small crossbar arrays through customized reduced-voltage pulsing schemes (e.g., V/2 or V/3 schemes). However, regardless of non-linearity quality, the sneak current through neighboring nodes increases with increasing crossbar size for the 1S1M approach, compromising the energy efficiency and access time. Consequently, one-transistor-one-memristor (1T1M) structures are preferred since the sneak current is much lower and does not scale with crossbar size. Nevertheless, since memristive components in 1T1M are still limited to two terminals, tunable learning response has not yet been achieved, thus motivating efforts to integrate dual-gated memtransistors into crossbar arrays.

Figure 5A:
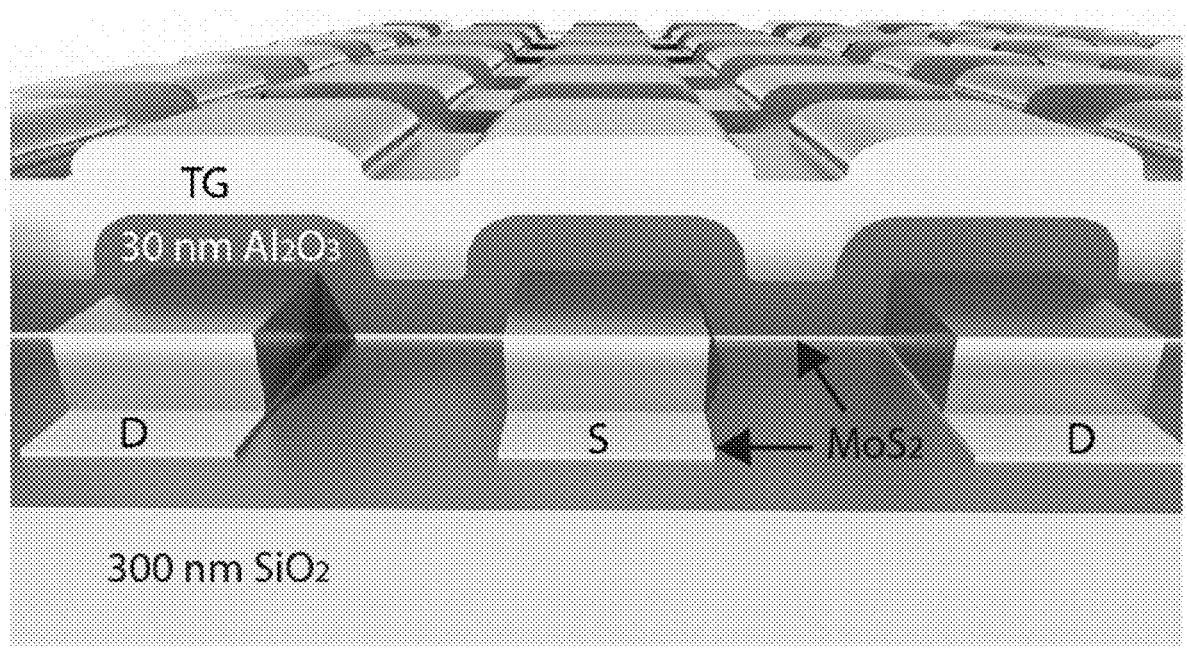
FIGS. 5A-5E show the architecture of the dual-gated $MoS_2$ memtransistor crossbar array, according to embodiments of the invention.
Figure 5B:
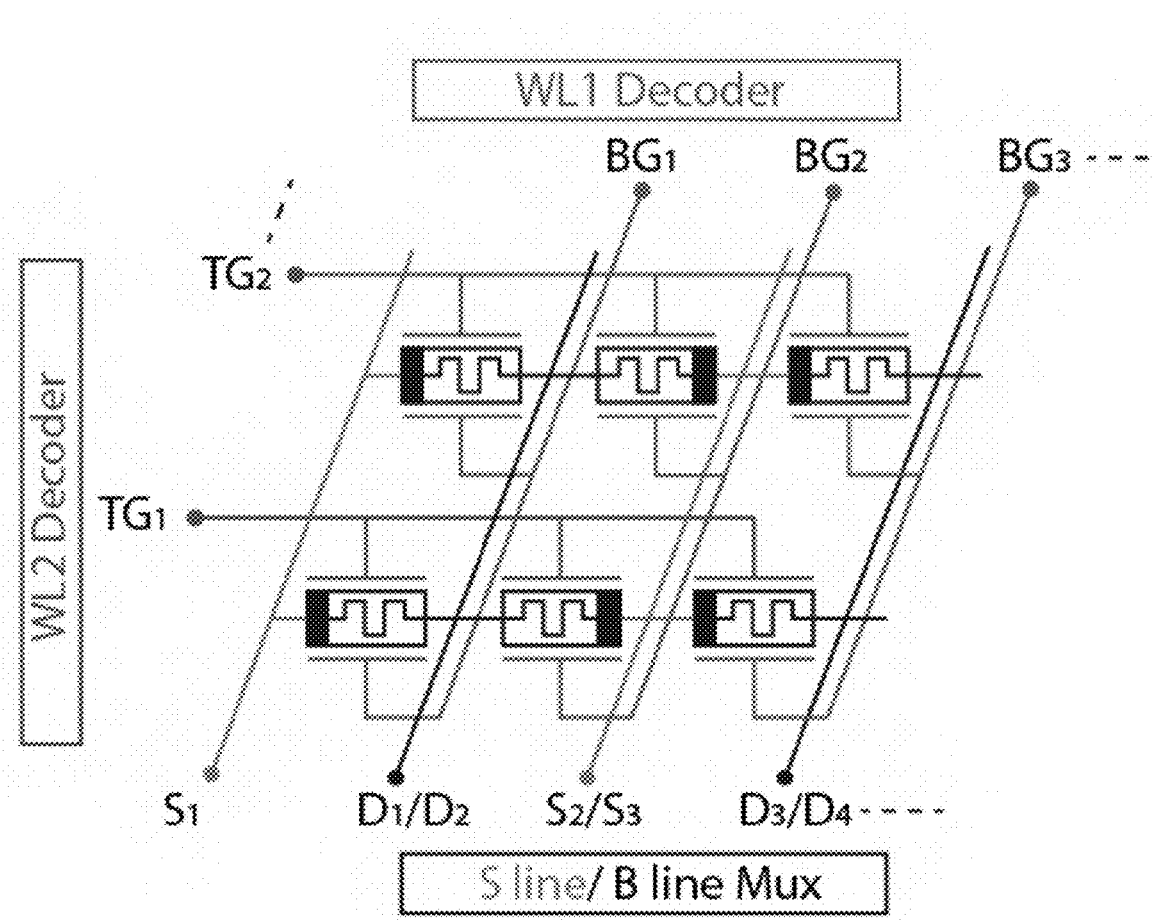
Figures 5C, 5D:
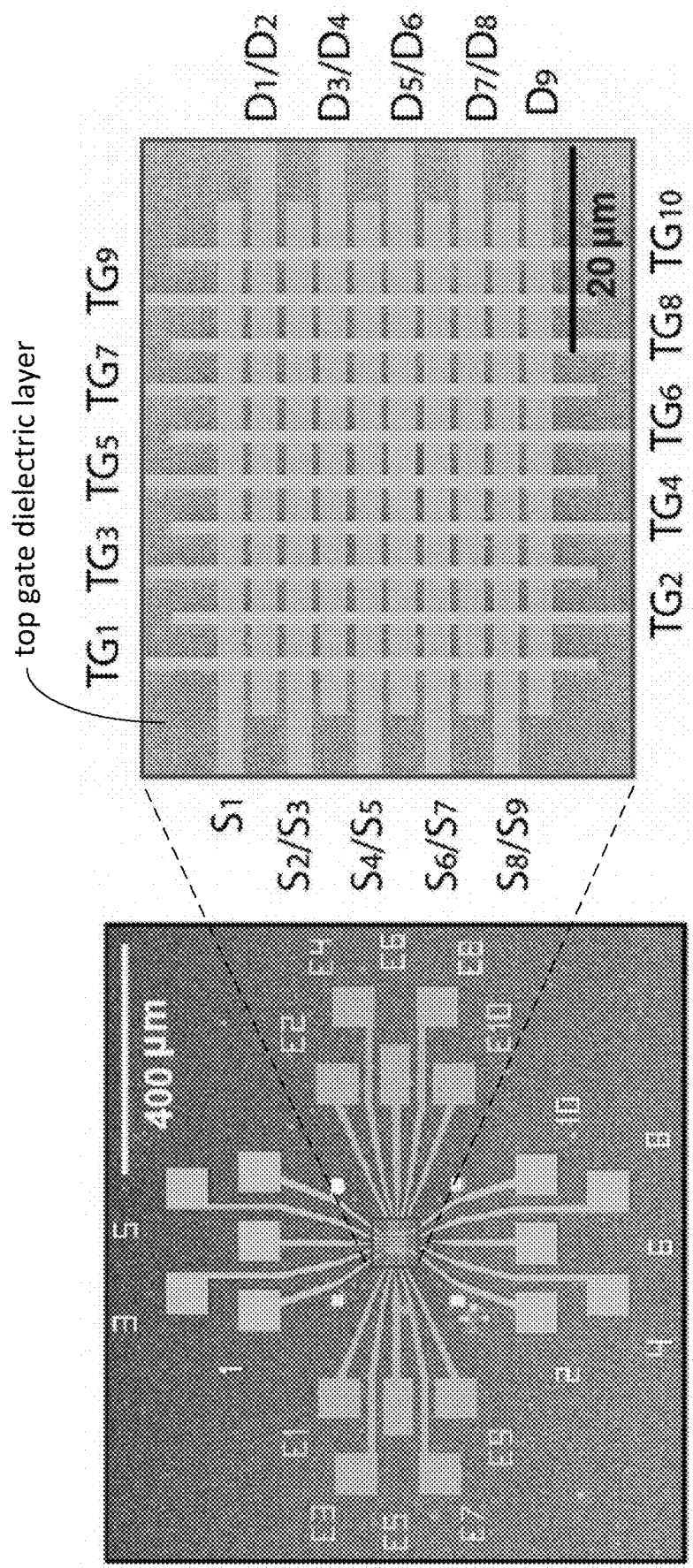
Figure 5E:
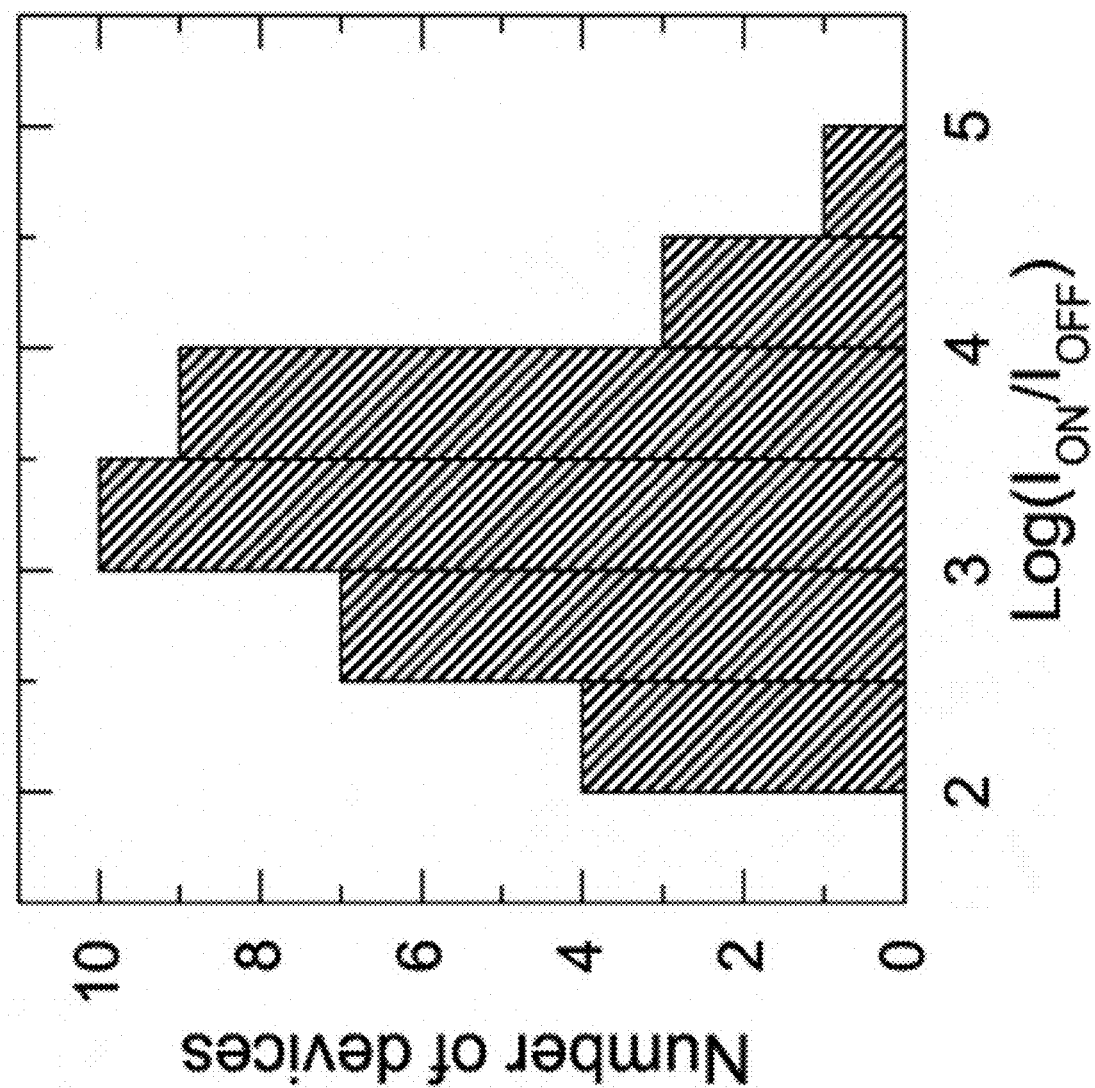

For dual-gated memtransistor crossbar fabrication, drain bit and source lines (electrode width≈3 μm, interline gap≈0.9 μm) were patterned on $MoS_2$ followed by etching of $MoS_2$ channels (L≈0.9 μm, W≈0.7 μm) (FIG. 10). A 30 nm thick $Al_2O_3$ dielectric layer was then grown by ALD. The top gate word lines (width≈1.3 μm) were fabricated in the transverse direction to overlap the $MoS_2$ channels that define the nodes in a 10×9 (column, row) crossbar array, as shown in FIGS. 5A-5D, with the underlying Si substrate serving as a global bottom gate. Additionally, 1×9 crossbar arrays was also fabricated for the rapid testing of dual-gated memristors with the same channel dimensions of 0.9 μm×0.7 μm, as shown in FIG. 10. A histogram from 34 memtransistors shows a mean switching ratio exceeding $10^3$ with more than 90% of the devices showing a switching ratio larger than 500 (FIG. 5E). While thickness variation in the CVD $MoS_2$ film (FIG. 9B) can contribute to device-to-device variability, its effect can be mitigated through further optimization of uniformity in $MoS_2$ monolayer growth.

Figure 6B:
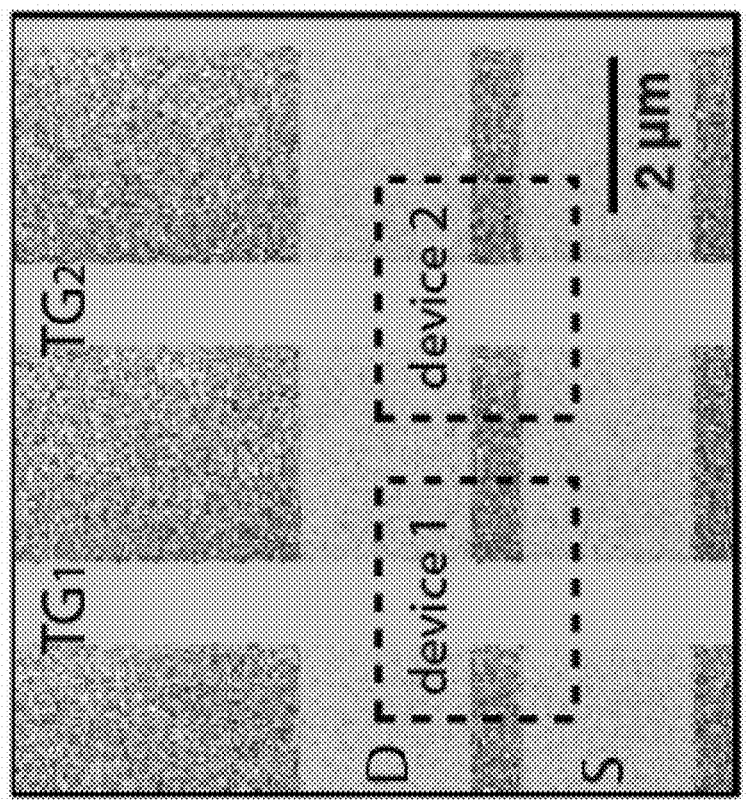
FIGS. 6A-6D show disturbance test and sneak current characteristics of the dual-gated $MoS_2$ memtransistor crossbar array, according to embodiments of the invention.
Figure 6A:
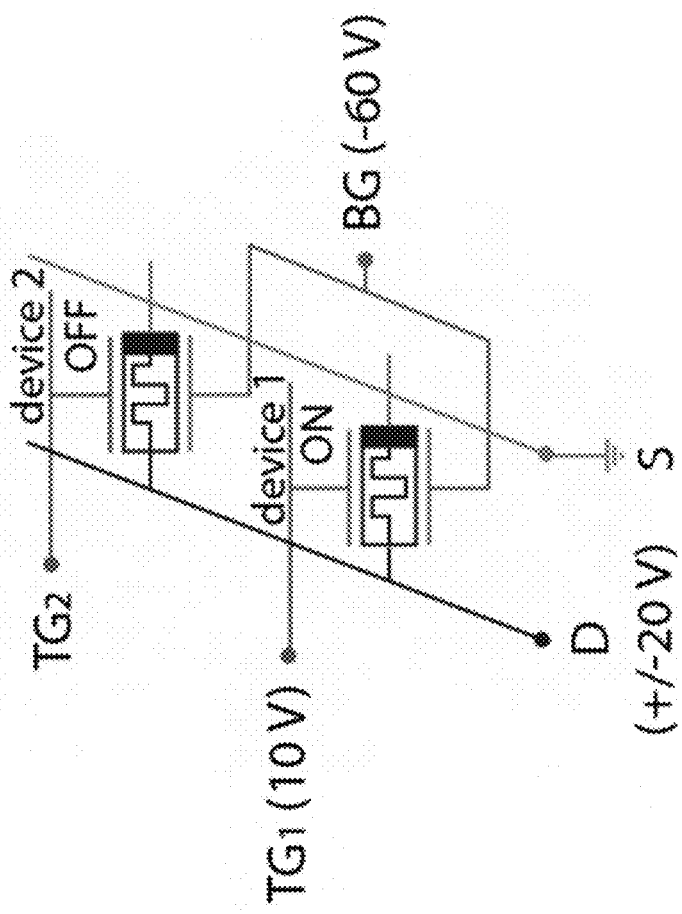
Figure 6D:
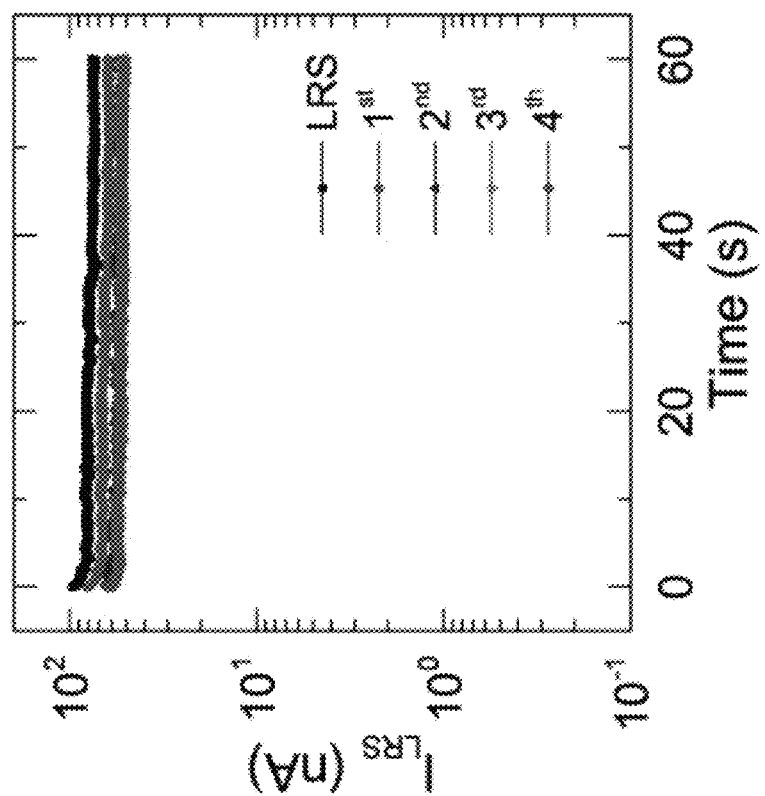
Figure 6C:
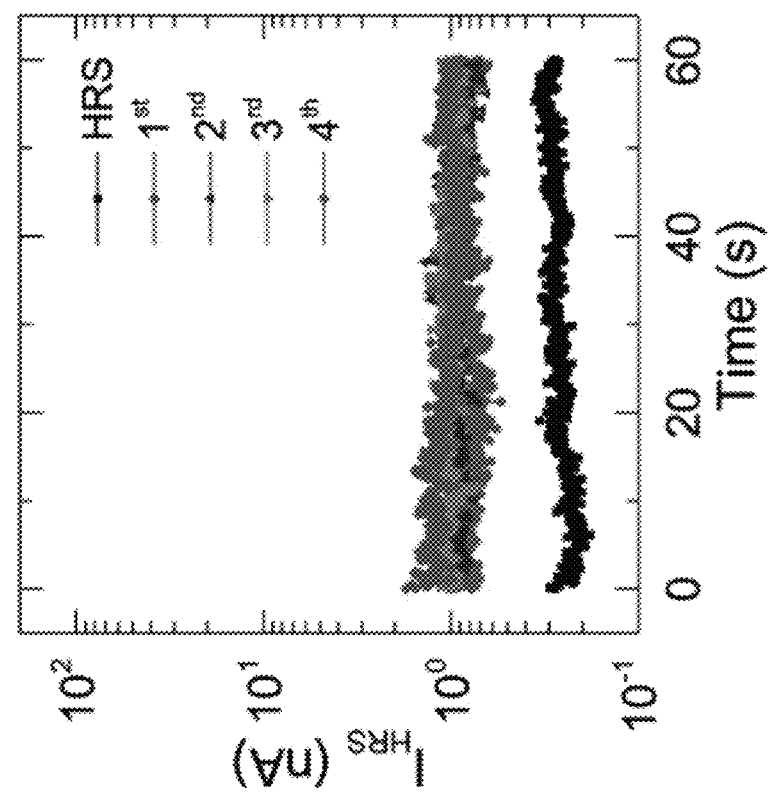
Figure 18A:
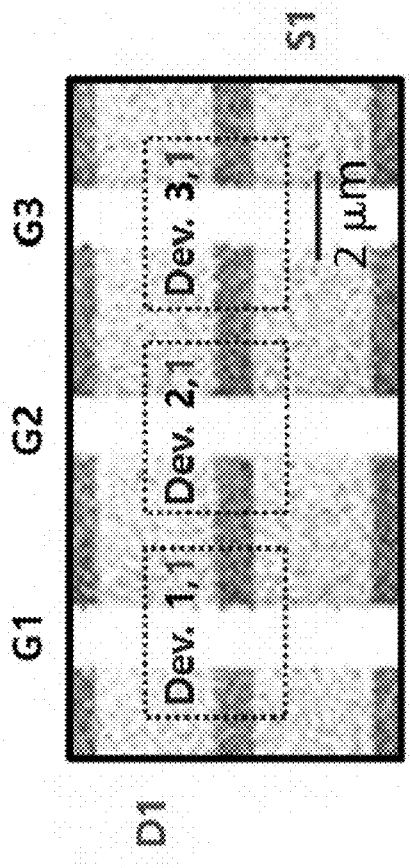
FIG. 18A shows an SEM image of the devices (1,1), (2,1) and (3,1) used in the disturbance test, according to embodiments of the invention.
Figure 18B:
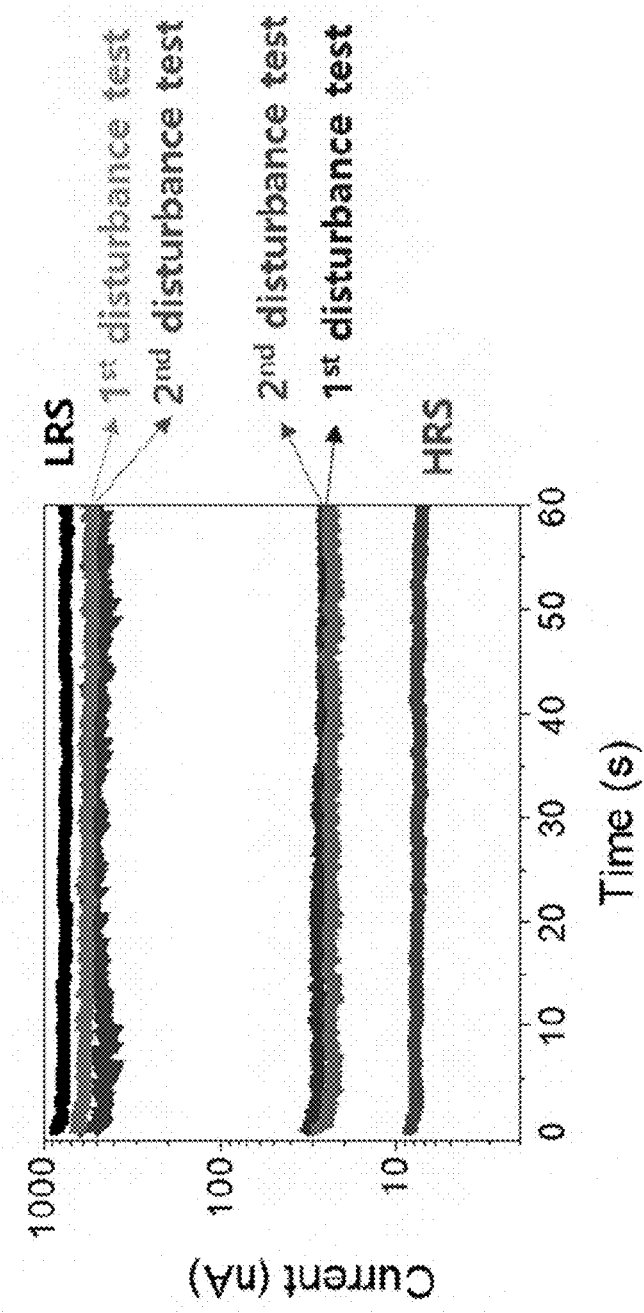
FIG. 18B shows resistance changes of HRS and LRS of the selected device (1,1) with respect to time (reading conditions, $V_D$=1 V, $V_{TG1}$=5 V), respectively, after $1^{st}$, $2^{nd}$ switching events at the device (1,3). The biasing conditions are the same as FIGS. 6A-6D.

A disturbance test of the crossbar array was conducted at $V_{BG}$=−60 V, which minimizes the read currents in all of the memtransistors (<10 pA, instrument noise floor) except for devices under the selected top gate line ($V_{TG}$=10 V). During this test, all other top gate word lines are grounded. A $V_D$ pulse of 20 V or −20 V is then applied to the selected drain bit line to switch the device labeled as 'device 1' in shown FIGS. 6A-6B into HRS or LRS, respectively (FIG. 6A-6B). Even though all memtransistors in the selected bit line receive the same $V_D$ pulse, only device 1 experiences the learning response at $V_{BG}$=−60 V. This result is confirmed in a subsequent disturbance test where the device labeled as 'device 2' shown in FIGS. 6A-6B was selected by the top gate word line 2, and HRS and LRS switching was performed by $V_D$ pulses. Following four-fold LRS switching of device 2, HRS of device 1 was again read at a low drain bias ($V_D$=1 V), which revealed that the current in HRS was essentially unchanged other than a small initial change in resistance after the first test, as shown in FIG. 6C. Similarly, LRS of device 1 was also unaffected by HRS switching of device 2, as shown in FIG. 6D. The test can be extended to next nearest neighbor device showing a similar relative change in the device current after disturbance pulses even though absolute current values differ from device to device (FIG. 18). Together, these two tests verify that device 1 and device 2 can be written and read independently, and thus dual-gated memtransistors circumvent the sneak current issue of conventional memristor-based crossbar arrays. In summary, the application of $V_{BG}$=−60 V suppresses the read currents through the field-effect transistor response of the memtransistor without changing the non-volatile memristive resistance states of the memtransistors in the crossbar array. This isolation of non-volatile states and read currents without additional elements at each node is the enabling advantage of dual-gated memtransistors for crossbar operation in contrast to conventional memristors or synaptic transistors.

Figure 19C:
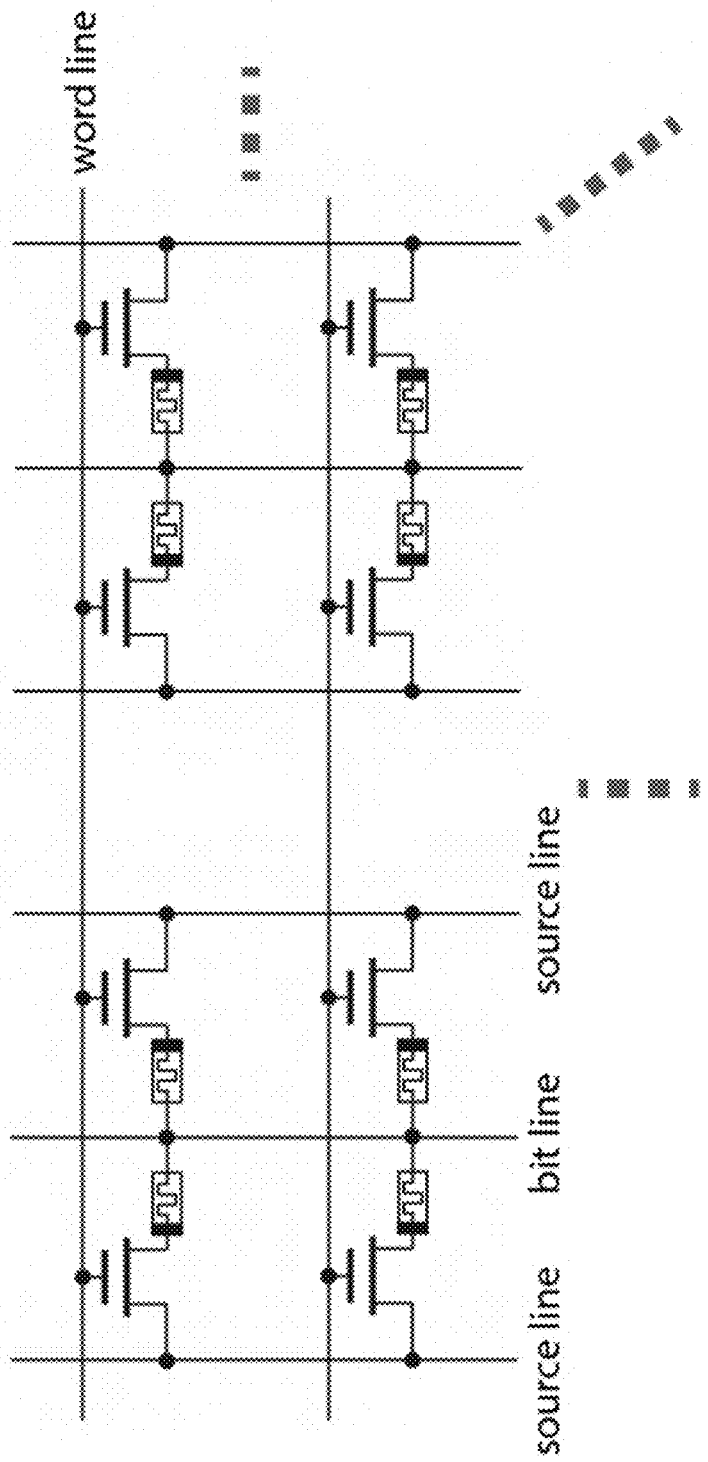
Figure 19D:
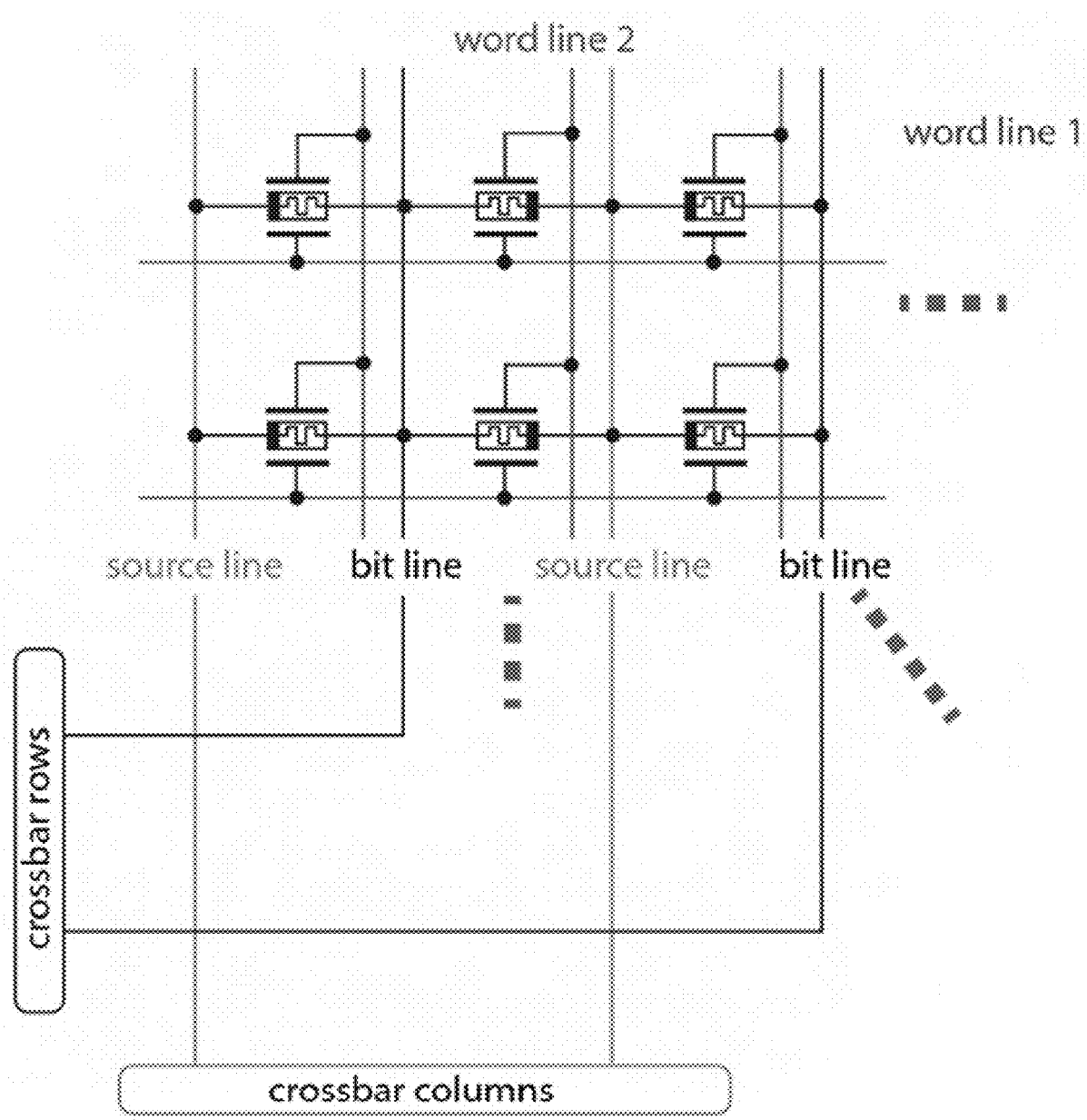

To highlight broader implications, the dual-gated memtransistor crossbar arrays is compared with conventional 1T1M architectures, as outlined in FIGS. 19A-19D. The simplest 1T1M architecture has dedicated source lines, bit lines, and word lines for each node (FIG. 19A). The conventional 1T1M architecture is different from ReRAM passive crossbar arrays (with or without selectors) where voltage and current lines fan-out orthogonally. Alternatively, bit lines can be rotated by 90 degrees to minimize the sneak current in pseudo-crossbar arrays (FIG. 19B). The bit lines can also be shared by neighboring 1T1M nodes to increase areal density. On the other hand, in a M×N dual-gated memtransistor crossbar array, the source line ($S_i$) and bit line (drain electrode, $D_i$) can be shared by the neighboring memtransistors in columns i/i+1 and i+1/i+2, respectively, (except when i=1, M), since neighboring columns can be further isolated by the bottom gate (word line 2) that runs orthogonal to the top gate (word line 1) (FIGS. 6B and 19D). The key novelty is that monolayer $MoS_2$ memtransistors allow dual gates that can be fabricated on both sides, resulting in the overall bit and source line density being reduced by approximately a factor of two compared to the 1T1M architecture in FIG. 19A. The scaling argument for conventional two-terminal memristor replies on the nanometer-scale thickness of vertical channel. In contrast, lateral channels are commonly considered antithetical to similar scaling length. However, atomically thin channels allow better electrostatic control compared to bulk semiconductors and in principle nanometer-scale gate lengths are possible. Two additional gate lines occupy space in different layers, thus dual-gating itself is not expected to compromise scaling limits of 2D materials. Furthermore, dual gates are essential to concurrently achieving tunable learning and low sneak currents. Previous single-gated memtransistors could not achieve both of these functions in crossbar arrays. Moreover, monolayer $MoS_2$ can achieve extremely low OFF currents below the instrumentation noise floor, which intrinsically minimizes parasitic power consumption in large crossbar arrays. By employing other best practices from $MoS_2$ transistors such as the replacement of metal lines with van der Waals metals or graphene, additional improvements in dual-gated MoS$_2$ memtransistor performance can be expected as these devices are pushed to their scaling limits. Finally, since the gate lines completely overlap source and drain electrodes the leakage current may increase in larger crossbar arrays. This can be avoided by a simple variation in processing steps. An additional metal-oxide insulation layer can be deposited on top of the source/drain electrodes after the metallization step but before the liftoff step, as done in the self-aligned heterojunction transistors. The additional insulation layer would only cover the metal lines and top gate dielectric thickness is still controlled by ALD, thus, minimizing leakage in larger crossbar arrays.

Artificial Neural Network Demonstration

In some embodiments, the gate tunability is utilized to achieve a linear and symmetric synaptic response, which provides clear benefits in the training of ANNs. Training of neural networks based on memristive synapses can be limited by non-linear and asymmetric learning behaviors despite their relative roles in different learning algorithms. In conventional neuromorphic learning algorithms, linear and symmetric weight update rules not only enable higher accuracy in classification tasks but can also simplify the training process by enabling blind update protocols. Several approaches have been previously employed to improve the linearity and symmetry of two-terminal memristors, including modifying pulse writing schemes in organic electrochemical transistors, designing multi-layer floating gates in MoS$_2$ synaptic transistors, controlling filament saturation in epitaxial SiGe memristors, and using an additional tunnel barrier or different contact metals in metal-oxide memristors. Broadly, these approaches either modify the device materials in a manner that introduces other device performance tradeoffs or require changes to the pulsing protocol that complicates time-domain multiplexing during training.

In contrast, dual-gated memtransistors improve linearity and symmetry in long-term plasticity via independent access of the gate and drain electrodes during writing and reading operations. To gauge the performance of these devices in a network computation, the supervised learning of a multi-layer perceptron (MLP) ANN trained in the recognition of handwritten digits using the MNIST dataset (FIG. 7A) is simulated. The first layer of the MLP is composed of an input layer with 28×28 (784) input neurons, where each input neuron corresponds to a pixel in the input images. These input neurons are fully connected to the subsequent hidden layer of 300 neurons that utilize a bias neuron and the ReLU activation function. The final layer of ten output neurons (fully connected to this hidden layer) is used to classify each of the ten possible digits in the MNIST data set during training and testing. Training is performed using all 60,000 training images from the MNIST data set for 100 epochs (i.e., 6 million training images) in a randomized order using backpropagation with gradient descent. The recognition rate (i.e., the accuracy of classification) is calculated after every epoch of training using all 10,000 testing images from the MNIST data set to assess the performance of the ANN.

Figure 7A:
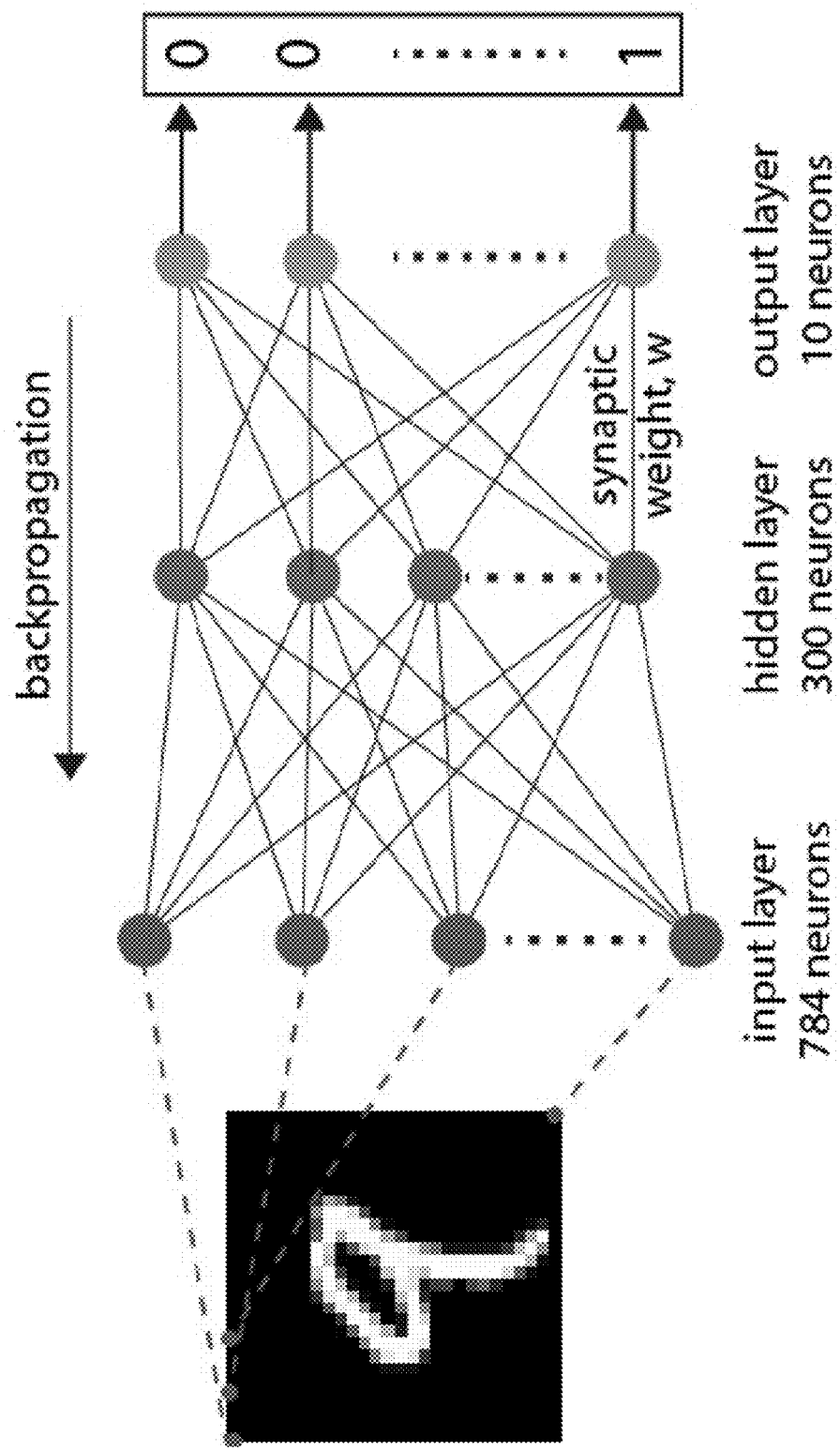
FIGS. 7A-7D show an application of the linear and symmetric synaptic response of dual-gated $MoS_2$ memtransistors in a simulated ANN, according to embodiments of the invention.
Figure 7B:
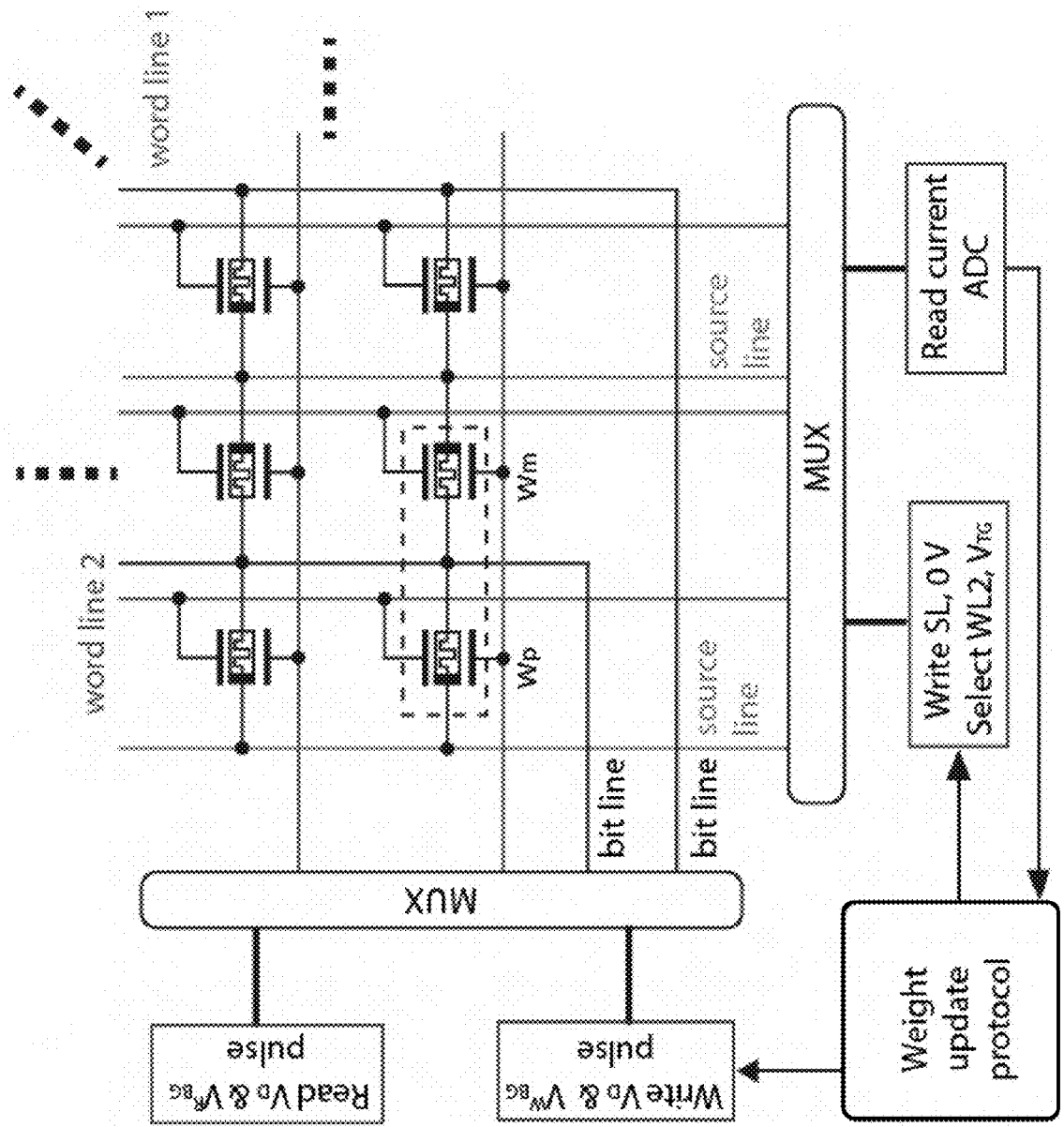
Figure 7D:
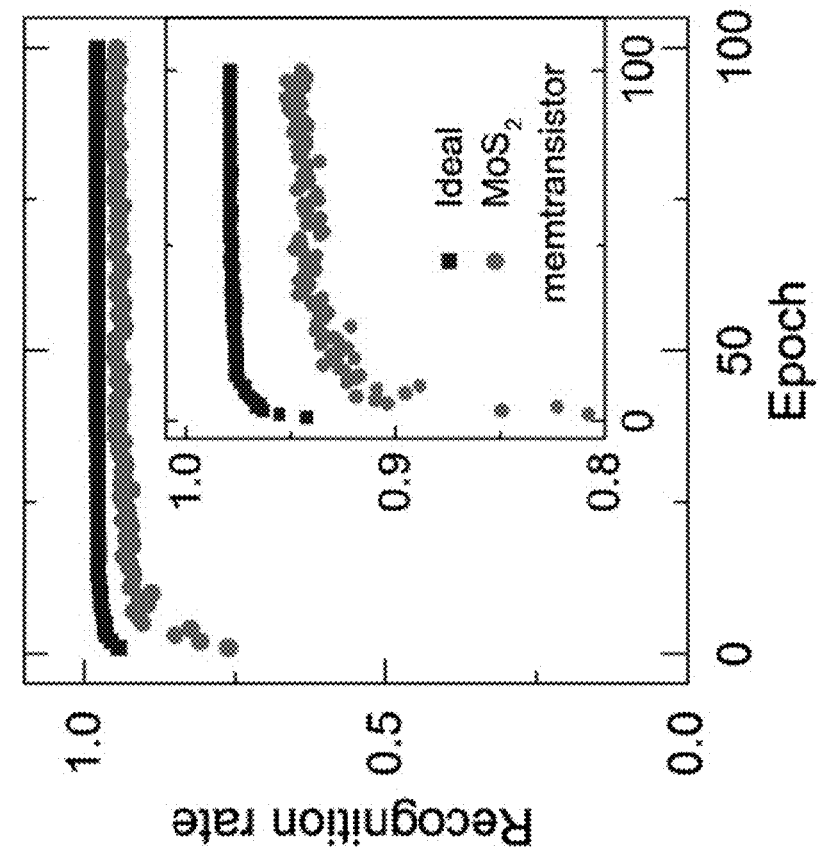
Figure 7C:
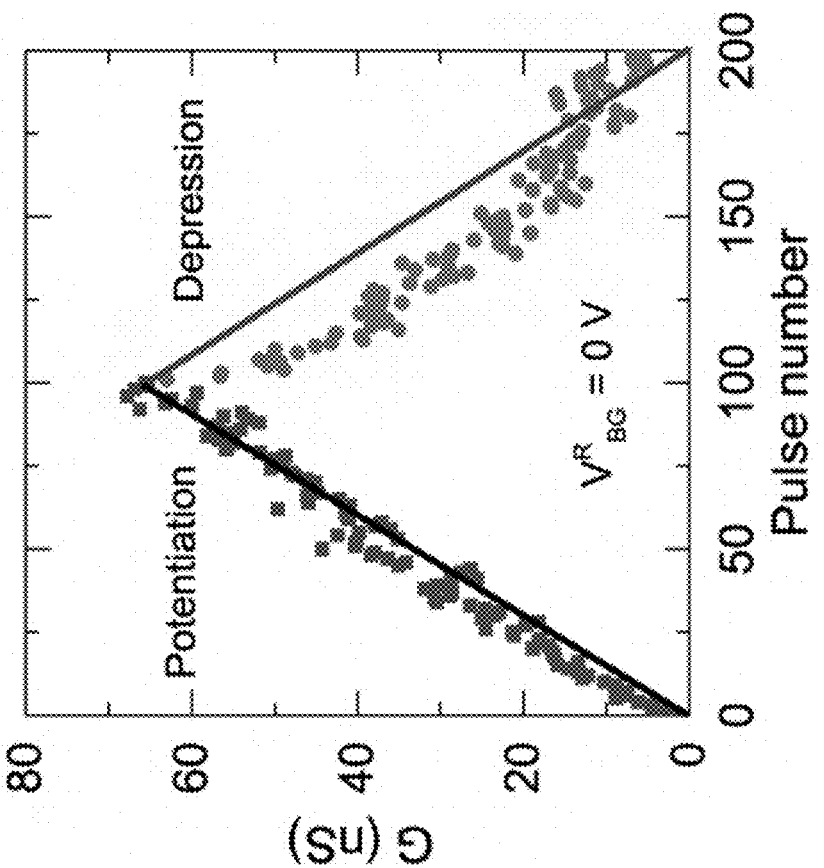
Figure 8A:
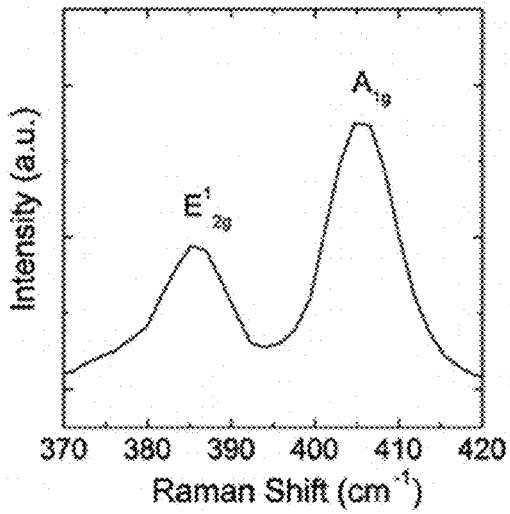
FIGS. 8A-8D show spectra of the polycrystalline monolayer $MoS_2$, according to embodiments of the invention.
Figure 8B:
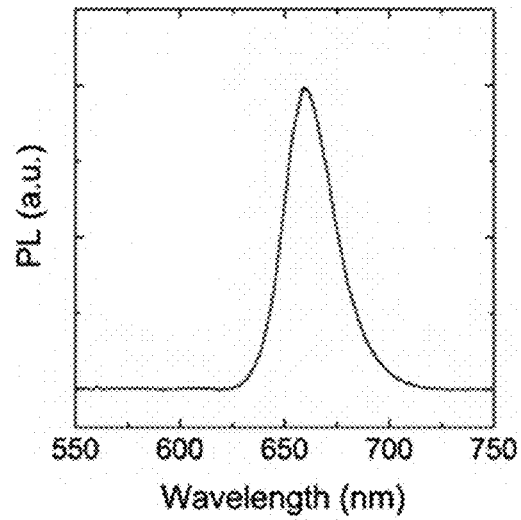
Figure 8C:
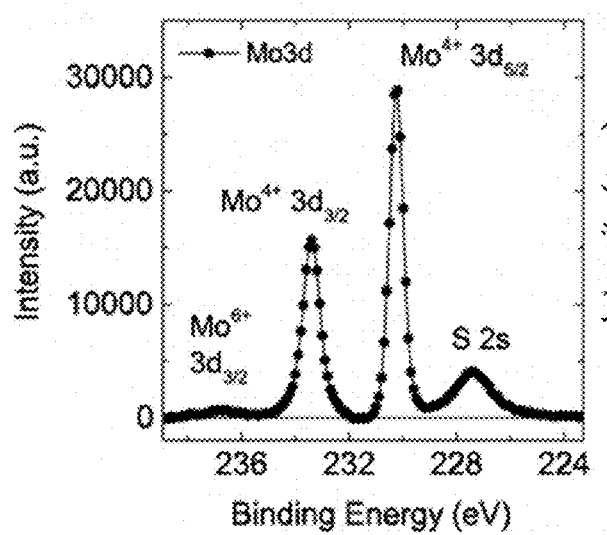
Figure 8D:
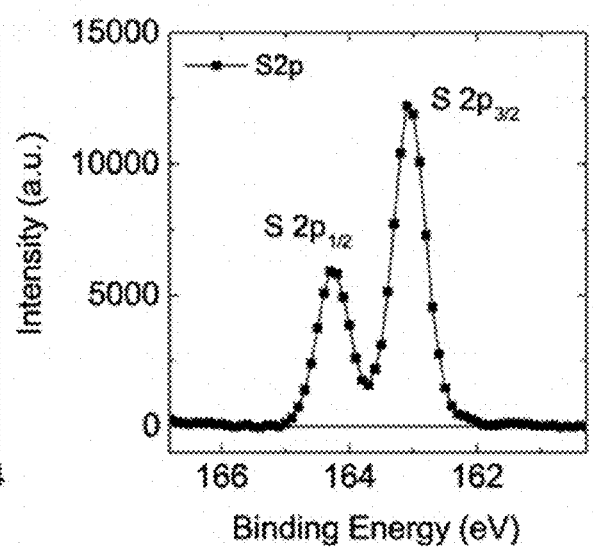
Figures 9A, 9B:
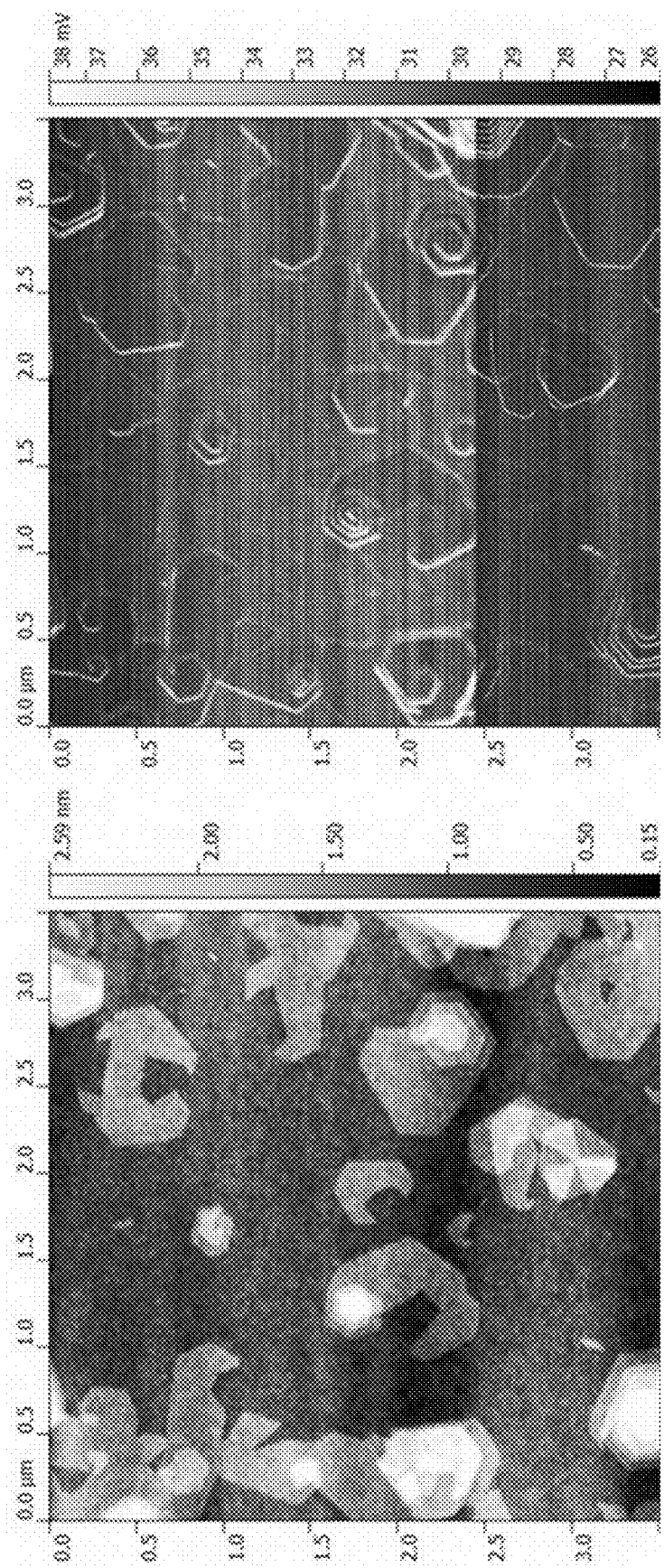
FIGS. 9A-9B show images of the monolayer $MoS_2$, according to embodiments of the invention.

In the simulated ANN, the long-term plasticity of dual-gated MoS$_2$ memtransistors is used to store trained synaptic weights for each layer. The linearity and symmetry of LTP and LTD behavior are improved by dynamic tunability of different learning rates using different $V^W_{BG}$ and $V^R_{BG}$ pulses (FIG. 7B). For example, by writing with $V_D=-15$ V pulses at $V^W_{BG}=-20$ V during LTP and with $V_D=15$ V pulses at $V^W_{BG}=0$ V during LTD, plasticity behavior becomes closer to an ideal linear and symmetric learning rule desired in ANNs (FIG. 7B). It is noted that linear learning behavior is obtained by tuning only the bottom gate bias and the top gate lines are still available for node selection during hardware operation. The hardware implementation of the ANN from FIG. 7A is outlined in FIG. 7B. Drain and source electrodes of the memtransistors are used as bit and source lines, forming a crossbar architecture to read the resistance state at each node (via MUX and using $V^R_{BG}$ pulse at word line 1). Then, the desired increment in the weight is calculated at each step of training (FIGS. 7C and 19D), and the weight is updated using concurrent $V_D$ and $V^W_{BG}$ pulses. Importantly, word line 2 (top gate) allows individual access to memtransistors by minimizing the sneak current. The present MLP uses two memtransistors on neighboring columns in order to achieve positive and negative weight values, similar to previously reported schemes used in conventional memristor crossbars. In an ideal case, synaptic weights would be stored and read with complete accuracy. However, practical devices for hardware implementation of synaptic weight storage present a finite number of conductance states, limiting the precision of stored weight values. A non-ideal memtransistor read noise of about 10% (FIG. 2D) is also simulated during training. FIG. 7D shows the performance of an MLP ANN for the ideal case and compares it with the dual-gated MoS$_2$ memtransistor implementation. The MLP ANN using memtransistors achieves an average recognition rate of about 94%, which is only about 3% lower than the ideal case. Additionally, the trained MLP ANN using dual-gated MoS$_2$ memtransistors achieves a recognition rate comparable with the current state-of-the-art, highlighting that the improvements in crossbar architecture do not compromise neuromorphic learning performance.

According to embodiments of the invention. dual-gated MoS$_2$ memtransistors are disclosed as four-terminal neuromorphic devices that enable gate-tunable learning and efficient integration into crossbar architectures. Small grains in CVD-grown MoS$_2$ allowed memtransistors with active channel dimensions less than 1 μm$^2$, operating voltage pulse of 20 V (1 ms), and energy consumption per switching cycle as low as 2 pJ. Further reduction in power would require thinner bottom and top gate dielectrics and smaller channel geometries (using smaller grain sizes or post-growth lattice defects). Clockwise bipolar resistive switching cycle is explained by the space-charge region near the forward-biased contact, as opposed to Schottky contact dominated single-gated memtransistors. In addition to conventional synaptic transistors, single-gated memtransistor and dual-gated neuristors have also been recently reported in several van der Waals semiconductors and heterojunctions. However, monolayer materials or self-aligned van der Waals heterojunctions would achieve better electrostatic control in dual-gated memtransistors. As a consequence stronger electrostatic, the dual-gated memtransistors show modulation of both LTD and LTP as a function of the gate bias during writing, while the output read current can be further controlled by the gate bias without affecting the intrinsic non-volatile state of the device. This latter effect provides a direct pathway for suppressing sneak currents and crosstalk between nodes in crossbar arrays since all devices except the one being specifically addressed can be placed into an OFF current state without changing their intrinsic memory states. Gate tunability of the learning rate is also exploited to achieve improved linearity and symmetry of the weight update rules, resulting in efficient classification in simulated ANNs. Overall, by providing tunable learning that closely mimics complex biological systems in a manner that is amenable to integration into dense crossbar arrays, dual-gated memtransistors are likely to have broad implications for next-generation neuromorphic computing.

Among other things, the invention has at least the following advantages over the existing art.

Existing memristor technology is based on an artificial neural network where weight update rules are fixed by fabrication/processing steps. On the other hand, dual-gated memtransistor crossbar arrays according to the invention enable electronically controlled learning rates over a broad dynamic range. Currently, no device technology has demonstrated this functionality in crossbar arrays.

Dual-gated memtransistors according to the invention are distinguished from previous single-gated memtransistors in that dual gates provide an efficient solution to the sneak current crosstalk problem in crossbar arrays.

The dual-gated memtransistor design according to the invention also allows independence of the read and write voltage pulses. In particular, the read current can be changed at the same read bias by varying the gate potential.

The dual-gated memtransistor concurrently solves the problems of tunable learning rates and sneak current crosstalk. For the tunable learning rate, previous work has tried to change the shape and size of voltage pulses on memristors. However, this scheme of modifying pulses in spiking neural networks limits the speed and requires complicated multiplexing in large networks. In contrast, the device according to the invention allows tunable learning rate without complicating pulsing by virtue of the gate electrode. Regarding the problem of sneak current crosstalk, all previous solutions have required the fabrication of multiple active and passive elements at the end node of the crossbar. For example, the most common approach is to use the one-transistor-one-memristor (1T1M) geometry at each node or two memristors connected back-to-back to provide complementary resistive switching at each node. Another prior scheme way to reduce sneak current crosstalk is to increase nonlinearity by implementing a diode in series with each memristor in the array. However, these cumbersome approaches increase the size and complexity of each node, thus limiting the ultimate size of the crossbar array. Therefore, since it can be implement with only one device per node, the dual-gated memtransistor according to the invention provides the simplest solution to the sneak current crosstalk problem.

Hardware implementations of neuromorphic and edge computing currently rely on dot-product machines based on memristor crossbar arrays. The currently available memristor crossbar arrays suffer from poor/cumbersome tunability of learning rates and sneak current crosstalk. In contrast, the dual-gated memtransistor design directly provides tuning of learning rates via the gate bias in addition to a highly simplified solution to the sneak current crosstalk problem. Consequently, dual-gated memtransistor crossbar arrays according to the invention have the potential to become the prevailing paradigm for dot product machines and thus foundational elements of neuromorphic and edge computing architectures.

In addition, leading semiconductor electronics companies currently implement neural network algorithms in software, which are driven by energy-inefficient von Neumann computing architectures based on conventional silicon CMOS technology. Emerging efforts to change this computing paradigm are largely based on memristor crossbar arrays, which have not yet had a significant impact on the market due to limitations in controlling learning rates and sneak current crosstalk. Since the dual-gated memtransistor design according to the invention efficiently solves both of these problems, it is likely to have broad commercial impact.

Further, the dual-gated $MoS_2$ memtransistors according to the invention enable artificial synapses with tunable learning rates where the two gates act as modulatory terminals that mimic biological systems. In crossbar arrays, these dual-gated memtransistors also overcome the sneak current issue that plagues conventional memristors. The non-volatile resistance states and read currents are controlled by distinct metal lines in the crossbar array, providing a highly scalable paradigm for neuromorphic circuits.

The invention may have applications in a variety of fields, such as neuromorphic computing, crossbar hardware accelerators, classifiers for edge computing, nonvolatile memory, and so on.

These and other aspects of the invention are further described below. Without intent to limit the scope of the invention, exemplary instruments, apparatus, methods and their related results according to the embodiments of the invention are given below. Note that titles or subtitles may be used in the examples for convenience of a reader, which in no way should limit the scope of the invention. Moreover, certain theories are proposed and disclosed herein; however, in no way they, whether they are right or wrong, should limit the scope of the invention so long as the invention is practiced according to the invention without regard for any particular theory or scheme of action.

$MoS_2$ Growth and Materials Characterization

In this exemplary embodiment, polycrystalline monolayer $MoS_2$ was directly grown by CVD on thermally oxidized Si substrates using a previously published protocol. The thickness, coverage, and chemical composition of the monolayer $MoS_2$ were verified by atomic force microscopy, Raman microscopy, photoluminescence spectroscopy, and X-ray photoelectron spectroscopy (XPS), as shown in FIGS. 8A-8D and 9A-9B. An Asylum Cypher AFM system was used in an ambient environment either in tapping mode or lateral force microscopy (LFM) mode to reveal the thickness and grain morphology of the polycrystalline $MoS_2$ film. The monolayer thickness was also confirmed by the peak positions of the in-plane $A_{1g}$ and out-of-plane $E^1_{2g}$ vibrational modes using a Horiba Scientific XploRA PLUS Raman microscope. Photoluminescence spectra from the same microscope showed a strong peak at about 660 nm, confirming the direct bandgap of monolayer $MoS_2$. XPS was conducted using a Thermo Scientific ESCA Laboratory 250Xi scanning XPS instrument. The measurements and peak analysis were performed following the protocol outlined earlier with the resulting Mo 3d and S 2p subpeaks confirming the expected stoichiometry of $MoS_2$.

Dual-Gated Memtransistor Fabrication

In this exemplary embodiment, electron-beam lithography (EBL) using PMMA as the resist was used to pattern the source and drain electrode patterns on the monolayer $MoS_2$ film followed by metallization (about 4 nm Ti/50 nm Au) and liftoff in N-methyl-2-pyrrolidone at about 80° C., as shown in FIG. 11. The memtransistor channels were defined by another step of EBL, followed by reactive ion etching of $MoS_2$ using an Ar ion recipe described earlier. The top gate dielectric of about 30 nm thick $Al_2O_3$ was grown by ALD through a patterned PMMA mask. In this manner, $Al_2O_3$ was patterned only in the crossbar area to avoid oxide deposition on the large metal pads used for external probing. ALD growth was performed at about 100° C. using pulses of water and trimethylaluminum (TMA) as precursors in a Cambridge NanoTech ALD reactor. Low-temperature ALD growth prevented the polymer mask from hard baking and allowed reliable liftoff of the patterned oxide. Top gate electrodes (about 4 nm Ti/100 nm Au) were also patterned using the same EBL, metallization, and liftoff processes as the source and drain electrodes.

Electrical Measurements

In this exemplary embodiment, all electrical measurements were carried out at room temperature in a LakeShore CRX 4K probe station at a pressure of about $5 \times 10^{-5}$ Torr. Current-voltage characteristics were measured using Keithley 2400 source-meters and home-written LabVIEW programs, while pulsed measurements were performed using a Keithley 4200A-SCS Parameter Analyzer. Retention and endurance measurements were also performed using Keithley source-meters.

Artificial Neural Network Simulations

Simulations were performed on the MNIST dataset of handwritten digits using a multilayer perceptron (MLP) artificial neural network (ANN). The ANN includes one input layer, one hidden layer, and one output layer including 784, 300, and 10 neurons, respectively. All layers are fully connected, and the training is performed after a feedforward pass of batches of 50 images using backpropagation and gradient descent with a learning rate of 0.1. Each neuron in the hidden layer utilizes the ReLU activation function and is connected to a bias neuron. The output layer neurons also utilize a bias output neuron and a softmax function for classification. Non-ideal behavior introduced by memtransistors is simulated using an ex-situ training algorithm. In particular, it is assumed that dual-gated $MoS_2$ memtransistors are used as storage devices, where weight update changes are performed through changes to the conductance of these devices. Additionally, two memtransistors are used per synaptic weight to achieve positive/negative weight values, as well as discrete weight states with limited precision following the weight states characterized in FIG. 7C. Read noise (i.e., normal distribution with a mean of zero and a standard deviation of about 10%; extracted from retention measurements shown in FIG. 2D) is introduced to the weight update to further simulate non-ideal behavior. These simulations were implemented in Python using Tensorflow v1.13 with all 60,000 training images and all 10,000 testing images of the MNIST dataset. The recognition rate is assessed after every epoch of training using all testing images for 100 epochs. Each simulation was performed five times, and the results of a representative simulation are presented.

In sum, memristive systems offer biomimetic functions that are being actively explored for energy-efficient neuromorphic circuits. In addition to providing ultimate geometric scaling limits, two-dimensional semiconductors enable unique gate-tunable responses including the recent realization of hybrid memristor and transistor devices known as memtransistors. In particular, monolayer $MoS_2$ memtransistors exhibit non-volatile memristive switching where the resistance of each state is modulated by a gate terminal. According to the invention, the memtransistor neuromorphic response can be further controlled through the introduction of a second gate terminal. The resulting dual-gated memtransistors allow tunability over the learning rate for non-hebbian training where the long-term potentiation and depression synaptic behavior is dictated by the dual-gate biases. Furthermore, the electrostatic control provided by dual gates provides a compact solution to the sneak current problem in traditional memristor crossbar arrays. In this manner, dual gating facilitates the full utilization and integration of memtransistor functionality in highly scaled integrated circuits for hardware implementation of neuromorphic computing. The tunability of long-term potentiation yields improved linearity and symmetry of weight update rules that are utilized in simulated artificial neural networks to achieve an about 94% recognition rate of hand-written digits.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the invention pertains without departing from its spirit and scope. Accordingly, the scope of the invention is defined by the appended claims rather than the foregoing description and the exemplary embodiments described therein.

Some references, which may include patents, patent applications and various publications, are cited and discussed in the description of this invention. The citation and/or discussion of such references is provided merely to clarify the description of the invention and is not an admission that any such reference is "prior art" to the invention described herein. All references cited and discussed in this specification are incorporated herein by reference in their entireties and to the same extent as if each reference was individually incorporated by reference.

LIST OF REFERENCES

[1]. S. B. Furber, F. Galluppi, S. Temple, L. A. Plana *Proc. IEEE* 2014, 102, 652-665.
[2]. P. A. Merolla, J. V. Arthur, R. Alvarez-Icaza, A. S. Cassidy, J. Sawada, F. Akopyan, B. L. Jackson, N. Imam, C. Guo, Y. Nakamura, B. Brezzo, I. Vo, S. K. Esser, R. Appuswamy, B. Taba, A. Amir, M. D. Flickner, W. P. Risk, R. Manohar, D. S. Modha *Science* 2014, 345, 668-673.
[3]. M. D. Ventra, F. L. Traversa *J. Appl. Phys.* 2018, 123, 180901.
[4]. C. D. Schuman, T. E. Potok, R. M. Patton, J. D. Birdwell, M. E. Dean, S. R. Garrett, J. S. Plank arXiv: 1705.06963 2018.
[5]. O. Krestinskaya, A. James, C. O. Leon arXiv: 1807.00962v2 2019.
[6]. M. A. Zidan, J. P. Strachan, W. D. Lu *Nat. Elect.* 2018, 1, 22-29.
[7]. G. W. Burr, R. M. Shelby, A. Sebastian, S. Kim, S. Kim, S. Sidler, K. Virwani, M. Ishii, P. Narayanan, A. Fumarola, L. L. Sanches, I. Boybat, M. Le Gallo, K. Moon, J. Woo, H. Hwang, Y. Leblebici *Adv. Phys. X* 2017, 2, 89-124.
[8]. E. J. Fuller, S. T. Keene, A. Melianas, Z. Wang, S. Agarwal, Y. Li, Y. Tuchman, C. D. James, M. J. Marinella, J. J. Yang, A. Salleo, A. A. Talin *Science* 2019, 364, 570-574.

[9]. Z. Wang, S. Joshi, S. Savel'ev, W. Song, R. Midya, Y. Li, M. Rao, P. Yan, S. Asapu, Y. Zhuo, H. Jiang, P. Lin, C. Li, J. H. Yoon, N. K. Upadhyay, J. Zhang, M. Hu, J. P. Strachan, M. Barnell, Q. Wu, H. Wu, R. S. Williams, Q. Xia, J. J. Yang *Nat. Elect.* 2018, 1, 137-145.

[10]. Z. Wang, M. Rao, J.-W. Han, J. Zhang, P. Lin, Y. Li, C. Li, W. Song, S. Asapu, R. Midya, Y. Zhuo, H. Jiang, J. H. Yoon, N. K. Upadhyay, S. Joshi, M. Hu, J. P. Strachan, M. Barnell, Q. Wu, H. Wu, Q. Qiu, R. S. Williams, Q. Xia, J. J. Yang *Nat. Commun.* 2018, 9, 3208.

[11]. S. Yu, P. Y. Chen *IEEE Sol. Stat. Circuit Mag.* 2016, 8, 43-56.

[12]. M.-J. Lee, C. B. Lee, D. Lee, S. R. Lee, M. Chang, J. H. Hur, Y.-B. Kim, C.-J. Kim, D. H. Seo, S. Seo *Nat. Mater.* 2011, 10, 625-630.

[13]. E. Linn, R. Rosezin, C. Kugeler, R. Waser *Nat. Mater.* 2010, 9, 403-406.

[14]. Y. van de Burgt, E. Lubberman, E. J. Fuller, S. T. Keene, G. C. Faria, S. Agarwal, M. J. Marinella, A. Alec Talin, A. Salleo *Nat. Mater.* 2017, 16, 414-418.

[15]. E. J. Fuller, F. E. Gabaly, F. Léonard, S. Agarwal, S. J. Plimpton, R. B. Jacobs-Gedrim, C. D. James, M. J. Marinella, A. A. Talin *Adv. Mater.* 2017, 29, 1604310.

[16]. C. Diorio, P. Hasler, A. Minch, C. A. Mead *IEEE Trans. Electron. Dev.* 1996, 43, 1972-1980.

[17]. V. K. Sangwan, D. Jariwala, I. S. Kim, K.-S. Chen, T. J. Marks, L. J. Lauhon, M. C. Hersam *Nat. Nanotechnol.* 2015, 10, 403-406.

[18]. V. K. Sangwan, H.-S. Lee, H. Bergeron, I. Balla, M. E. Beck, K.-S. Chen, M. C. Hersam *Nature* 2018, 554, 500-504.

[19]. B. Mouttet *IEEE Inter. Conf. Electron., Circuits & Systems* 2010, 930-933.

[20]. W. Huh, S. Jang, J. Y. Lee, D. Lee, D. Lee, J. M. Lee, H.-G. Park, J. C. Kim, H. Y. Jeong, G. Wang, C.-H. Lee *Adv. Mater.* 2018, 30, 1801447.

[21]. V. K. Sangwan, H.-S. Lee, M. C. Hersam *IEEE Inter. Elect. Dev. Meet. (IEDM)* 2017, 5.1.1-5.1.4.

[22]. L. Wang, W. Liao, S. L. Wong, Z. G. Yu, S. Li, Y.-F. Lim, X. Feng, W. C. Tan, X. Huang, L. Chen, L. Liu, J. Chen, X. Gong, C. Zhu, X. Liu, Y.-W. Zhang, D. Chi, K.-W. Ang *Adv. Funct. Mater.* 2019, 29, 1901106.

[23]. D. Li, B. Wu, X. Zhu, J. Wang, B. Ryu, W. D. Lu, W. Lu, X. Liang *ACS Nano* 2018, 12, 9240-9252.

[24]. H. Tian, X. Cao, Y. Xie, X. Yan, A. Kostelec, D. DiMarzio, C. Chang, L.-D. Zhao, W. Wu, J. Tice, J. J. Cha, J. Guo, H. Wang *ACS Nano* 2017, 11, 7156-7163.

[25]. Y. Shi, X. Liang, B. Yuan, V. Chen, H. Li, F. Hui, Z. Yu, F. Yuan, E. Pop, H. S. P. Wong, M. Lanza *Nat. Elect.* 2018, 1, 458-465.

[26]. V. K. Sangwan, M. C. Hersam *Nat. Nanotechnol.* 2020, DOI: 10.1038/s41565-020-0647-z.

[27]. V. K. Sangwan, M. C. Hersam *Annu. Rev. Phys. Chem.* 2018, 69, 299-325.

[28]. V. K. Sangwan, M. E. Beck, A. Henning, J. Luo, H. Bergeron, J. Kang, I. Balla, H. Inbar, L. J. Lauhon, M. C. Hersam *Nano Lett.* 2018, 18, 1421-1427.

[29]. T. Gokmen, M. Onen, W. Haensch *Front. Neuroscience* 2017, 11, DOI: 10.3389/fnins.2017.00538.

[30]. R. B. Jacobs-Gedrim, S. Agarwal, K. E. Knisely, J. E. Stevens, M. S. v. Heukelom, D. R. Hughart, J. Niroula, C. D. James, M. J. Marinella *IEEE Inter. Conf. Reboot. Comp. (ICR 2017*, 1-10.

[31]. S. Yu, P. Chen, Y. Cao, L. Xia, Y. Wang, H. Wu *IEEE Inter. Elect. Dev. Meet. (IEDM)* 2015, 17.3.1-17.3.4.

[32]. C. Chang, P. Chen, T. Chou, I. Wang, B. Hudec, C. Chang, C. Tsai, T. Chang, T. Hou *IEEE J. Emerging and Selected Topics in Circuits and Systems* 2018, 8, 116-124.

[33]. J. Woo, K. Moon, J. Song, S. Lee, M. Kwak, J. Park, H. Hwang *IEEE Elec. Dev. Lett.* 2016, 37, 994-997.

[34]. C. Sung, S. Lim, H. Kim, T. Kim, K. Moon, J. Song, J.-J. Kim, H. Hwang *Nanotechnology* 2018, 29, 115203.

[35]. T. K. Scott, M. Armantas, J. F. Elliot, B. Yoeri van de, A. A. Talin, S. Alberto *J. Phys. D: Appl. Phys.* 2018, 51, 224002.

[36]. G. G. Turrigiano, S. B. Nelson *Nat. Rev. Neuro.* 2004, 5, 97-107.

[37]. W. Schultz *J. Neurophysio.* 1998, 80, 1-27.

[38]. M. F. Bear, B. W. Connors, M. A. Paradiso. *Neuroscience: Exploring the Brain.* (Wolters Kluwer, 2015).

[39]. J. Jadwiszczak, D. Keane, P. Maguire, C. P. Cullen, Y. Zhou, H. Song, C. Downing, D. Fox, N. McEvoy, R. Zhu, J. Xu, G. S. Duesberg, Z.-M. Liao, J. J. Boland, H. Zhang *ACS Nano* 2019, 13, 14262-14273.

[40]. R. Xu, H. Jang, M.-H. Lee, D. Amanov, Y. Cho, H. Kim, S. Park, H.-j. Shin, D. Ham *Nano Lett.* 2019, 19, 2411-2417.

[41]. R. Ge, X. Wu, M. Kim, J. Shi, S. Sonde, L. Tao, Y. Zhang, J. C. Lee, D. Akinwande *Nano Lett.* 2018, 18, 434-441.

[42]. M. Wang, S. Cai, C. Pan, C. Wang, X. Lian, Y. Zhuo, K. Xu, T. Cao, X. Pan, B. Wang, S.-J. Liang, J. J. Yang, P. Wang, F. Miao *Nat. Elect.* 2018, 1, 130-136.

[43]. J. E. Thompson, B. T. Blue, D. Smalley, F. Torres-Davila, L. Tetard, J. T. Robinson, M. Ishigami *MRS Advances* 2019, 4, 2609-2617.

[44]. C.-P. Lu, G. Li, J. Mao, L.-M. Wang, E. Y. Andrei *Nano Lett.* 2014, 14, 4628-4633.

[45]. A. A. Murthy, T. K. Stanev, R. dos Reis, S. Hao, C. Wolverton, N. P. Stern, V. P. Dravid *ACS Nano* 2020, 14, 1569-1576.

[46]. M.-S. Abdelouahab, R. Lozi, L. Chua *Inter. J. of Bifur. and Chaos* 2014, 24, 1430023.

[47]. A. A. Bessonov, M. N. Kirikova, D. I. Petukhov, M. Allen, T. Ryhänen, M. J. A. Bailey *Nat. Mater.* 2015, 14, 199-204.

[48]. Z. Wei, Y. Kanzawa, K. Arita, Y. Katoh, K. Kawai, S. Muraoka, S. Mitani, S. Fujii, K. Katayama, M. Iijima, T. Mikawa, T. Ninomiya, R. Miyanaga, Y. Kawashima, K. Tsuji, A. Himeno, T. Okada, R. Azuma, K. Shimakawa, H. Sugaya, T. Takagi, R. Yasuhara, K. Horiba, H. Kumigashira, M. Oshima *IEEE Inter. Elec. Dev. Meet. (IEDM)* 2008, 1-4.

[49]. A. Leonhardt, D. Chiappe, V. V. Afanas'ev, S. El Kazzi, I. Shlyakhov, T. Conard, A. Franquet, C. Huyghebaert, S. de Gendt *ACS Appl. Mater. Inter.* 2019, 11, 42697-42707.

[50]. D. S. Shang, Q. Wang, L. D. Chen, R. Dong, X. M. Li, W. Q. Zhang *Phys. Rev. B* 2006, 73, 245427.

[51]. K. M. Kim, B. J. Choi, Y. C. Shin, S. Choi, C. S. Hwang *Appl. Phys. Lett.* 2007, 91, 012907.

[52]. S. Ghatak, A. Ghosh *Appl. Phys. Lett.* 2013, 103, 122103.

[53]. J. Y. Shang, M. J. Moody, J. Chen, S. Krylyuk, A. V. Davydov, T. J. Marks, L. J. Lauhon *ACS Applied Electronic Materials* 2020, 2, 1273-1279.

[54]. A. Alharbi, D. Shahrjerdi *IEEE Transactions on Electron Devices* 2018, 65, 4084-4092.

[55]. G. He, H. Ramamoorthy, C. P. Kwan, Y. H. Lee, J. Nathawat, R. Somphonsane, M. Matsunaga, A. Higuchi, T. Yamanaka, N. Aoki, Y. Gong, X. Zhang, R. Vajtai, P. M. Ajayan, J. P. Bird *Nano Lett.* 2016, 16, 6445-6451.

[56]. L. Sun, Y. Zhang, G. Hwang, J. Jiang, D. Kim, Y. A. Eshete, R. Zhao, H. Yang *Nano Lett.* 2018, 18, 3229-3234.

[57]. M. Chistiakova, N. Bannon, J.-Y. Chen, M. Bazhenov, M. Volgushev *Front. Comp. Neuro.* 2015, 9, 89.

[58]. G. H. Kim, J. H. Lee, Y. Ahn, W. Jeon, S. J. Song, J. Y. Seok, J. H. Yoon, K. J. Yoon, T. J. Park, C. S. Hwang *Adv. Funct. Mater.* 2013, 23, 1440-1449.

[59]. M.-J. Lee, D. Lee, S.-H. Cho, J.-H. Hur, S.-M. Lee, D. H. Seo, D.-S. Kim, M.-S. Yang, S. Lee, E. Hwang, M. R. Uddin, H. Kim, U. I. Chung, Y. Park, I.-K. Yoo *Nat. Commun.* 2013, 4, 2629.

[60]. H.-S. Lee, H.-H. Park, M. J. Rozenberg *Nanoscale* 2015, 7, 6444-6450.

[61]. C. J. Amsinck, N. H. D. Spigna, D. P. Nackashi, P. D. Franzon *Nanotechnology* 2005, 16, 2251-2260.

[62]. C. Xu, D. Niu, N. Muralimanohar, R. Balasubramonian, T. Zhang, S. Yu, Y. Xie *IEEE Inter. Symp. High Perform. Comp. Arch. (HPC*2015, 476-488.

[63]. J. Mustafa, R. Waser *IEEE Trans. Nanotech.* 2006, 5, 687-691.

[64]. M. Zangeneh, A. Joshi *IEEE VLSI Systems* 2014, 22, 1815-1828.

[65]. F. Miao, W. Yi, I. Goldfarb, J. J. Yang, M.-X. Zhang, M. D. Pickett, J. P. Strachan, G. Medeiros-Ribeiro, R. S. Williams *ACS Nano* 2012, 6, 2312-2318.

[66]. K. K. H. Smithe, S. V. Suryavanshi, M. Muñoz Rojo, A. D. Tedjarati, E. Pop *ACS Nano* 2017, 11, 8456-8463.

[67]. R. Yang, H. Li, K. K. H. Smithe, T. R. Kim, K. Okabe, E. Pop, J. A. Fan, H. P. Wong *IEEE Inter. Elect. Dev. Meet. (IEDM)* 2017, 19.5.1-19.5.4.

[68]. S. B. Desai, S. R. Madhvapathy, A. B. Sachid, J. P. Llinas, Q. Wang, G. H. Ahn, G. Pitner, M. J. Kim, J. Bokor, C. Hu, H.-S. P. Wong, A. Javey *Science* 2016, 354, 99-102.

[69]. M. E. Beck, A. Shylendra, V. K. Sangwan, S. Guo, W. A. Gaviria Rojas, H. Yoo, H. Bergeron, K. Su, A. R. Trivedi, M. C. Hersam *Nat. Commun.* 2020, 11, 1565.

[70]. I. Kataeva, F. Merrikh-Bayat, E. Zamanidoost, D. Strukov 2015 *International Joint Conference on Neural Networks (IJCNN)* 2015, 1-8.

[71]. S.-G. Yi, M. U. Park, S. H. Kim, C. J. Lee, J. Kwon, G.-H. Lee, K.-H. Yoo *ACS Appl. Mater. Inter.* 2018, 10, 31480-31487.

[72]. S. Choi, S. H. Tan, Z. Li, Y. Kim, C. Choi, P.-Y. Chen, H. Yeon, S. Yu, J. Kim *Nat. Mater.* 2018, 17, 335-340.

[73]. I. Boybat, M. Le Gallo, S. R. Nandakumar, T. Moraitis, T. Parnell, T. Tuma, B. Rajendran, Y. Leblebici, A. Sebastian, E. Eleftheriou *Nat. Commun.* 2018, 9, 2514.

[74]. Y. Lecun, L. Bottou, Y. Bengio, P. Haffner *Proc. IEEE* 1998, 86, 2278-2324.

[75]. P. Yao, H. Wu, B. Gao, S. B. Eryilmaz, X. Huang, W. Zhang, Q. Zhang, N. Deng, L. Shi, H. S. P. Wong, H. Qian *Nat. Commun.* 2017, 8, 15199.

[76]. M. Prezioso, F. Merrikh-Bayat, B. D. Hoskins, G. C. Adam, K. K. Likharev, D. B. Strukov *Nature* 2015, 521, 61-64.

[77]. A. J. Arnold, A. Razavieh, J. R. Nasr, D. S. Schulman, C. M. Eichfeld, S. Das *ACS Nano* 2017, 11, 3110-3118.

[78]. H. Tian, Q. Guo, Y. Xie, H. Zhao, C. Li, J. J. Cha, F. Xia, H. Wang *Adv. Mater.* 2016, 28, 4991-4997.

[79]. X. Xie, J. Kang, Y. Gong, P. M. Ajayan, K. Banerjee *IEEE IEDM* 2017, 5.3.1-5.3.4.

[80]. J. Jadwiszczak, D. Keane, P. Maguire, C. P. Cullen, Y. Zhou, H.-D. Song, C. Downing, D. S. Fox, N. McEvoy, R. Zhu, J. Xu, G. S. Duesberg, Z.-M. Liao, J. J. Boland, H. Zhang arXiv:1811.09545 2018.

[81]. Y. Yang, H. Du, Q. Xue, X. Wei, Z. Yang, C. Xu, D. Lin, W. Jie, J. Hao *Nano Energy* 2019, 57, 566-573.

[82]. L. Bao, J. Zhu, Z. Yu, R. Jia, Q. Cai, Z. Wang, L. Xu, Y. Wu, Y. Yang, Y. Cai, R. Huang *ACS Appl. Mater. Inter.* 2019, 11, 41482-41489.

What is claimed is:

1. A memtransistor, comprising:
a bottom gate electrode;
a bottom dielectric layer formed on the bottom gate electrode layer;
a polycrystalline monolayer film formed of an atomically thin material disposed on the bottom dielectric layer, wherein the atomically thin material comprises two-dimensional (2D) semiconductor material, wherein the 2D semiconductor material comprises monochalcogenides comprising InSe or GaTe, or black phosphorus (BP), wherein the polycrystalline monolayer film contains grains having an average grain size of about 1 μm2;
a source electrode and a drain electrode spatial-apart formed on the bottom dielectric layer such that the polycrystalline monolayer film is disposed between the source electrode and the drain electrode to define a channel in the polycrystalline monolayer film therebetween;
a top dielectric layer formed on the polycrystalline monolayer film and extended over the source electrode and the drain electrode, such that each of the source electrode and the drain electrode is disposed between the bottom dielectric layer and the top dielectric layer; and
a top gate electrode formed on the top dielectric layer,
wherein the top gate electrode and the bottom gate electrode are capacitively coupled with the channel; and
wherein the memtransistor is a dual gated memtransistor characterized with a switching ratio between a low resistance state (LRS) and a high resistance state (HRS), wherein the switching ratio is a ratio of current ($I_{LRS}$) of the dual gated memtransistor at the LRS to that ($I_{HRS}$) of the dual gated memtransistor at the HRS, and wherein the dual gated memtransistor is configured such that the switching ratio increases with increasing a voltage of the bottom gate electrode.

2. The memtransistor of claim 1, wherein the top gate electrode and the bottom gate electrode and the source and drain electrodes comprise a same conductive material or different conductive materials.

3. The memtransistor of claim 2, wherein each of the top gate electrode and the bottom gate electrode and the source and drain electrodes is formed of gold (Au), titanium (Ti), aluminum (Al), nickel (Ni), chromium (Cr), and other conductive materials.

4. The memtransistor of claim 2, wherein the bottom gate electrode is formed of doped silicon (Si).

5. The memtransistor of claim 1, wherein the top dielectric layer and the bottom dielectric layer comprise a same dielectric material or different dielectric materials.

6. The memtransistor of claim 5, wherein the top dielectric layer is formed of $Al_2O_3$, $HfO_2$, $ZrO_2$, or ZnO.

7. The memtransistor of claim 5, wherein the bottom dielectric layer is formed of $SiO_2$, or dielectrics including alumina, hafnia, or zirconia.

8. The memtransistor of claim 1, wherein the memtransistor is configured to have bipolar resistive switching characteristics at different biases applied to the bottom gate electrode with the top gate electrode left floating.

9. The memtransistor of claim 1, wherein the memtransistor is configured to have a memristive loop with minimal bottom gate bias hysteresis.

10. The memtransistor of claim 1, wherein the memtransistor is configured such that both long-term potentiation (LTP) and long-term depression (LTD) are operably modulated as a function of a gate bias during writing, while an output current during reading is operably controlled as a function of the gate bias during reading without affecting an intrinsic state of the memtransistor.

11. A circuitry, comprising one or more memtransistors according to claim 1.

12. An electronic device, comprising one or more memtransistors according to claim 1.

13. A crossbar array comprised of M columns and N rows of memtransistors, each of M and N being an integer greater than zero, comprising:
a bottom gate electrode layer;
a bottom dielectric layer formed on the bottom gate electrode layer;
a polycrystalline monolayer film formed of an atomically thin material formed on the bottom dielectric layer, wherein the atomically thin material comprises two-dimensional (2D) semiconductor material, wherein the polycrystalline monolayer film contains grains having an average grain size of about 1 $\mu m^2$;
M+1 source-drain electrodes spatial-apart formed on the polycrystalline monolayer film along a column direction, wherein the polycrystalline monolayer film is patterned according to the M+1 source-drain electrodes to define M columns and N rows of channels therein, such that each two neighboring source-drain electrodes are coupled with N channels of a respective channel column between said two neighboring source-drain electrodes;
a top dielectric layer formed on the polycrystalline monolayer film and extended over the M+1 source-drain electrodes, such that each of the M+1 source-drain electrodes is disposed between the bottom dielectric layer and the top dielectric layer; and
N top gate electrodes formed on the top dielectric layer, crossing over the M+1 source-drain electrodes along a row direction, such that each top gate electrode is capacitively coupled with M channels of a respective channel row,
wherein each memtransistor is a dual gated memtransistor characterized with a switching ratio between a low resistance state (LRS) and a high resistance state (HRS), wherein the switching ratio is a ratio of current ($I_{LRS}$) of the dual gated memtransistor at the LRS to that ($I_{HRS}$) of the dual gated memtransistor at the HRS, and wherein each dual gated memtransistor is configured such that the switching ratio increases with increasing a voltage of the bottom gate electrode.

14. The crossbar array of claim 13, wherein the 2D semiconductor material comprises $MoS_2$, $MoSe_2$, $WS_2$, $WSe_2$, InSe, GaTe, black phosphorus (BP), or related two-dimensional materials.

15. The crossbar array of claim 13, wherein the bottom gate electrode layer comprises a globe bottom gate electrode capacitively coupled with the M columns and the N rows of channels.

16. The crossbar array of claim 13, wherein the bottom gate electrode layer comprises N bottom gate electrodes crossing over the M+1 source-drain electrodes along the row direction, such that each bottom gate electrode is capacitively coupled with M channels of a respective channel row.

17. The crossbar array of claim 13, wherein the top gate electrodes and the bottom gate electrode layer and the source-drain electrodes comprise a same conductive material or different conductive materials.

18. The crossbar array of claim 17, wherein each of the top gate electrode and the bottom gate electrode and the source-drain electrodes is formed of gold (Au), titanium (Ti), aluminum (Al), nickel (Ni), chromium (Cr), and other conductive materials.

19. The crossbar array of claim 17, wherein the bottom gate electrodes are formed of doped silicon (Si).

20. The crossbar array of claim 13, wherein the top dielectric layer and the bottom dielectric layer comprise a same dielectric material or different dielectric materials.

21. The crossbar array of claim 20, wherein the top dielectric layer is formed of $Al_2O_3$, $HfO_2$, $ZrO_2$, or ZnO.

22. The crossbar array of claim 20, wherein the bottom dielectric layer is formed of $SiO_2$, or dielectrics including alumina, hafnia, or zirconia.

23. The crossbar array of claim 13, wherein each memtransistor is configured to have bipolar resistive switching characteristics at different biases applied to the bottom gate electrode with the top gate electrode left floating.

24. The crossbar array of claim 13, wherein each memtransistor is configured to have a memristive loop with minimal bottom gate bias hysteresis.

25. The crossbar array of claim 13, wherein each memtransistor is configured such that both long-term potentiation (LTP) and long-term depression (LTD) are operably modulated as a function of a gate bias during writing, while an output current during reading is operably controlled as a function of the gate bias during reading without affecting an intrinsic state of said memtransistor.

26. The crossbar array of claim 13, wherein the source and drain electrodes ($S_i/D_{i+1}$) are shared by neighboring memtransistors in columns i and i+1 (except i=1, M).

27. The crossbar array of claim 13, being configured such that each memtransistor is writable and readable independently, thereby minimizing sneak current in the crossbar array.

28. The crossbar array of claim 13, being configured such that application of a predetermined bottom gate voltage suppresses read currents without changing non-volatile memristive resistance states of the memtransistors in the crossbar array, thereby enabling isolation of the non-volatile memristive resistance states and read currents without additional elements at each node for crossbar operation in the crossbar array.

29. The crossbar array of claim 13, wherein each memtransistor has gate tunability.

30. The crossbar array of claim 29, wherein a linear and symmetric learning behavior that produces efficient training of an artificial neural network (ANN) is achievable by the gate tunability.

31. A circuitry, comprising one or more crossbar arrays according to claim 13.

32. An electronic device, comprising one or more crossbar arrays according to claim 13.

33. The memtransistor of claim 1, wherein the memtransistor is configured to have a pinched hysteresis loop in the clockwise direction at forward bias.

34. The memtransistor of claim 33, wherein the memtransistor is configured to have drain current at the forward bias being larger than that at reverse bias.

35. The memtransistor of claim 1, wherein the memtransistor is configured such that a top gate voltage controls the switching ratio in a non-monotonic fashion.

36. The memtransistor of claim 1, wherein the channel has a channel length of about 0.9 μm, and a channel width of about 0.7 μm.

37. The crossbar array of claim 13, wherein each channel has a channel length of about 0.9 μm, and a channel width of about 0.7 μm.

* * * * *